United States Patent
Ito et al.

(10) Patent No.: US 6,822,280 B2
(45) Date of Patent: Nov. 23, 2004

(54) SEMICONDUCTOR MEMORY INCLUDING FORMING BEAMS CONNECTING THE CAPACITORS

(75) Inventors: Eiji Ito, Kanagawa (JP); Hitoshi Ito, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/286,893

(22) Filed: Nov. 4, 2002

(65) Prior Publication Data

US 2003/0085420 A1 May 8, 2003

(30) Foreign Application Priority Data

Nov. 6, 2001 (JP) ........................................ 2001-340198

(51) Int. Cl.⁷ ...................... H01L 21/108; H01L 29/76; H01L 29/94; H01L 31/119
(52) U.S. Cl. ...................... 257/296; 257/303; 257/306
(58) Field of Search ................................ 257/296, 303, 257/306; 438/296, 396

(56) References Cited

U.S. PATENT DOCUMENTS 6,667,502 B1 * 12/2003 Agarwal et al. ............ 257/296

FOREIGN PATENT DOCUMENTS

| JP | 11-317504 | 11/1999 |
| JP | 2000-183311 | 6/2000 |
| JP | 2001-94066 | 4/2001 |

* cited by examiner

*Primary Examiner*—William M. Brewster
(74) *Attorney, Agent, or Firm*—Finnegan, Henderson, Farabow, Garrett & Dunner, L.L.P.

(57) ABSTRACT

A semiconductor memory incorporates cylinder-type stacked capacitors. Each capacitor has a lower electrode and an upper electrode facing each other via a dielectric film. The lower electrode of each capacitor is supported by a beam-like insulator at a side portion of the electrode, the side portion being apart from a lower edge of the lower electrode.

11 Claims, 66 Drawing Sheets

(A-A' SECTION)

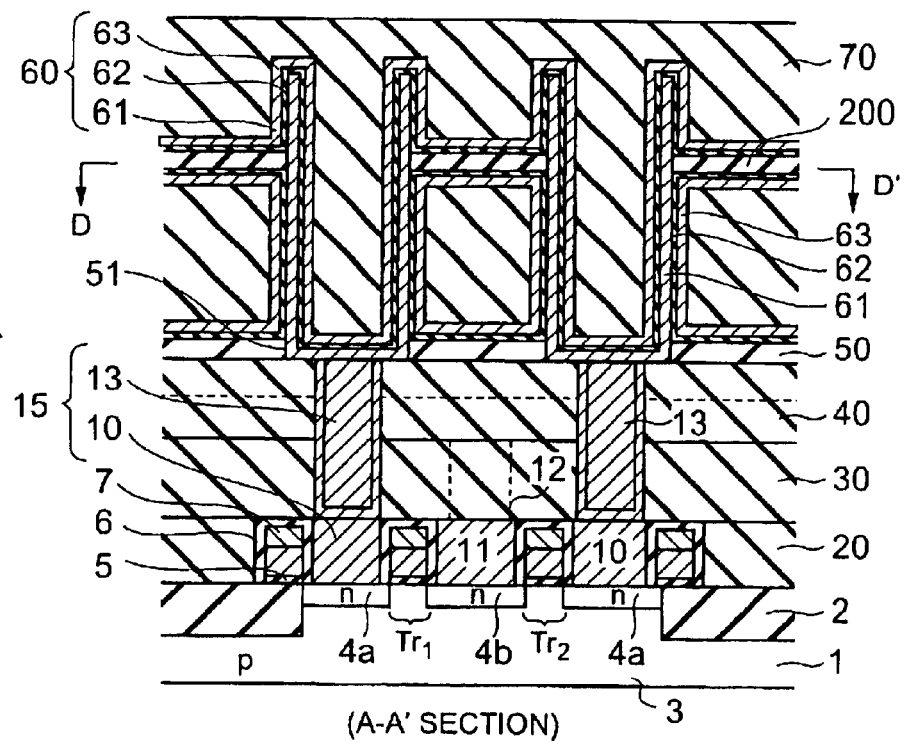
FIG. 2A (A-A' SECTION)
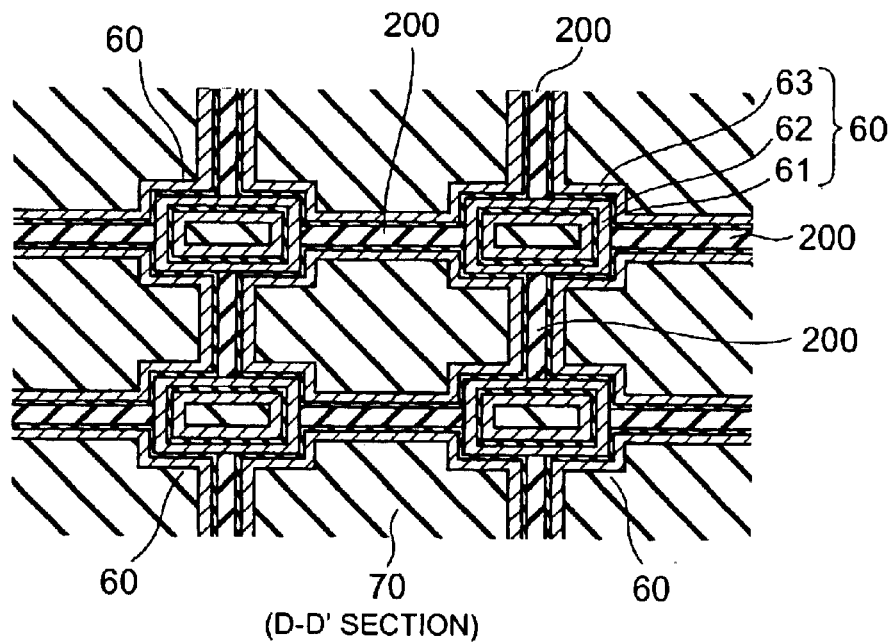
FIG. 2B (D-D' SECTION)

(B-B' SECTION)

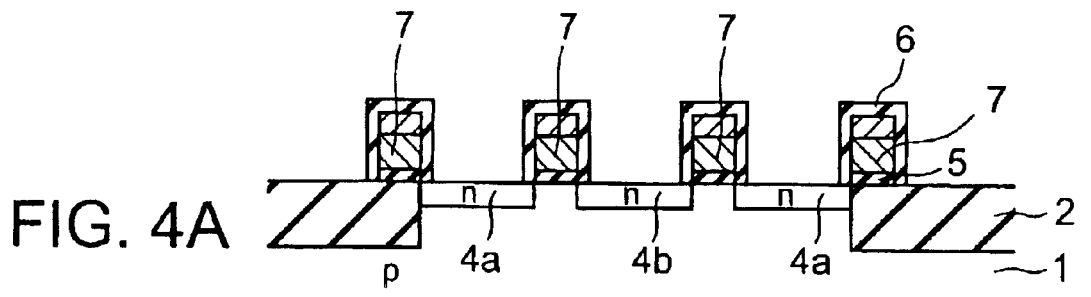
FIG. 4A (A-A' SECTION)
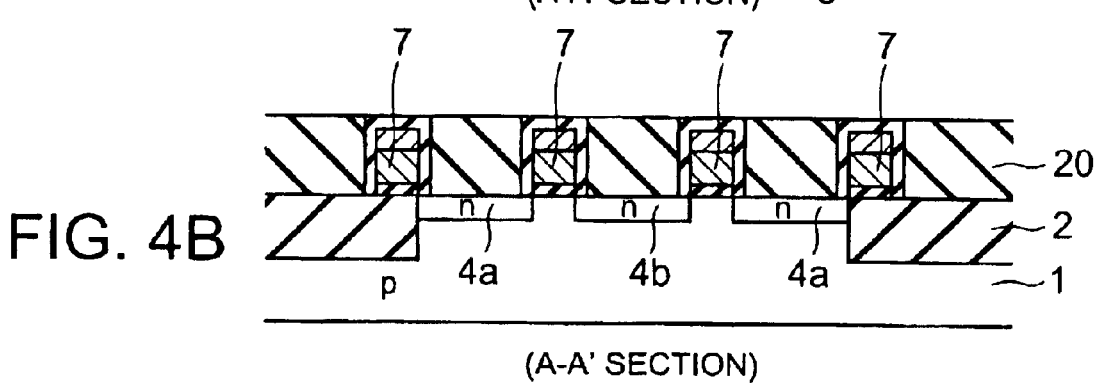
FIG. 4B (A-A' SECTION)
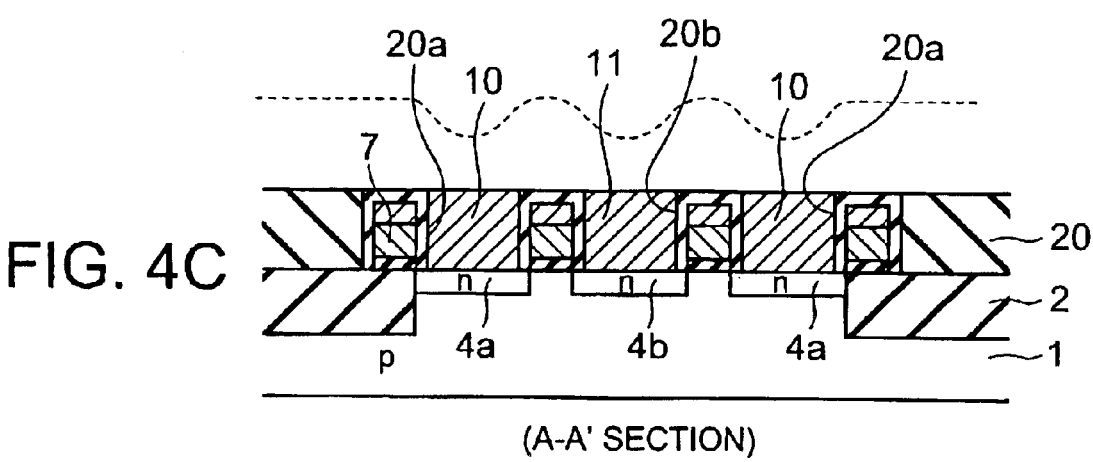
FIG. 4C (A-A' SECTION)
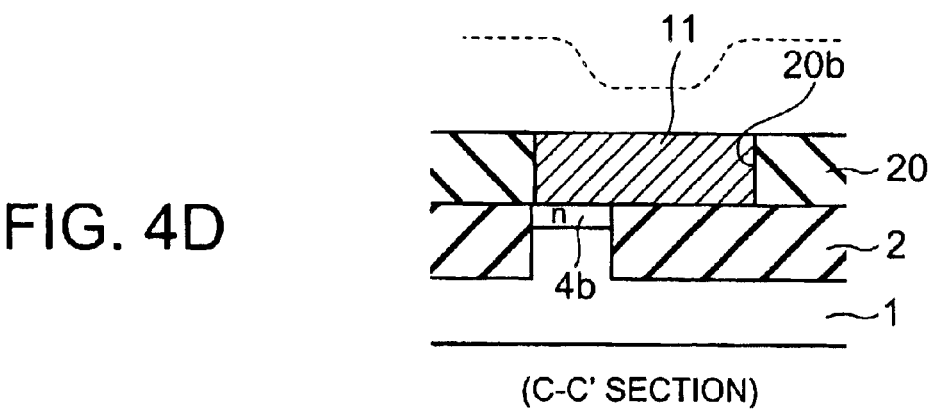
FIG. 4D (C-C' SECTION)

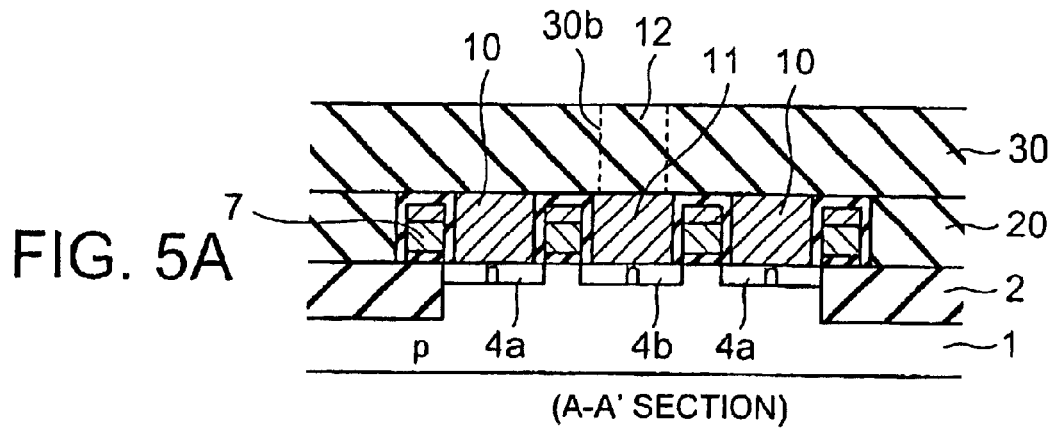
FIG. 5A (A-A' SECTION)
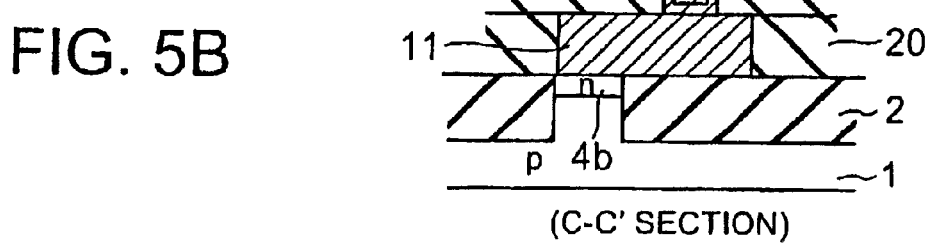
FIG. 5B (C-C' SECTION)
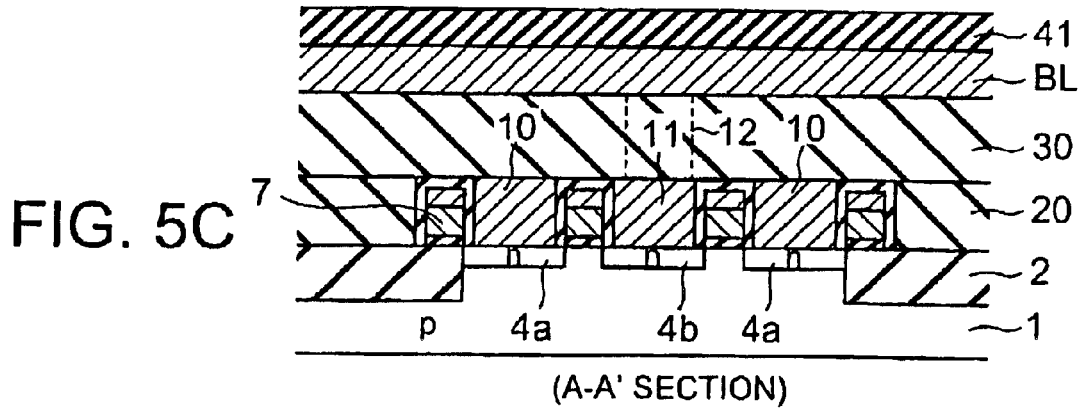
FIG. 5C (A-A' SECTION)
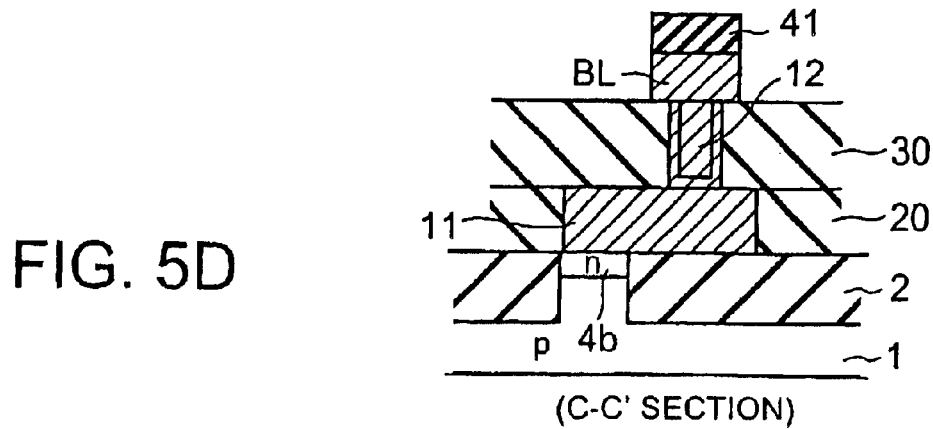
FIG. 5D (C-C' SECTION)

(A-A' SECTION)

(C-C' SECTION)

(A-A' SECTION)

(B-B' SECTION)

(A-A' SECTION)

(B-B' SECTION)

(A-A' SECTION)

(A-A' SECTION)

(A-A' SECTION)

(A-A' SECTION)

(A-A' SECTION)

(E-E' SECTION)

(A-A' SECTION)

(G-G' SECTION)

(A-A' SECTION)

(A-A' SECTION)

(A-A' SECTION)

(A-A' SECTION)

(A-A' SECTION)

(A-A' SECTION)

(A-A' SECTION)

(A-A' SECTION)

(H-H' SECTION)

(A-A' SECTION)

(A-A' SECTION)

(A-A' SECTION)

(A-A' SECTION)

(A-A' SECTION)

(A-A' SECTION)

(A-A' SECTION)

(I-I' SECTION)

(B-B' SECTION)

(A-A' SECTION)

(A-A' SECTION)

(A-A' SECTION)

(A-A' SECTION)

(A-A' SECTION)

(A-A' SECTION)

(A-A' SECTION)

(A-A' SECTION)

(J-J'SECTION)

(A-A' SECTION)

(A-A' SECTION)

(A-A' SECTION)

(A-A' SECTION)

(A-A' SECTION)

(k-k' SECTION)

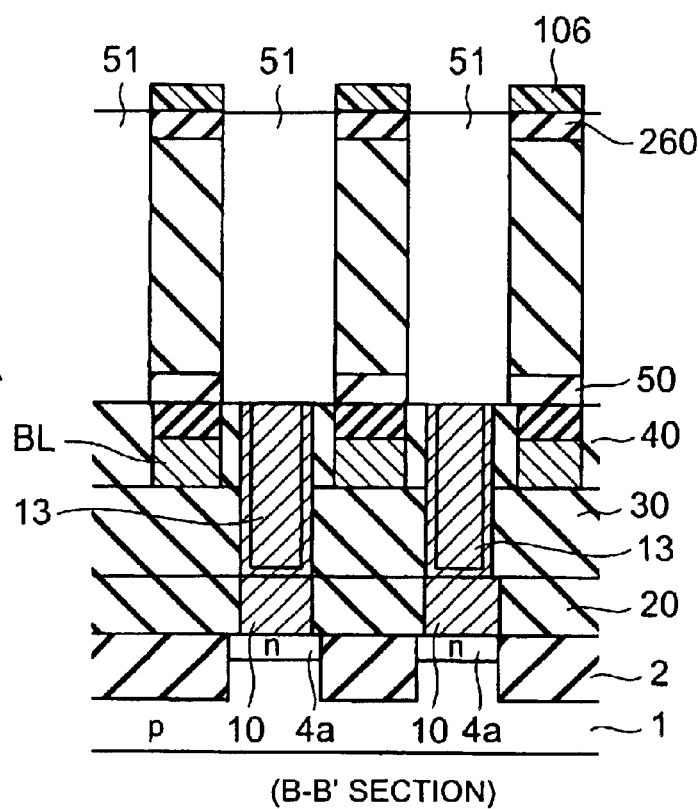
FIG. 53A (B-B' SECTION)
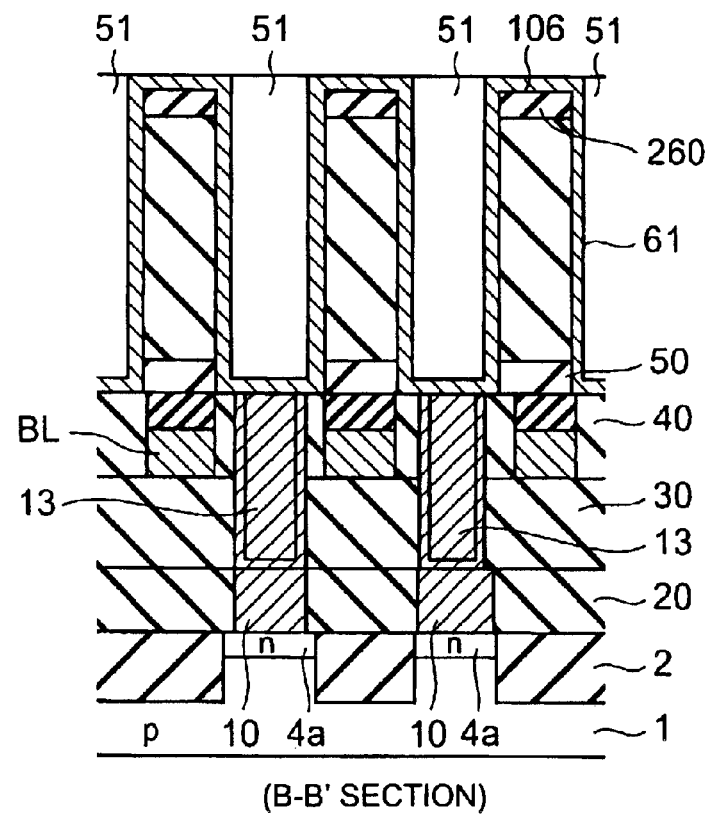
FIG. 53B (B-B' SECTION)

(B-B' SECTION)

(B-B' SECTION)

(B-B' SECTION)

(A-A' SECTION)

(B-B' SECTION)

(A-A' SECTION)

(A-A' SECTION)

(A-A' SECTION)

(C-C' SECTION)

(A-A' SECTION)

(C-C' SECTION)

(A-A' SECTION)

(C-C' SECTION)

(A-A' SECTION)

(B-B' SECTION)

(A-A' SECTION)

(B-B' SECTION)

(A-A' SECTION)

(A-A' SECTION)

(A-A' SECTION)

(A-A' SECTION)

US 6,822,280 B2

SEMICONDUCTOR MEMORY INCLUDING FORMING BEAMS CONNECTING THE CAPACITORS

CROSS REFERENCE TO RELATED APPLICATIONS

This application is based upon and claims the benefit of priority from the prior art Japanese Patent Application No. 2001-340198 filed on Nov. 6, 2001, the entire contents of which are incorporated by reference.

BACKGROUND OF THE INVENTION

The present invention relates to a semiconductor memory and a method of producing the same. Particularly, this invention relates to a cylinder-type stacked capacitor electrode for semiconductor memories and a method of producing such a type of stacked capacitor electrode.

One type of semiconductor memory is DRAM on/from which data can be written/retrieved. DRAM memory cells each consisting of one switching transistor and one capacitor have been widely used for semiconductor-memory integration owing to the simple structure.

One type of capacitor for such memory cells is a three-dimensionally structured capacitor that has been developed and used for maintaining capacitance at a certain degree or more in a reduced area on highly integrated DRAM.

The three-dimensionally structured capacitor is classified into a stacked type and a trench type. Especially, the stacked type is a good choice for highly integrated DRAM because of its stable performance with a relatively small capacitance and withstandingness against alpha ray and noises from circuitry.

Described with reference to FIGS. 56 to 58 is a known memory cell having such a stacked-type capacitor (called a stacked capacitor hereinafter) with a cylinder-type lower electrode, that has been under study and improvements. FIGS. 56 to 58 illustrate the known memory-cell structure: FIG. 56 is a plan view; FIG. 57 is a sectional view taken on line A–A' of FIG. 56; and FIG. 58 is a sectional view taken on line B–B' of FIG. 56.

Provided on a semiconductor substrate 501 in FIGS. 56 to 58 are device-isolation regions 502 selectively formed thereon and MOS transistors (called just transistors herein after) $Tr_1$, $Tr_2$, . . . , each having source/drain diffusion layers 504a and 504b apart from each other and a gate electrode 507 coated with a silicon nitride film 506 provided via a gate insulating film 505 between the diffusion layers 504a and 504b, arranged, for example, in a matrix on a device-forming region 503 surrounded by the isolation regions 502.

The gate electrodes 507 lie in a row direction (transversal direction in FIG. 56) each shared by the transistors adjacent to each other in the row direction, functioning as word lines $W_0$, $W_1$, . . . .

Also formed over the semiconductor substrate 501 is a first interlayer insulating film (silicon oxide film) 520 having a buried capacitor plug 510 and a buried bit-line plug 511, both made of polycrystal silicon, on the diffusion layers 504a and 504b, respectively.

Formed on each first interlayer insulating film 520 having the capacitor plug 510 and the bit-line plug 511 is a second interlayer insulating film (silicon oxide film) 530 having a buried bit-line contact plug 512 made of, for example, tungsten coupled to the bit-line plug 511.

Formed between the adjacent transistors are bit lines $BL_0$, $BL_1$, . . . , made of, for example, tungsten in a column direction (longitudinal direction in FIG. 56), each bit line being electrically connected to the bit-line plug 511 via the bit-line contact plug 512. Further formed on each second interlayer insulating film 530 is a third interlayer insulating film (silicon oxide film) 540 having the bit lines $BL_0$, $BL_1$, . . . , buried therein.

Formed between the two adjacent bit lines is a capacitor contact plug 513 reaching the capacitor plug 510 through the third and second interlayer insulating films 540 and 530. The capacitor contact plug 513 and the capacitor plug 510 constitute a capacitor conductive plug 515.

Formed on each third interlayer insulating film 540 having the capacitor contact plug 513 is an insulator mount 550 made of, for example, a silicon nitride film, as a capacitor mount.

Provided in each insulator mount 550 is a through hole 551 reaching the capacitor conductive plug 515. Also formed is a cylinder-type lower electrode 561 having a rectangular bottom buried in each through hole 551 and penetrating into each insulator mount 550, electrically connected to the diffusion layer 504a via the capacitor conductive plug 515.

Each lower electrode 561 has dielectric films 562 formed on the inside and outside walls thereof. Formed on each lower electrode 561 via the dielectric film 562 is an upper electrode 563. The lower electrode 561, the dielectric film 562 and the upper electrode 563 constitute a capacitor 560.

Each capacitor 560 has insulating films 570 formed on the inside and outside wall thereof. Although not shown, another upper electrode and wirings are provided on each capacitor 560 to constitute a memory cell having the transistor and the cylinder-type capacitor.

Described next with reference to FIGS. 59A to 66B is a method of producing the known memory cell. FIGS. 59A to 66B illustrate a sectional view for each production step, taken on line A–A', line B–B' or C–C' of FIG. 56.

As shown in FIG. 59A, the device-isolation regions 502 are selectively formed on the p-type semiconductor substrate 501, followed by formation of the gate electrodes 507 on the device-forming region 503 surrounded by the device-isolation regions 502, via the gate insulating films 505. Each gate electrode is coated with the silicon nitride film 506 and has a laminated structure of a polycrystal silicon layer and a tungsten layer. The semiconductor substrate 501 is then doped with n-type impurities using the gate electrodes 507 as a mask, thus the n-type source/drain diffusion layers 504a and 504b being formed for the MOS transistors (FIG. 59A).

A silicon oxide film is then deposited over the semiconductor substrate 501 having the gate electrodes 507 by plasma CVD (Chemical Vapor Deposition). The deposition is followed by CMP (Chemical Mechanical Polishing) for polishing the silicon oxide film until the silicon nitride film 506 on the gate electrodes 507 is exposed, having the first interlayer insulating film 520 buried between the two adjacent gate electrodes 507, as shown in FIG. 59B.

The first interlayer insulating film 520 formed on the diffusion layers 504a and 504b is selectively removed to provide openings 520a and 520b, respectively. Especially, the openings 520b are provided as having the width reaching over the device-isolation region 502 from the diffusion layer 504b. A phosphor-doped polycrystal silicon film is deposited over the semiconductor substrate 501 by LP (Low-Pressure)-CVD, followed by CMP, having the capacitor plugs 510 and the bit-line plugs 511, both made of a low-resistance polycrystal silicon film, buried in the openings 520a and 520b, respectively, on the diffusion layers 504a and 504b, respectively (FIGS. 59C and 59D).

The second interlayer insulating film 530 made of, for example, silicon oxide is formed on the first interlayer insulating film 520 having the buried capacitor plugs 510 and the buried bit-line plugs 511. The second interlayer insulating film 530 is then provided with openings 530a through each of which the bit-line plug 511 is exposed. A barrier metal film 531 is formed on the inside wall of each opening 530a.

A conductive film made of, for example, tungsten is deposited on the second interlayer insulating film 530, thus the opening 530a being filled with the conductive film. The bit-line contact 512 made of tungsten is then buried into the opening 530a after having the conductive film polished by CMP (FIGS. 60A and 60B).

Another tungsten film is deposited and patterned using a specific-patterned silicon nitride film 541 provided on the tungsten film as a mask, thus forming the bit lines BL each connected to the bit-line plug 511 via the bit plug 512 (FIGS. 60C and 60D).

The third interlayer insulating film 540 made of, for example, an silicon oxide film is deposited on the second interlayer insulating film 523 having the bit liens BL, the third interlayer film 540 being then buried between the bit lines BL adjacent to each other after CMP-polish (FIGS. 61A and 61B).

Through holes 540a are provided each between two bit lines BL, as penetrating the third and second interlayer films 540 and 530 and reaching the capacitor plugs 510. A barrier metal film 532 is formed on the inside wall of each through hole 540a (FIGS. 62A and 62B).

A conductive film made of, for example, tungsten is deposited on the third interlayer insulating film 540, thus the through holes 540a being filled with the conductive film. The capacitor contact plug 513 made of tungsten is then buried into each through hole 540a after having the conductive film polished by CMP, thus the capacitor contact plug 513 and the capacitor plug 510 constituting the capacitor conductive plug 515 electrically connected to each diffusion layer 504a (FIGS. 63A and 63B).

Deposited nest successively by LP-CVD are the insulator mount 550 made of, for example, a silicon nitride film to support capacitor lower electrodes and a dummy insulating film 580 such as an silicon oxide film (FIG. 64A). The dummy insulating film 580 and the insulator mount 550 are patterned by known lithography and etching techniques to provide the through holes 551 so that the capacitor contact plugs 513 can be exposed therethrough (FIG. 64A).

A conductive film, such as, a ruthenium (Ru) film is then formed by LP-CVD on the inner wall and the bottom of the through holes 551 and also the dummy insulating film 580, followed by application of a photoresist film 590 so that the through holes 551 can be completely filled with the photoresist film (FIG. 64B).

The photoresist film 590 is polished by CMP, thus the through holes 551 being filled with the photoresist film 590, until the lower electrode 561 portions formed on the dummy insulating film 580 are removed (FIG. 65A).

The photoresist 590 filled in each of the through hole 551 is removed with thinner and then dummy insulating film 580 used for providing the through holes 551 is removed with a hydrofluoric-acid aqueous solution, thus forming the rectangular-cylinder type lower electrodes 561 on the capacitor conductive plugs 515, the bottom of each lower electrode being supported by the insulator mount 550 (FIG. 65B).

The dielectric film 562, such as, a TaO film is formed on the inside and outside walls of each lower electrode 561, and a conductive film, such as, a Ru film is formed by LP-CVD on the dielectric film 562. The conductive film is patterned to become the upper electrode 563. The lower electrode 561, the dielectric film 562 and the upper electrode 563 constitute each capacitor 560 (FIG. 66A).

The insulating film 570 is then deposited inside and outside the capacitors 560 and polished (FIG. 66B).

After that, wirings connected to the upper electrode are provided by known wiring techniques on each capacitor 560 to constitute a memory cell having one transistor and one cylinder-type capacitor.

The known memory cell described above, however, has the following disadvantages:

Each cylinder-type lower electrode 561 is supported by the insulator mount 550 such that the bottom of the electrode is surrounded by the mount. The bottom outer surface surrounded by the insulator mount 550 has no dielectric film 562 and the upper electrode 563 thereon, so that this bottom portion of the lower electrode will not work as a capacitor in operation.

With increased demand for further miniaturization and high integration in DRAM memories, it is a current trend that the area on which such a type of capacitor is to be formed is further reduced. And, one requirement for DRAM memory cells is capacitance consistency against alpha-ray induced soft errors or for enhanced signal strength in data retrieval. These trend and requirement cause such a capacitor to be higher and higher in height.

A thin insulator mount 550 for gaining high capacitance for such a capacitor could cause low mechanical strength for each lower electrode 561 to stand by itself, resulting in that the lower electrode 561 could fall down during stacked-capacitor assembly. On the contrary, a thick insulator mount 550 for protecting the lower electrode 561 from falling down could not provide a required capacitance.

Further disadvantages of the known memory cell are that each lower electrode 561 is thin, for example, 30 nm in thickness and hence mechanically weak, and it is supported by the insulator mount 550 only at its bottom. This structure could cause that the lower electrode 561 falls down during processes, such as, selective etching to the dummy insulating film between lower electrodes, removal of photoresist from the lower electrodes, formation of dielectric films and upper electrodes on the lower electrodes, and filling insulating materials in inside and outside capacitors, thus lowering manufacturing yields.

SUMMARY OF THE INVENTION

A semiconductor memory according to a first aspect of the present invention includes: at least one insulator mount formed over a semiconductor substrate; a plurality of cylinder-type stacked capacitors, a bottom of each capacitor being supported by the insulator mount, each capacitor having a lower electrode and an upper electrode facing each other via a dielectric film; and at least one beam-like insulator supporting a side portion of the lower electrode of each capacitor, the side portion being located between an upper edge of the lower electrode and the insulator mount.

Moreover, a semiconductor memory according to a second aspect of the present invention includes: at least one transistor formed in a surface of a semiconductor substrate; an insulating film formed over the transistor; a plurality of cylinder-type stacked capacitors, each capacitor having a cylinder-type lower electrode electrically connected to a diffusion layer of the transistor through the insulating film, a dielectric film covering inside and outside surfaces of the lower electrode and an upper electrode formed on the dielectric film; and at least one beam-like insulator supporting a side portion of the lower electrode of each capacitor, the side portion being apart from a lower edge of the lower electrode.

Furthermore, a method of producing a semiconductor memory according to a third aspect of the present invention includes: forming an inter-layer insulating film over a semiconductor substrate, the inter-layer insulating film having at least one conductive plug embedded therein, the conductive plug being electrically connected to a diffusion layer formed in the surface of the semiconductor substrate; forming a first insulating film on the inter-layer insulating film; forming a first dummy insulating film on the first insulating film; forming a beam-like insulator on the first dummy insulating film; selectively removing the first dummy insulating film and the first insulating film to provide a hole, an outer wall portion of the hole touching the beam-like insulator and a bottom of the hole reaching the conductive plug; forming a first conductive film extending from an inner wall of the hole to the bottom thereof, the first conductive film functioning as a lower electrode; selectively removing the first dummy insulating film in relation to the beam-like insulator and the first insulating film to have the lower electrode, the beam-like insulator and the first insulating film remaining un-removed; forming a dielectric film to cover inner and outer surfaces of the lower electrode; and forming a second conductive film on the dielectric film, the second conductive film functioning as an upper electrode.

BRIEF DESCRIPTION OF DRAWINGS

FIGS. 2A and 2B are sectional views, of the semiconductor memory according to the first embodiment of the present invention, FIG. 2A being taken on line A–A' of FIG. 1 and FIG. 2B being taken on line D–D' of FIG. 2A;

FIGS. 4A to 4D are views illustrating production steps in a method of producing the semiconductor memory according to the first embodiment of the present invention, FIGS. 4A to 4C being sectional views taken on line A–A' of FIG. 1, and FIG. 4D being a sectional view taken on line C–C' of FIG. 1;

FIGS. 5A to 5D are views illustrating production steps in the method of producing the semiconductor memory according to the first embodiment of the present invention, FIG. 5A being a sectional view taken on line A–A' of FIG. 1, FIG. 5B being a sectional view taken on line C–C' of FIG. 1, FIG. 5C being a sectional view taken on line A–A' of FIG. 1, and FIG. 5D being a sectional view taken on line C–C' of FIG. 1;

FIGS. 53A and 53B are sectional views taken on line B–B' of FIG. 48, illustrating production steps in the method of producing the semiconductor memory according to the sixth embodiment of the present invention;

DETAILED DESCRIPTION OF EMBODIMENTS

Embodiments according to the present invention will be disclosed with reference to the attached drawings.

(First Embodiment)

Figure 1:
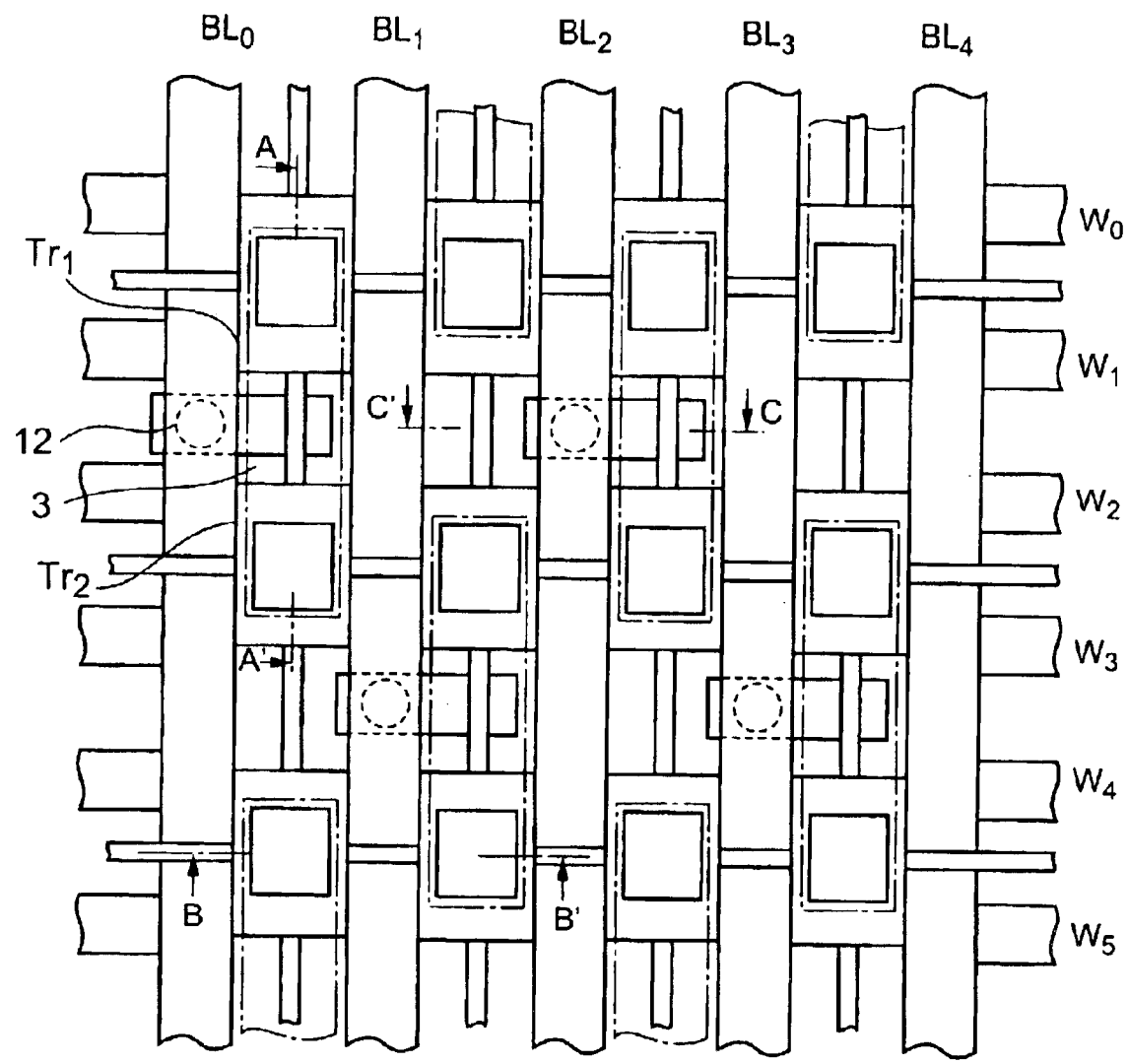
FIG. 1 is a schematic plan view showing a structure of a semiconductor memory according to a first embodiment of the present invention.
Figure 3:
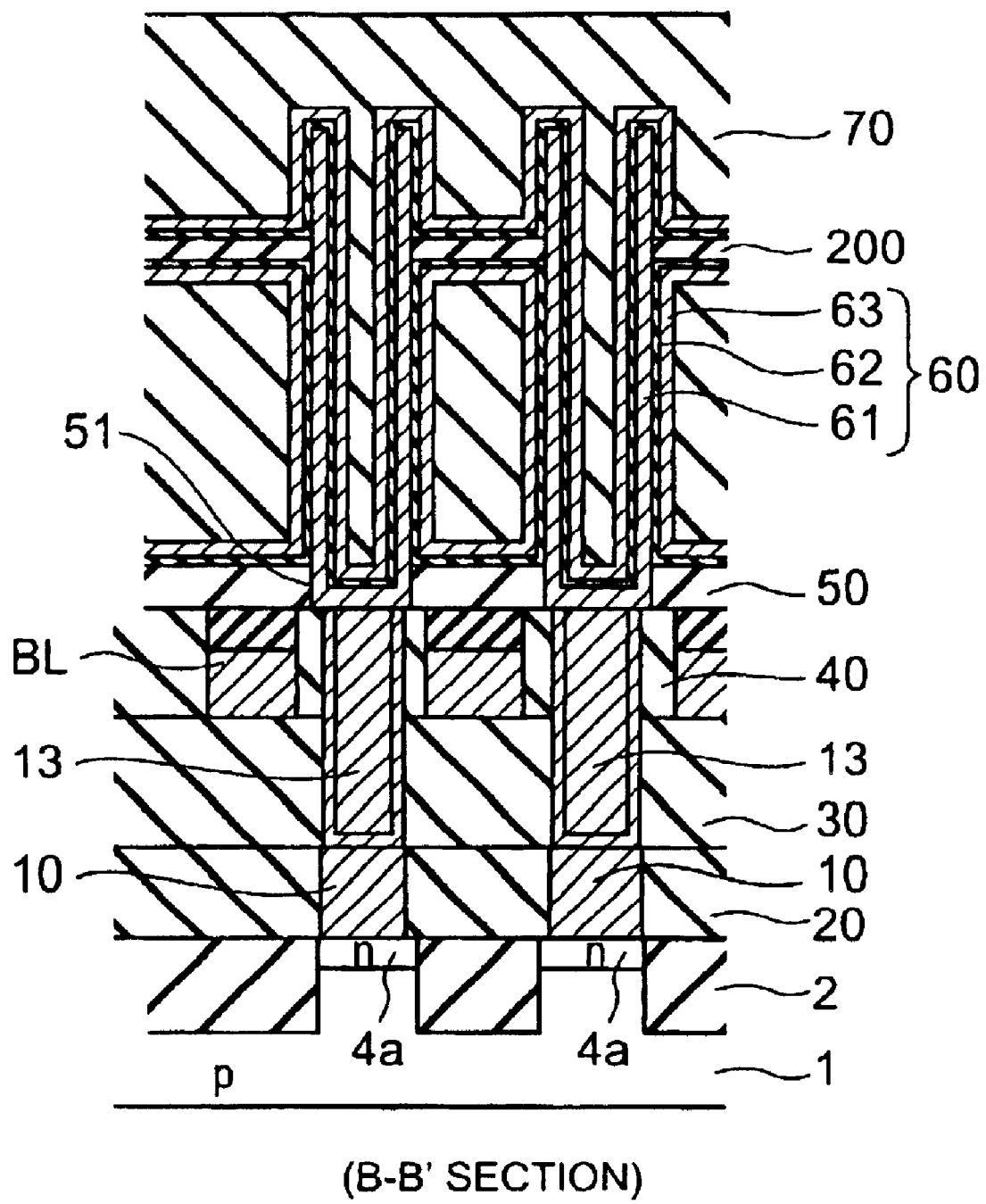
FIG. 3 is a sectional view, of the semiconductor memory according to the first embodiment of the present invention, taken on line B–B' of FIG. 1.

Disclosed with reference to FIGS. 1 to 3 is a structure of a semiconductor memory according to a first embodiment of the present invention. FIG. 1 is a plan view of the semiconductor memory in the first embodiment. FIG. 2A is a sectional view taken on line A–A' of FIG. 1, FIG. 2B is a sectional view taken on line D–D' of 2A, and FIG. 3 is a sectional view taken on line B–B' of FIG. 1.

Provided on a p-type semiconductor substrate 1 in FIGS. 1 to 3 are device-isolation regions 2 selectively formed thereon and transistors $Tr_1$, $Tr_2$, . . . , each having source/drain diffusion layers 4a and 4b apart from each other and a gate electrode 7 having a polycrystal layer/tungsten-silicide layer-laminated structure coated with a silicon nitride film 6 provided via a gate insulating film 5 between the diffusion layers 4a and b, arranged, for example, in a matrix on a device-forming region 503 surrounded by the isolation regions 502.

The gate electrodes 7 lie in a row direction (transversal direction in FIG. 1) each shared by the transistors adjacent to each other in the row direction, functioning as word lines $W_0$, $W_1$, . . . .

Also formed on the semiconductor substrate 1 is first interlayer insulating film 20 such as silicon oxide film having a buried capacitor plug 10 and a buried bit-line plug 11, both made of, for example, polycrystal silicon on the diffusion layers 4a and 4b, respectively.

Formed on each first interlayer insulating film 20 having the capacitor plug 10 and the bit-line plug 11 is a second interlayer insulating film 30, such as, an silicon oxide film having a buried bit-line contact plug 12 made of, for example, tungsten coupled to the bit-line plug 11 (FIG. 2A).

Formed between the adjacent transistors are bit lines $BL_0$, $BL_1$, . . . , made of, for example, tungsten in a column direction (longitudinal direction in FIG. 1), each bit line being electrically connected to the bit-line plug 11 via the bit-line contact plug 12. Further formed on each second interlayer insulating film 30 is a third interlayer insulating film 40 having the bit lines $BL_0$, $BL_1$, . . . , buried therein.

Formed between the two adjacent bit lines is a capacitor contact plug 13 reaching the capacitor plug 10 through the third and second interlayer insulating film 40 and 30. The capacitor contact plug 13 and the capacitor plug 10 constitute a capacitor conductive plug 15.

Formed as a capacitor mount on each third interlayer insulating film 40 having the capacitor contact plug 13 is an about 200 nm-thick insulator mount 50 made of, for example, a silicon nitride film. The insulator mount 50 will work as an etching stopper.

Formed in each insulator mount 50 is a through hole 51 reaching the capacitor conductive plug 15. Also formed is a cylinder-type lower electrode 61 having a bottom buried in each through hole 51 and penetrating into each insulator mount 50, electrically connected to the diffusion layer 4a via the capacitor plug 15. The lower electrode 61 has, for example, 30 nm in thickness, with a rectangular bottom of a 300 nm-long side and a 200 nm-short side, and 1000 nm in height, like a cylinder.

Adjacent two lower electrodes 61 are joined each other via beam-like insulators 200 at their upper portions and also their facing side walls between the two insulator mounts 50. In other words, the four side walls of each lower electrode 61 are joined to the corresponding four side walls of another lower electrode 61 via the beam-like insulators 200.

Each beam-like insulator 200 is made of, for example, a silicon nitride film having a 50 nm×50 nm square section. Not only the silicon nitride film, the beam-like insulator 200 may be made of an oxide film, such as, an HDP-TEOS film, a tantalum-oxide(TaO) film, an aluminum-oxide($Al_2O_3$) film, a BaSrTiO$_3$(BST) film, a SrTiO$_3$(STO) film, a BaTiO$_3$ (BTO) film, a PbZrTiO$_3$(PZT) film and a SrBi$_2$Ta$_2$O$_9$(SBT) film.

Each lower electrode 61 has about 10 nm-thick dielectric films 62, such as, Ta$_2$O$_5$ films formed on the inside and outside walls thereof. Not only the Ta$_2$O$_5$ film, the dielectric films 62 may be made of a highly dielectric film of, such as, SBT, BST and Al$_2$O$_3$.

Formed on the inside and outside walls of each lower electrode 61 via the dielectric films 62 is an upper electrode 63 made of, for example, ruthenium (Ru). The lower electrode 61, the dielectric films 62, and the upper electrode 63 constitute a cylinder-type capacitor 60. The term "cylinder-type" implies, for example, a capacitor having a hollow cylinder-like shape, the bottom surface thereof being a square, a circle and so on.

Each capacitor 60 has an insulating film 70 formed on the inside wall thereof. The insulating film 70 also lies between the two capacitors 60. Although not shown, wirings, such as, upper-electrode connecting wirings are provided on or via the insulating film 70.

Figure 14A:
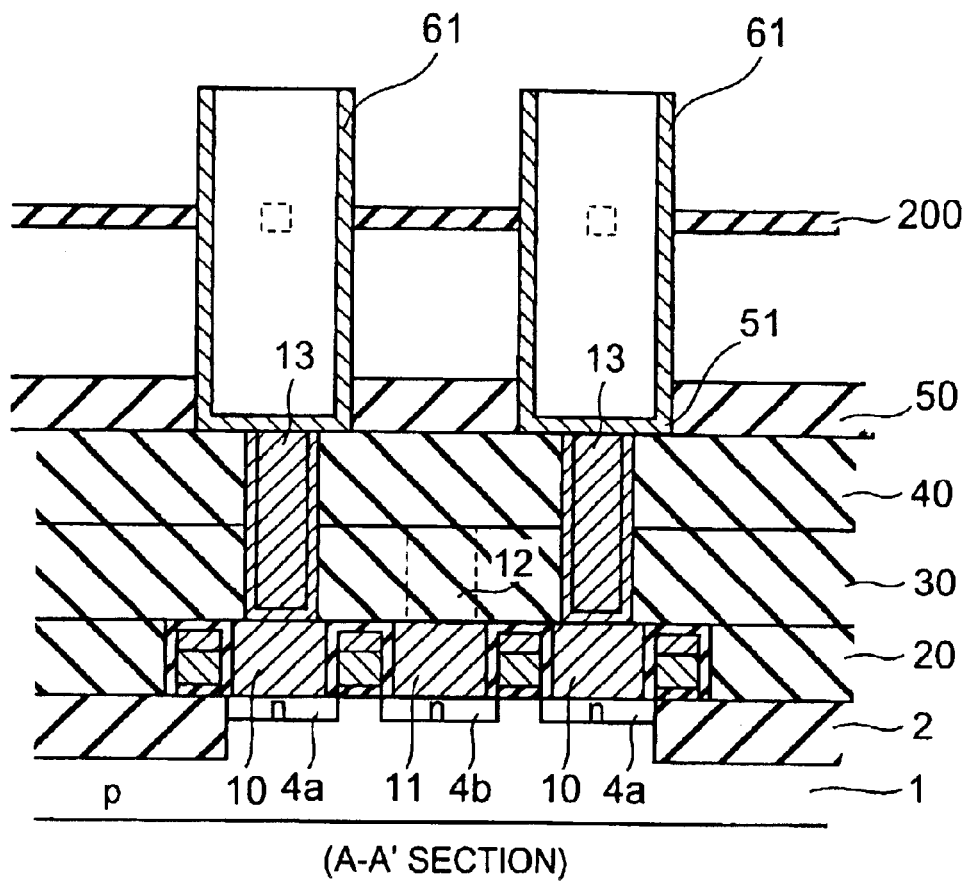
FIGS. 14A and 14B are views illustrating production steps in the method of producing the semiconductor memory according to the first embodiment of the present invention, FIG. 14A being a sectional view taken on line A–A' of FIG. 1, and FIG. 14B being a plan view for FIG. 14A.
Figure 14B:
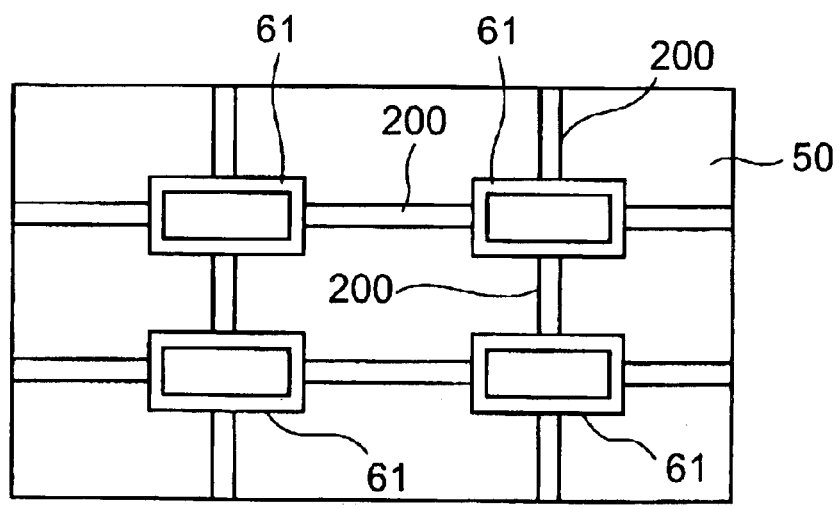
Figure 15A:
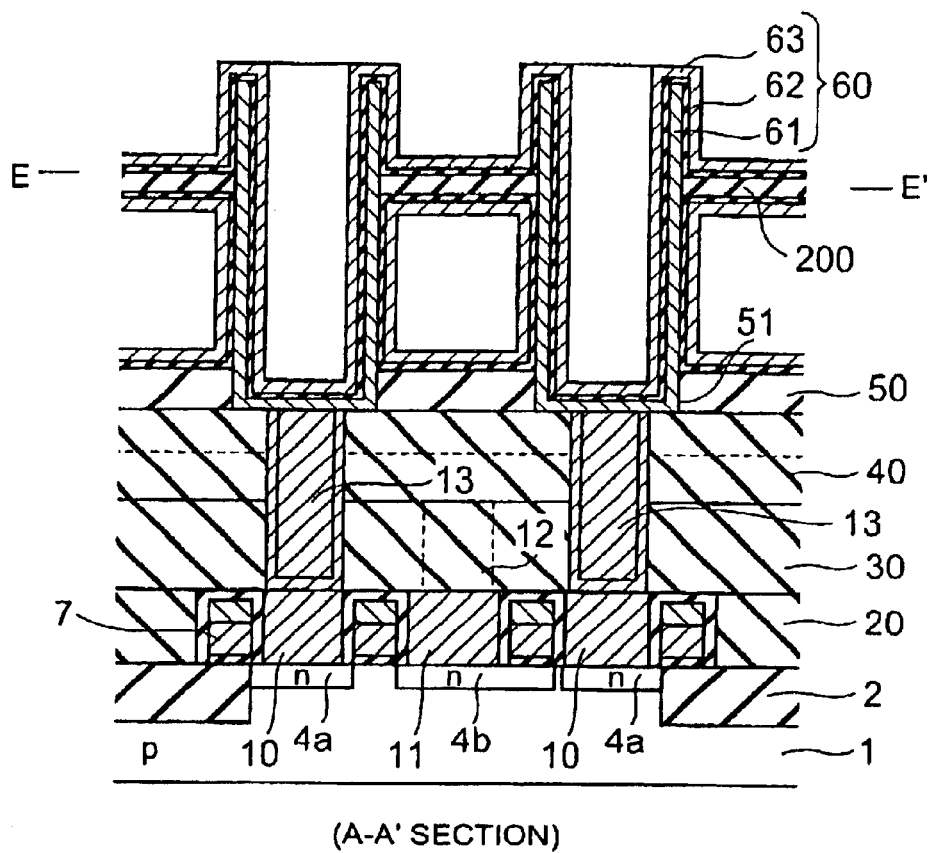
FIGS. 15A and 15B are views illustrating production steps in the method of producing the semiconductor memory according to the first embodiment of the present invention, FIG. 15A being a sectional view taken on line A–A' of FIG. 1, and FIG. 15B being a sectional view taken on line E–E' of FIG. 15A.
Figure 15B:
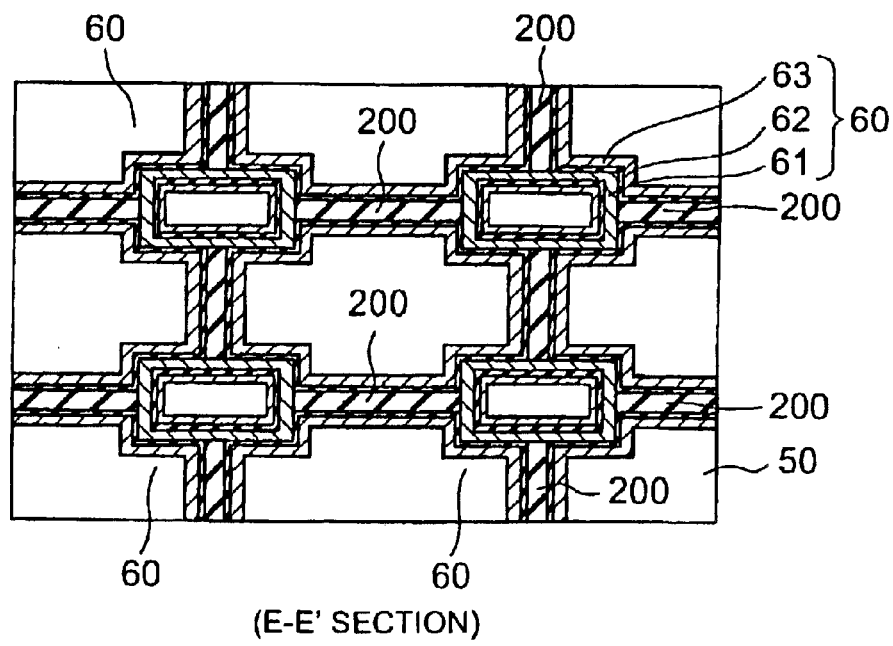

Disclosed next with reference to FIGS. 4A to 16B is a method of producing the semiconductor memory in the first embodiment. FIGS. 4A to 16B are sectional views illustrating production steps, taken on line A–A', line B–B' or C–C' of FIG. 1, except FIGS. 10B, 11B and 14B, plan views for FIGS. 10A, 11A and 14A, respectively. FIGS. 15B and 16B are sectional views taken on line E–E' and line F–F' of FIGS. 16A and 16B, respectively.

As shown in FIG. 4A, the device-isolation regions 2 are selectively formed on the p-type semiconductor substrate 1, followed by formation of the gate insulating film 5, polycrystal silicon layer, tungsten silicide layer and silicon nitride film in order in the device-forming region 3 surrounded by the isolation regions 2.

The silicon nitride film is patterned by known lithography and etching techniques, followed by successive patterning of the tungsten silicide layer and the polycrystal silicon layer while masked by the patterned silicon nitride film. The patterned layers are coated with the silicon nitride film 6 to form the gate electrodes 7 having a laminated structure of the polycrystal silicon layer and tungsten silicide layer.

The semiconductor substrate 1 is then doped with n-type impurities while masked by the gate electrodes 7, thus the n-type source/drain diffusion layers 4a and 4b being formed for MOS switching transistors. The gate electrodes 7 of these transistors lie in a row direction (transversal direction in FIG. 4A) while those of adjacent transistors are connected to each other in the row direction to form word lines $W_0$, $W_1$, . . . (not shown).

A silicon oxide film is then deposited by CVD over the semiconductor substrate 1 having the gate electrodes 7, for example. The deposition is followed by polishing the silicon oxide film until the silicon nitride film 6 on the gate electrodes 7 is exposed, having the flat first interlayer insulating film 20 made of, for example, an silicon oxide film, buried between the two adjacent gate electrodes 7 (FIG. 4B).

The polishing process for the first interlayer insulating film 20 is carried out for burying plugs in this insulating film 20 in a later step and hence may not always be necessary if no plugs are required.

The first interlayer insulating film 20 formed on the diffusion layers 4a and 4b is selectively removed by known lithography and etching techniques, to provide openings 20a and 20b, respectively. Especially, each opening 20b is provided as having the width reaching over the device-isolation region 2 from the diffusion layer 4b. A phosphor-doped polycrystal silicon film is deposited over the semiconductor substrate 1 by LP-CVD, followed by CMP, having the capacitor plugs 10 and the bit-line plugs 11, both made of a low-resistance polycrystal silicon film, buried in the openings 20a and 20b, respectively, on the diffusion layers 4a and 4b, respectively (FIGS. 4C and 4D).

A silicon oxide film is deposited, for example, by CVD on the first interlayer insulating film 20 having the buried capacitor plugs 10 and the buried bit-line plugs 11 to form the second interlayer insulating film 30.

The second interlayer insulating film 30 is then provided with openings 30b, by known lithography and etching techniques, through each of which the bit-line plug 11 is exposed. A barrier metal film 31 of a laminated structure of, for example, TiN/Ti films is formed on the inside wall of each opening 30a.

A conductive film made of, for example, tungsten is deposited on the second interlayer insulating film 30, thus the opening 30a being filled with the conductive film. The bit-line contact 12 made of tungsten is then buried into the opening 30a after having the conductive film polished by CMP (FIGS. 5A and 5B).

Another tungsten film is deposited and patterned while masked by a patterned silicon nitride film 41 provided on the tungsten film, thus forming the bit lines BL each connected to the bit-line plug 11 via the bit plug 12 (FIGS. 5C and 5D).

Figure 6A:
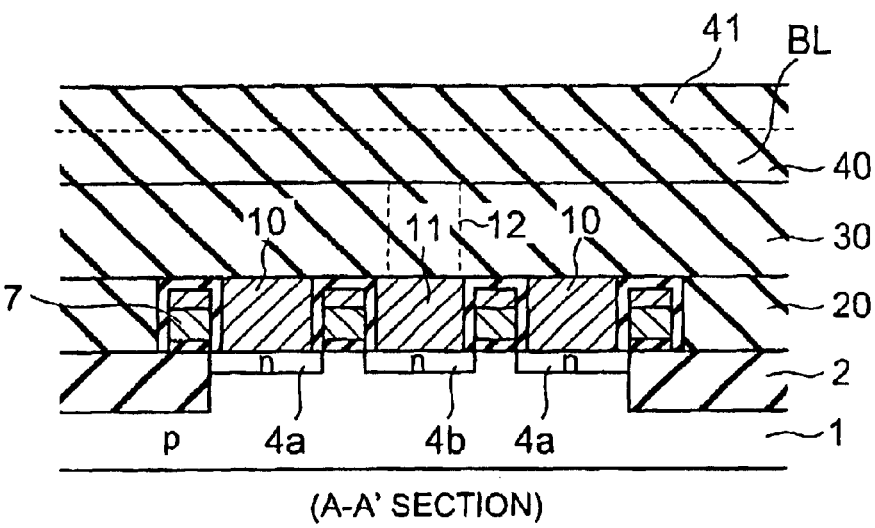
FIGS. 6A and 6B are views illustrating production steps in the method of producing the semiconductor memory according to the first embodiment of the present invention, FIG. 6A being a sectional view taken on line A–A' of FIG. 1, and FIG. 6B being a sectional view taken on line C–C' of FIG. 1.
Figure 6B:
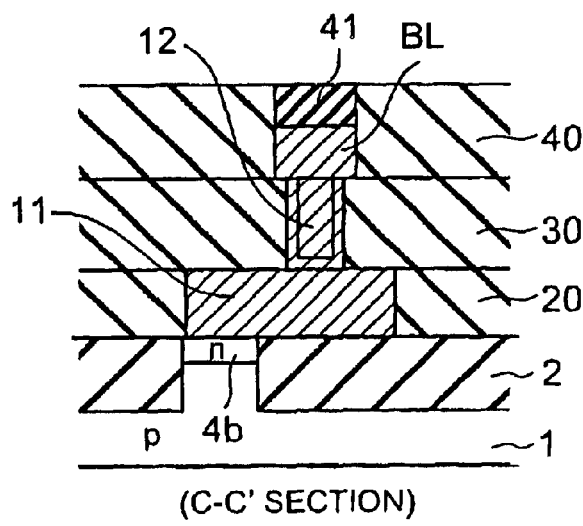

The third interlayer insulating film 40 made of, for example, an silicon oxide film is deposited, for example, by CVD on the second interlayer insulating film 30 having the bit lines BL, the third interlayer film 40 being then buried into two adjacent bit lines BL after CMP (FIGS. 6A and 6B).

Figure 7A:
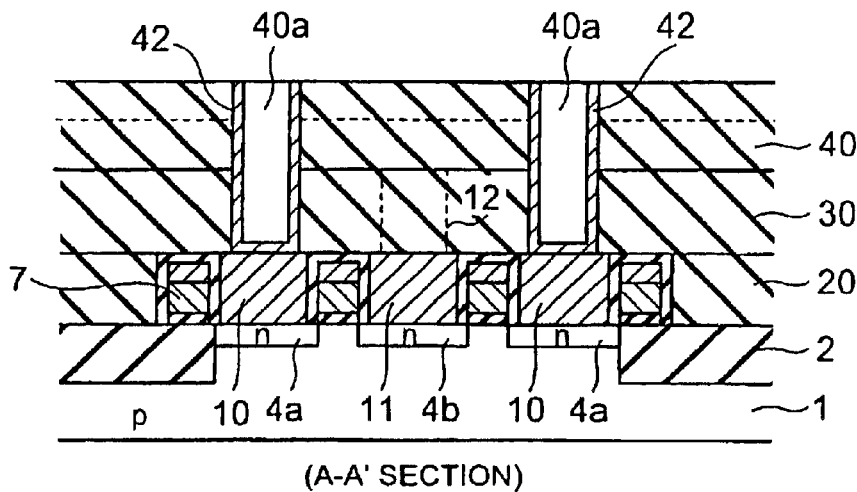
FIGS. 7A and 7B are views illustrating production steps in the method of producing the semiconductor memory according to the first embodiment of the present invention, FIG. 7A being a sectional view taken on line A–A' of FIG. 1, and FIG. 7B being a sectional view taken on line B–B' of FIG. 1.
Figure 7B:
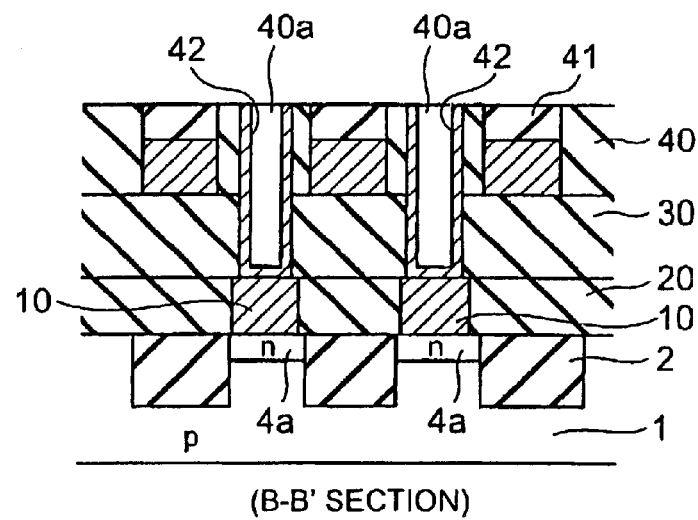

Through holes (first through holes) 40a are provided, by known lithography and etching techniques, each between two bit lines BL, as penetrating the third and second interlayer films 40 and 30 and reaching the capacitor plugs 10. A barrier metal film 42 of a TiN/TI-film laminated structure is formed on the inside wall of each through hole 40a (FIGS. 7A and 7B).

Figure 8A:
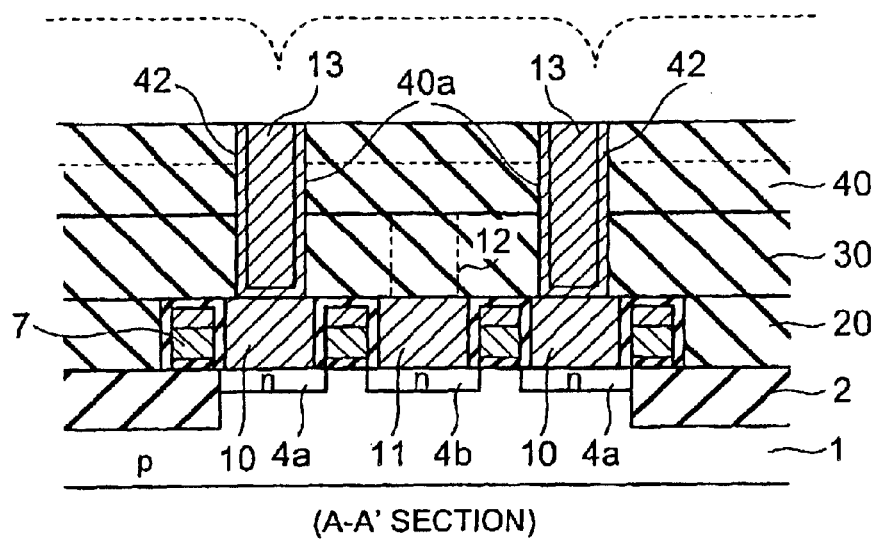
FIGS. 8A and 8B are views illustrating production steps in the method of producing the semiconductor memory according to the first embodiment of the present invention, FIG. 8A being a sectional view taken on line A–A' of FIG. 1, and FIG. 8B being a sectional view taken on line B–B' of FIG. 1.
Figure 8B:
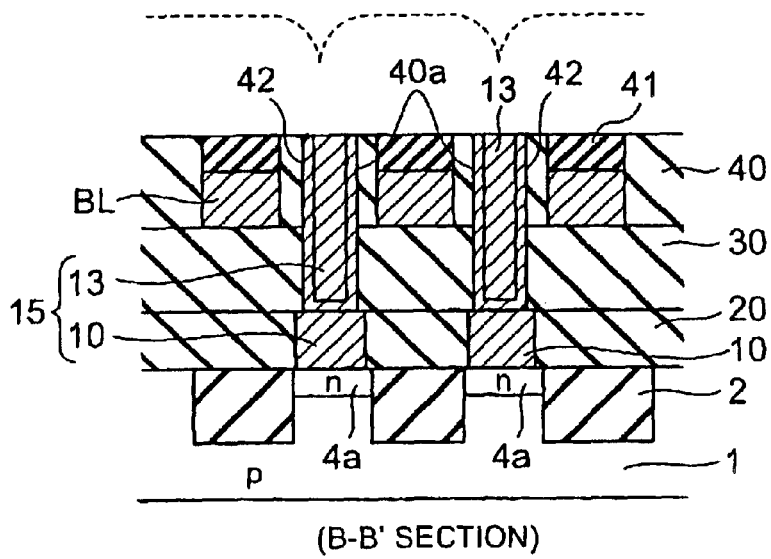

A conductive film made of, for example, tungsten is deposited on the third interlayer insulating film 40, thus the through holes 40a being filled with the conductive film. The capacitor contact plug 13 made of tungsten is then buried into each through hole 40a after having the conductive film polished, thus the capacitor contact plug 13 and the capacitor plug 10 constituting the capacitor conductive plug 15 electrically connected to each diffusion layer 4a (FIGS. 8A and 8B).

Figure 9:
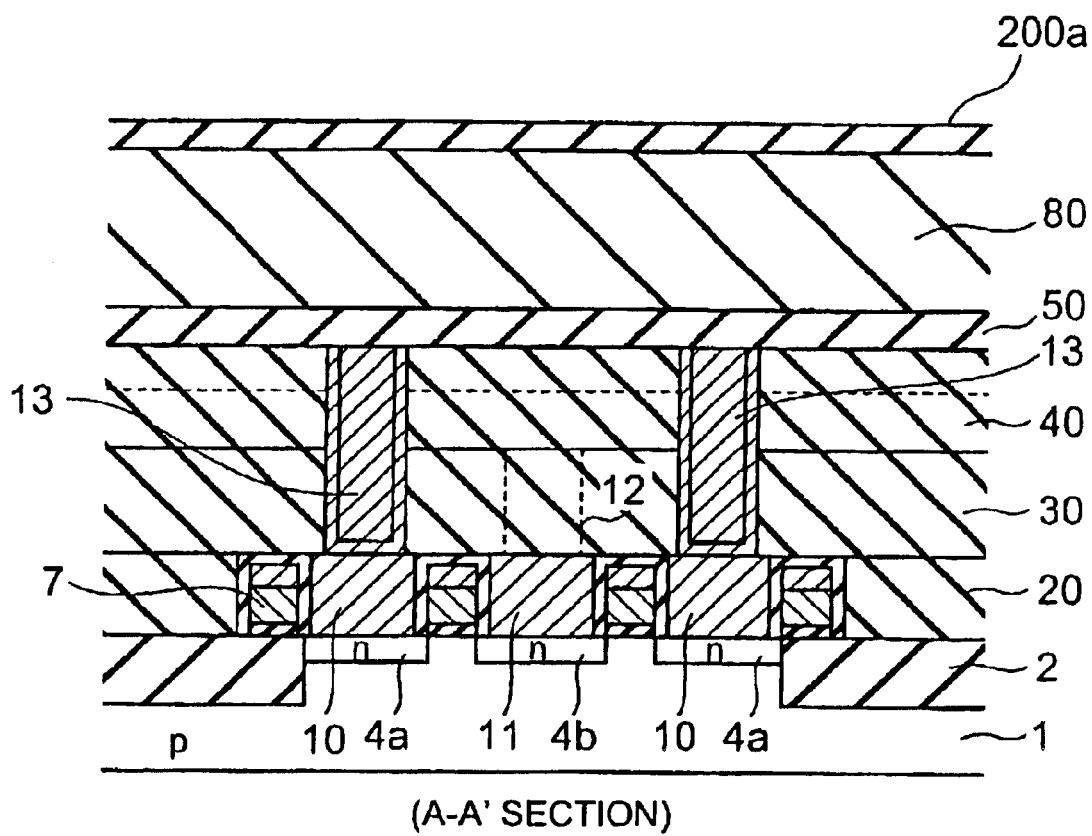
FIG. 9 is a view taken on line A–A' of FIG. 1, illustrating production steps in the method of producing the semiconductor memory according to the first embodiment of the present invention.

Deposited by LP-CVD is the insulator mount 50 made of, for example, a silicon nitride film of about 200 nm in thickness to support capacitor lower electrodes as shown in FIG. 9. The insulator mount 50 will work as an etching stopper in a later step.

A first dummy insulating film 80 made of a material exhibiting an etching property different from the insulator mount 50 is formed thereon as shown in FIG. 9. For example, an about 500 nm-thick silicon oxide film is deposited on the insulator mount 50, by LP-CVD, as the first dummy insulating film 80. An oxide film, such as, a BPSG film doped with impurities or an undoped oxide film may be used as the first dummy insulating film 80.

The first dummy insulating film 80 is polished by CMP and, for example, an about 50 nm-thick silicon nitride film is deposited thereon by LP-CVD to form an insulating film 200a which will be formed into an beam-like insulator in a later step to connect stacked capacitors (FIG. 9).

The insulating film 200a may be an insulating film exhibiting an etching property different from the first dummy insulating film 80. A good choice for the film 200a, in addition to the silicon nitride film is, for example, an silicon oxide film such as an HDP-TEOS film, a TaO film, an $Al_2O_3$ film, a BST film, an STO film, a BTO film, a PZT film and an SBT film.

Figure 10A:
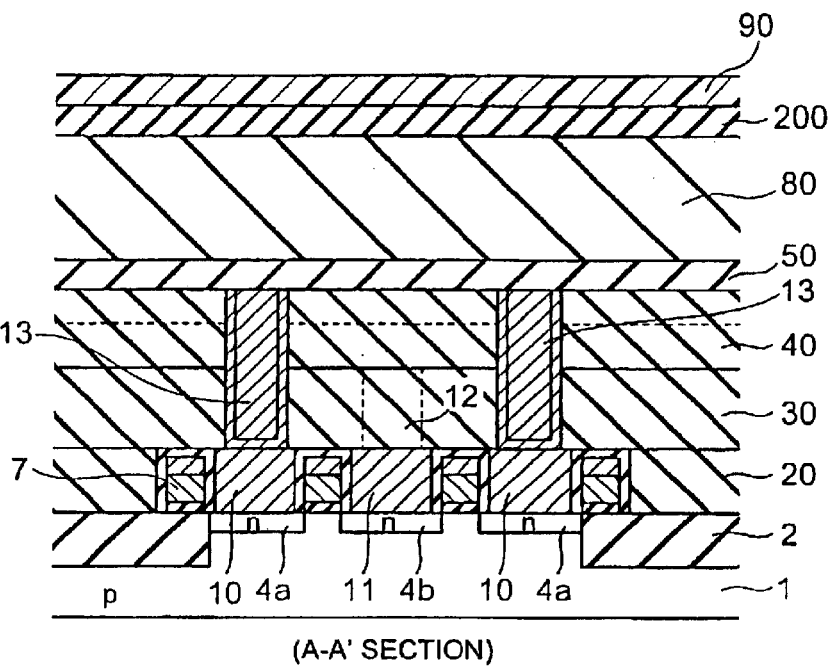
FIGS. 10A and 10B are views illustrating production steps in the method of producing the semiconductor memory according to the first embodiment of the present invention, FIG. 10A being a sectional view taken on line A–A' of FIG. 1, and FIG. 10B being a plan view for FIG. 10A.
Figure 10B:
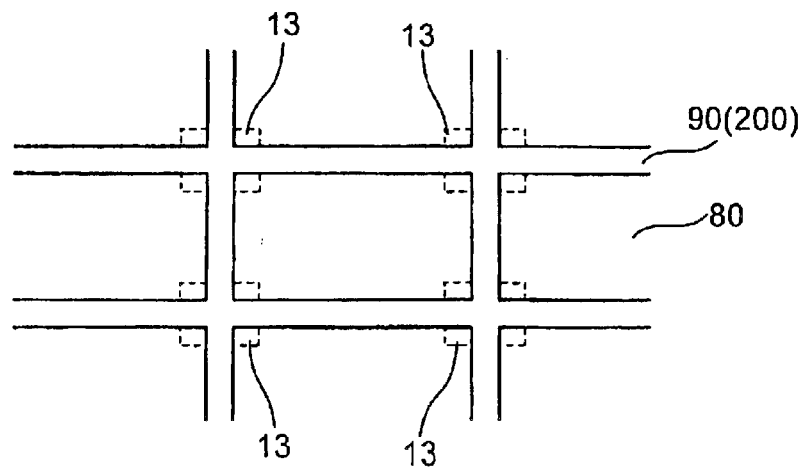

A fine grid photoresist pattern 90 of, for example, about 50 nm in grid width is then formed on the insulating film 200a. The film 200a is etched by dry etching while masked by the photoresist pattern 90 to form a grid beam-like insulator 200 having intersections above the capacitor contact plugs 13 (FIGS. 10A and 10B).

After the photoresist pattern 90 is removed, a second dummy insulating film 81 is formed over the first dummy insulating film 80 via the beam-like insulator 200. The second dummy insulating film 81 may be an about 500 nm-thick silicon oxide film deposited by CVD. A better choice for the second film 81 is an insulating film exhibiting an etching property almost the same as the first film 80 but different from the beam-like insulator 200, for example, an impurity-doped silicon oxide film such as a BPSG film or a nondoped silicon oxide film.

Figure 11A:
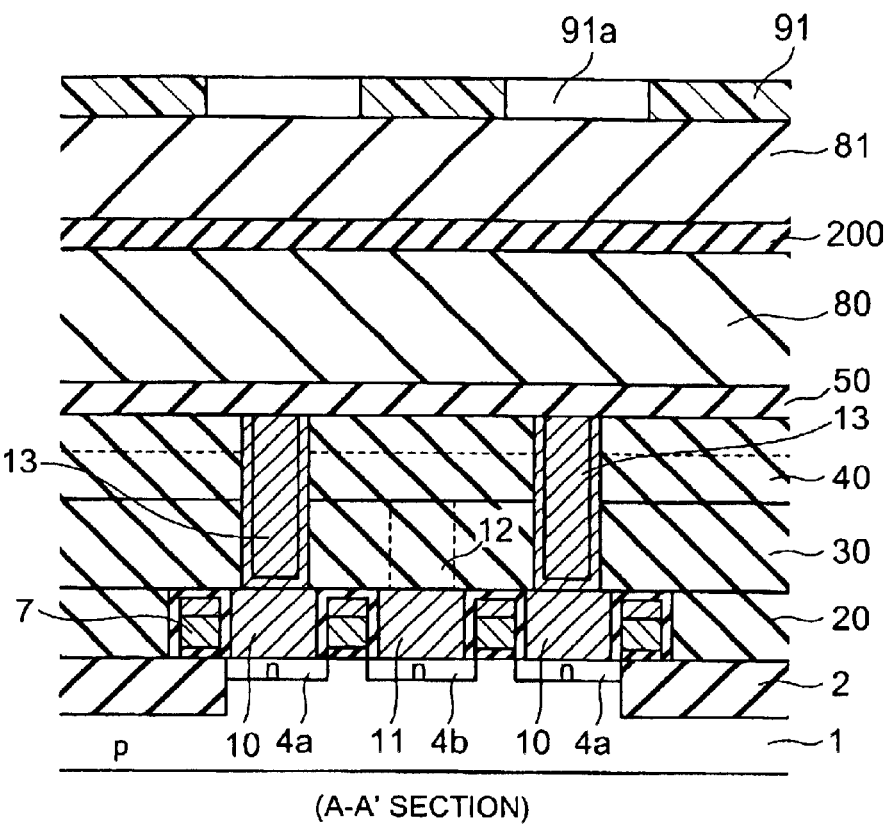
FIGS. 11A and 11B are views illustrating production steps in the method of producing the semiconductor memory according to the first embodiment of the present invention, FIG. 11A being a sectional view taken on line A–A' of FIG. 1, and FIG. 11B being a plan view for FIG. 11A.
Figure 11B:
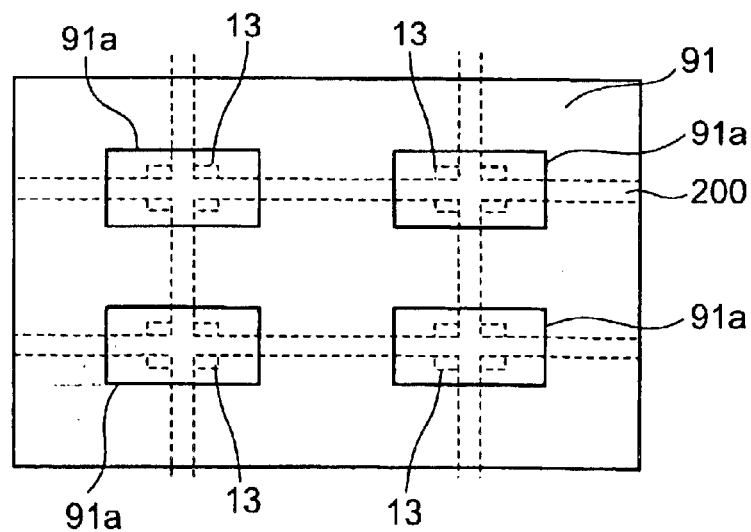

A grid photoresist pattern 91 is formed on the second dummy insulating film 81, having a rectangular opening 91a on each intersection of the grid beam-like insulator 200 (FIGS. 11A and 11B). The opening 91a is formed into a rectangle of 300 nm in long side and 200 nm in short side, for example.

Figure 12A:
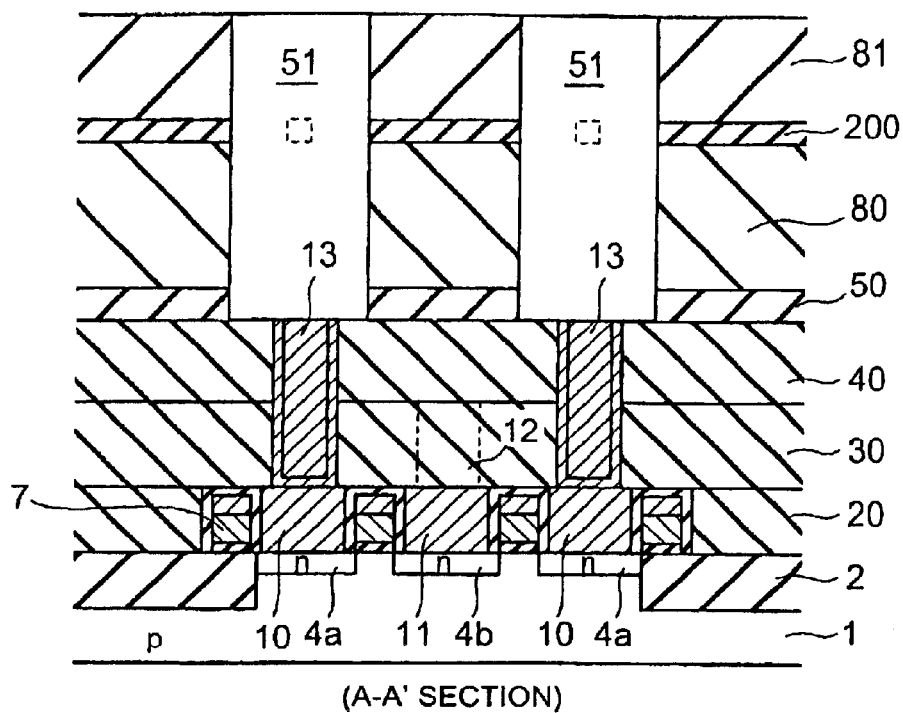
FIGS. 12A and 12B are sectional view taken on line A–A' of FIG. 1, illustrating production steps in the method of producing the semiconductor memory according to the first embodiment of the present invention.

The second dummy insulating film 81, the intersections of the beam-like insulator 200, the first dummy insulating film 80 and the insulator mount 50 are successively etched by dry etching while masked by the grid-like photoresist pattern 91, to provide through holes 51 through which the capacitor contact plugs 13 are exposed, followed by removal of the pattern 91 (FIG. 12A).

A first conductive film to become the capacitor lower electrodes 61 is formed on the inner wall of the through holes 51, and the surfaces of the second dummy insulating film 81 between the holes 51 and the capacitor contact plugs 13. For example, a Ru film of about 30 nm in thickness is formed as the lower electrodes. The lower electrodes 61 may be of another conductive film such as a Pt film and TiN film.

Figure 12B:
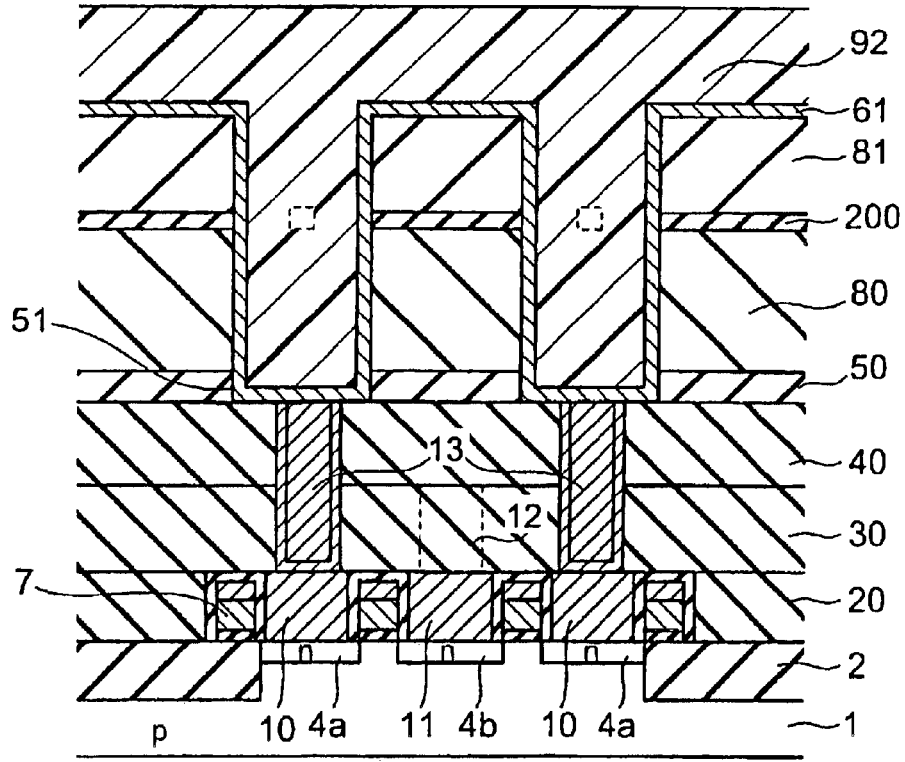

A photoresist 92 is deposited as having a thickness so that the through holes 51 can be completely filled with the photoresist (FIG. 12B). The photoresist 92 is then etched back by dry etching, thus the through holes 51 being filled with the photoresist.

Figure 13:
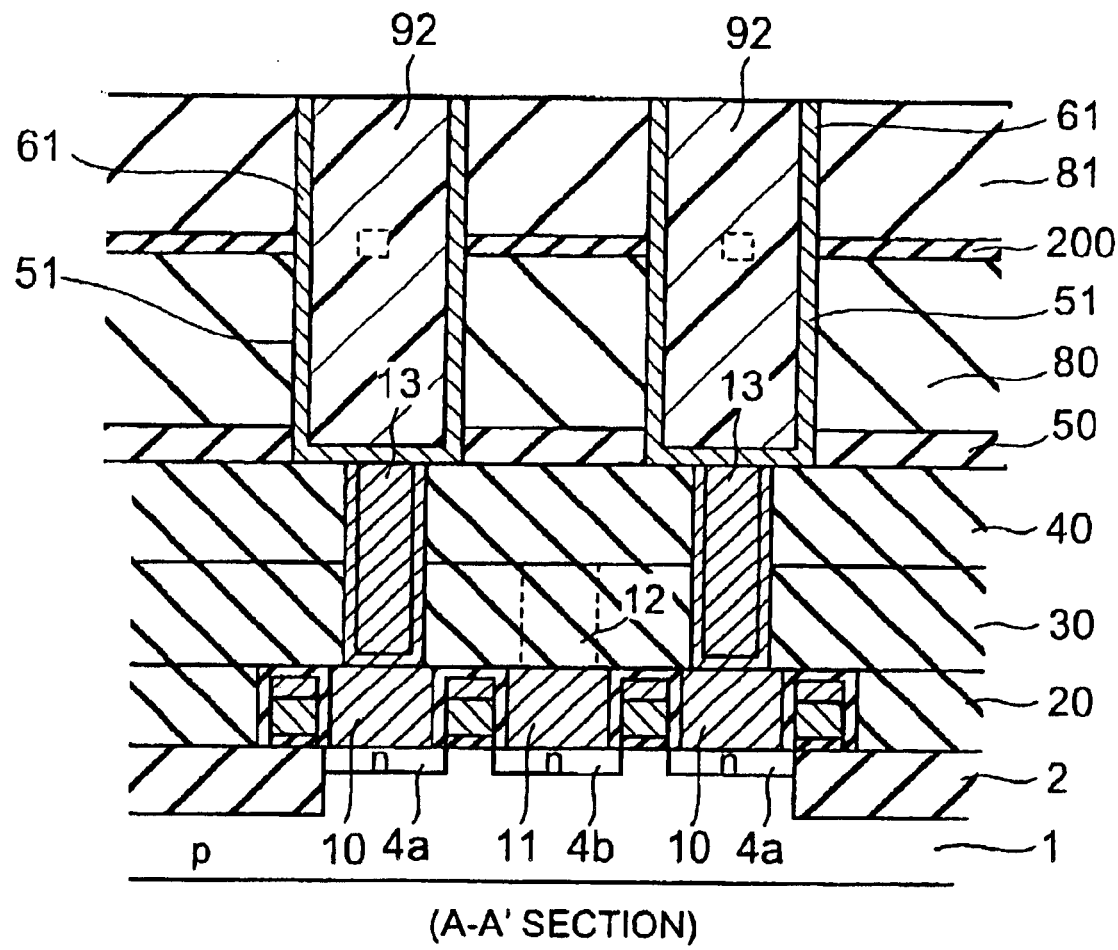
FIG. 13 is a sectional view taken on line A–A' of FIG. 1, illustrating production steps in the method of producing the semiconductor memory according to the first embodiment of the present invention.

The lower-electrode portion formed on the second dummy insulating film 81 between the through holes 51 is removed, for example, by CMP and RIE (Reactive Ion Etching), thus the lower electrodes 61 being electrically separated from each other (FIG. 13).

The photoresist 92 in each through hole 51 is removed by a solvent, such as, thinner. Thinner is the best choice for selective removal of the photoresist 92 with no damages to the second dummy insulating film 81 and the lower electrodes 61.

The second and the first dummy insulating films 81 and 80 between the through holes 51 are removed by a hydrofluoric-acid aqueous solution, thus the rectangular lower electrodes 61 are supported at their bottom by the insulator mounts 50. The adjacent lower electrodes 61 are supported as joined to each other via the grid beam-like insulators 200 connected to them on their facing surfaces, for example, in the middle section between the insulator mounts 50 and the upper lower-electrode portions (FIGS. 14A and 14B).

A dielectric film 62 is formed to cover the lower-electrodes 61 on their inner and outer walls. In detail, an about 10 nm-thick $Ta_2O_5$ film, for example, is deposited by CVD as the dielectric film, which corresponds to an about 1.3 nm-thick silicon oxide film. The film 62 may be of a highly dielectric film, such as, $SrBi_2Ta_2O_9$(SBT), $BaSrTiO_3$ (BST) and $Al_2O_3$.

A conductive film, such as, a Ru film is formed by CVD on the inner and the outside walls of each lower electrode 61 coated with the dielectric film 62 to form the upper electrode 63. The lower electrode 61, the dielectric film 62 and the upper electrode 63 constitute each capacitor 60 (FIGS. 15A and 15B).

Figure 16A:
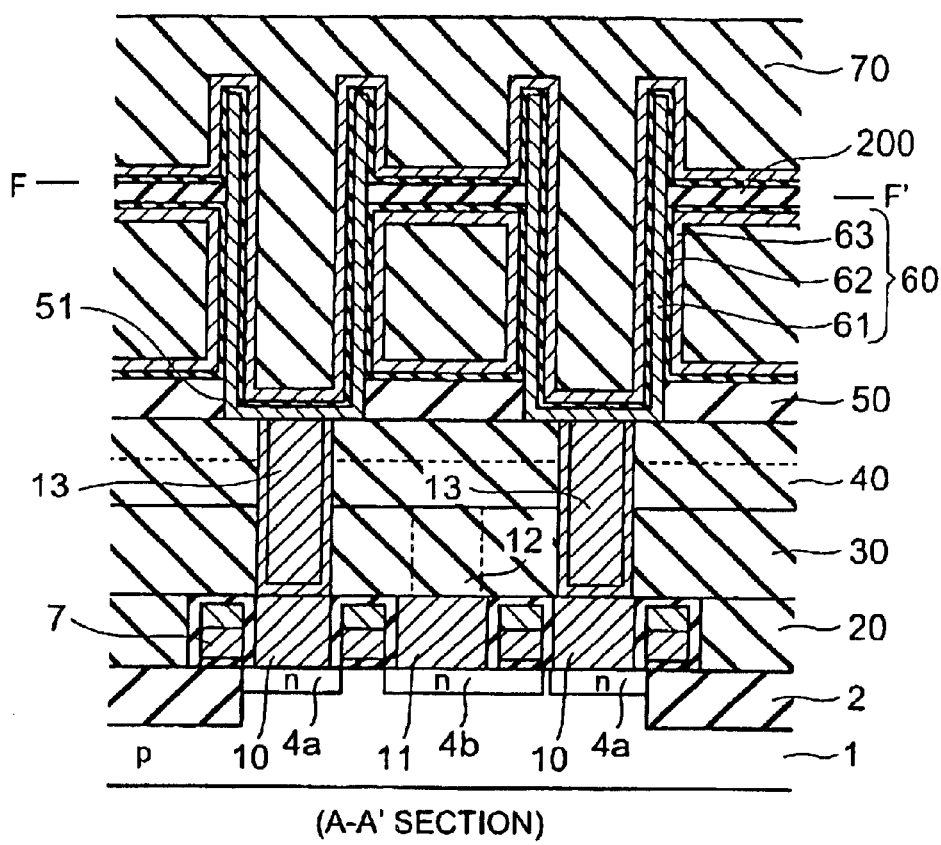
FIGS. 16A and 16B are views illustrating production steps in the method of producing the semiconductor memory according to the first embodiment of the present invention, FIG. 16A being a sectional view taken on line A–A' of FIG. 1, and FIG. 16B being a sectional view taken on line F–F' of FIG. 16A.
Figure 16B:
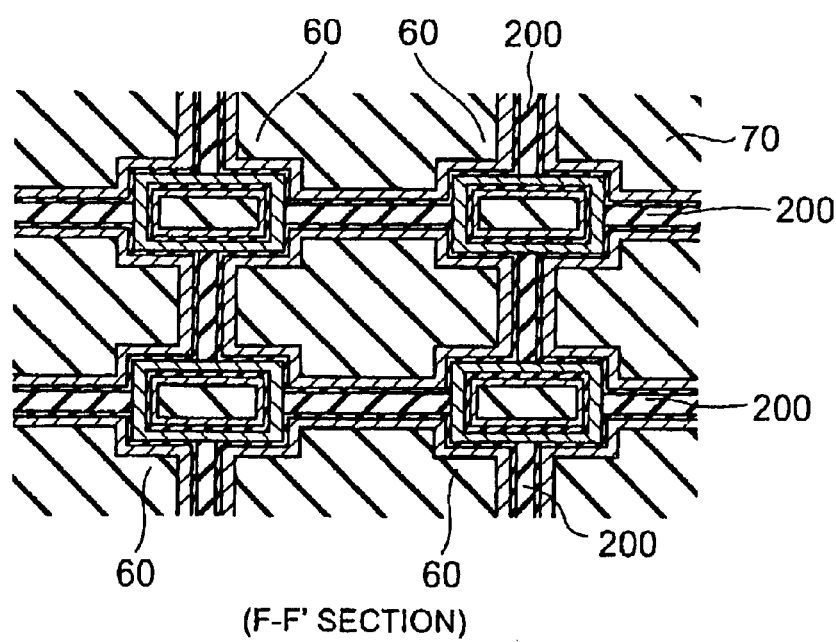

The insulating film 70 is deposited inside and outside the capacitors 60 and then another upper electrode and wirings are provided by known techniques on each capacitor 60 to constitute a memory cell having one transistor and one cylinder-type capacitor (FIGS. 16A and 16B).

The semiconductor memory in the first embodiment has the adjacent lower electrodes 61 supported as joined to each other via the rectangular beam-like insulators 200 connected to them on their facing surfaces between the insulator mounts 50 and the upper lower-electrode portions, for high mechanical strength. This structure serves to minimize the thickness of the insulator mounts 50.

Not only that, the adjacent lower electrodes 61 are joined to each other via the rectangular beam-like insulators 200 connected to them at small portions of their facing surfaces. This structure creates an extremely small area of connection that will not serve as a capacitor. The area that will not serve as a capacitor is called a void area hereinafter.

In the known technique, the void area given by the insulator mounts 50 is 300,000 $nm^2$ and the capacitance is 39.8 fF when each rectangular-cylinder type lower electrode 61 has about 300 nm in long side, about 200 nm in short side and about 1,000 nm in height, and each insulator mount 50 has about 300 nm in film thickness.

Compared to the known device, the semiconductor memory in the first embodiment has the thin insulator mounts 50 of about 200 nm in film thickness that give 200,000 $nm^2$ in void area. Moreover, a (50 nm×50 nm) section for each beam-like insulator 200 creates 2,500 $nm_2$ in void area. Four insulators 200 used for each capacitor then create 10,000 $nm^2$ in void area in total. The total void area given by the insulator mounts 50 and the beam-like insulators 200 is thus 210,000 $nm^2$. The total void area is almost 30% decrease from the known device, thus the capacitance being 42.2 fF in the first embodiment, that is almost 6% increase from the known device.

The joint structure of the adjacent lower electrodes 61 via the beam-like insulators 200 offers a high mechanical strength to each lower electrode 61, thus achieving tall lower-electrode structure with large capacitance.

Moreover, the method of producing the memory cell in the first embodiment has the following advantages:

In known devices, the lower electrodes 61 are thin in film thickness such as 30 nm and hence mechanically weak.

Contrary to this, in the first embodiment, the adjacent lower electrodes 61 are supported as joined to each other via the rectangular beam-like insulators 200 connected to them on their facing surfaces between the insulator mounts 50 and the upper lower-electrode portions, for high mechanical strength, followed by selective etching to the second dummy insulating film and then the first dummy insulating film between the lower electrodes, photoresist removal from the inner wall of each lower electrode, dielectric-film and upper-electrode formation on each lower electrode, and insulator filling in the inside and outside walls of capacitors. These successive processes protect the lower electrodes from falling down and hence achieve high yields.

(Second Embodiment)

Figure 17:
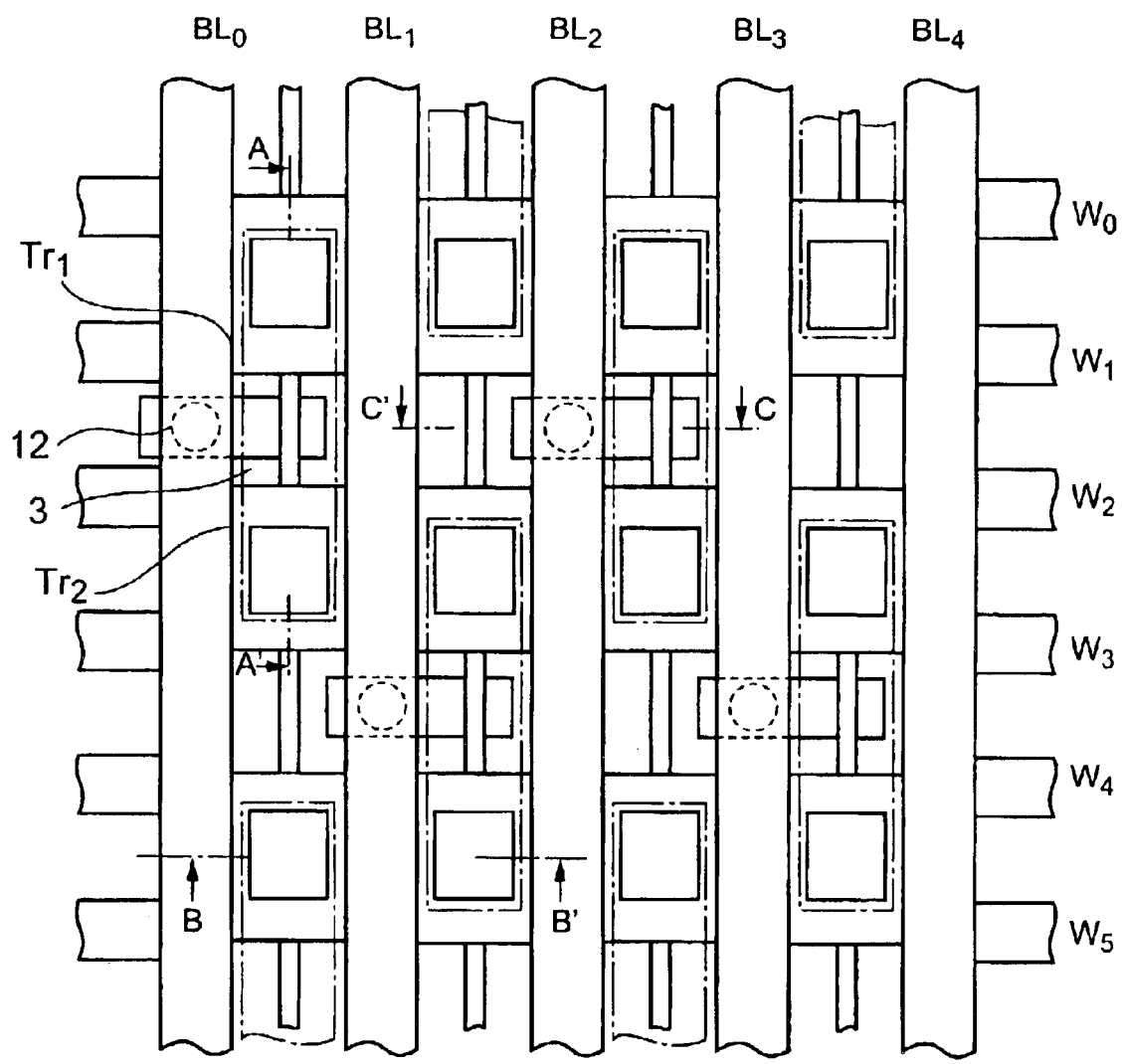
FIG. 17 is a schematic plan view showing a structure of a semiconductor memory according to a second embodiment of the present invention.

Disclosed next with reference to FIGS. 17 to 24B, are a semiconductor memory and its production method according to a second embodiment of the present invention. FIG. 17 is a schematic plan view showing a structure of the semiconductor memory according to the second embodiment of the present invention. Elements in FIGS. 17 to 24B that are the same as or analogous to the elements in the first embodiment are referenced by the same reference numbers and will not be explained in detail.

Figure 18A:
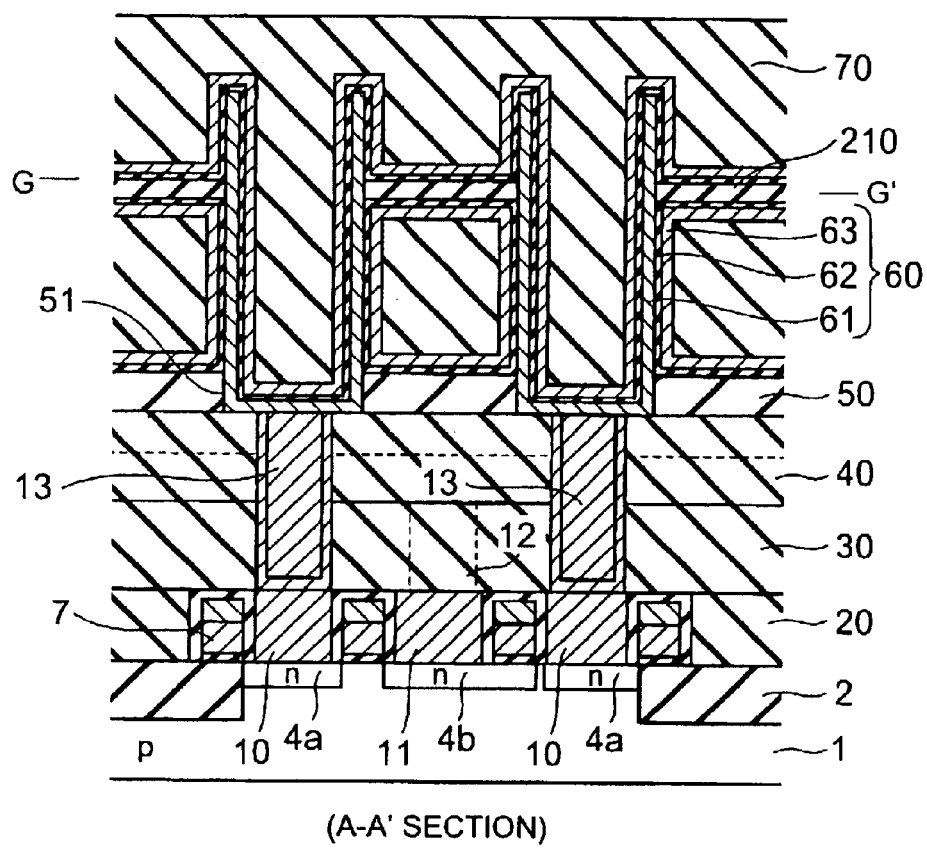
FIGS. 18A and 18B are views showing the structure of the semiconductor memory according to the second embodiment of the present invention, FIG. 18A being a sectional view taken on line A–A' of FIG. 17, and FIG. 18B being a sectional view taken on line G–G' of FIG. 18A.
Figure 18B:
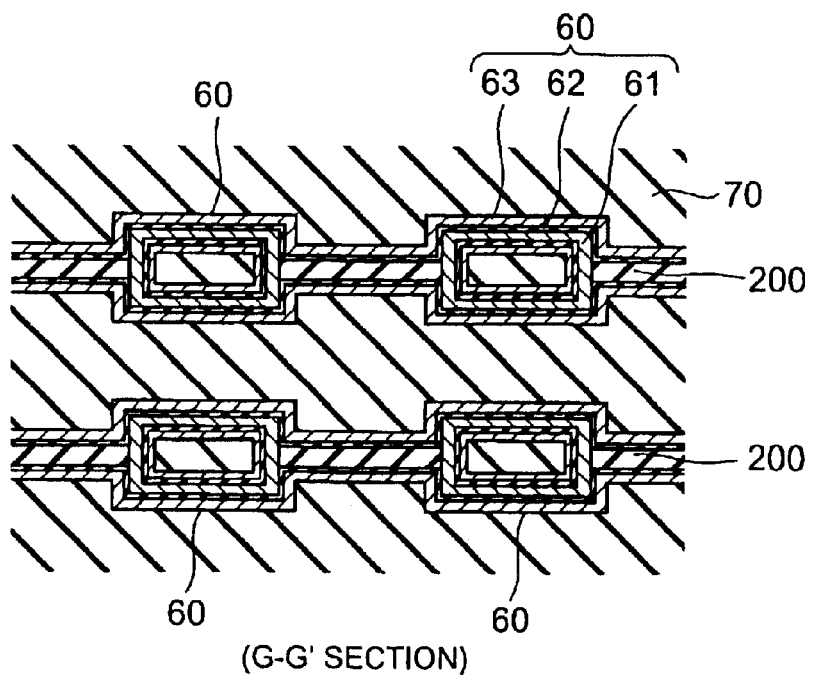

FIGS. 18A, 18B are views showing the structure of the semiconductor memory according to the second embodiment. In detail, FIG. 18A is a sectional view taken on line A–A' of FIG. 17 while FIG. 18B a plan view taken on line G–G' of FIG. 18A.

As shown in FIGS. 18A and 18B, the semiconductor memory according to the second embodiment has beam-like insulators 210 provided between lower electrodes 61 aligned only in a specific direction, for example, a column direction (left and right, or transversal direction in FIGS. 18A and 18B) among several lower electrodes 61 arranged into a grid. The adjacent lower electrodes 61 are supported as joined to each other via the beam-like insulators 210 connected to them at portions on their facing surfaces between the insulator mounts 50 and the upper lower-electrode portions. The other structure is identical to the first embodiment.

Figure 24A:
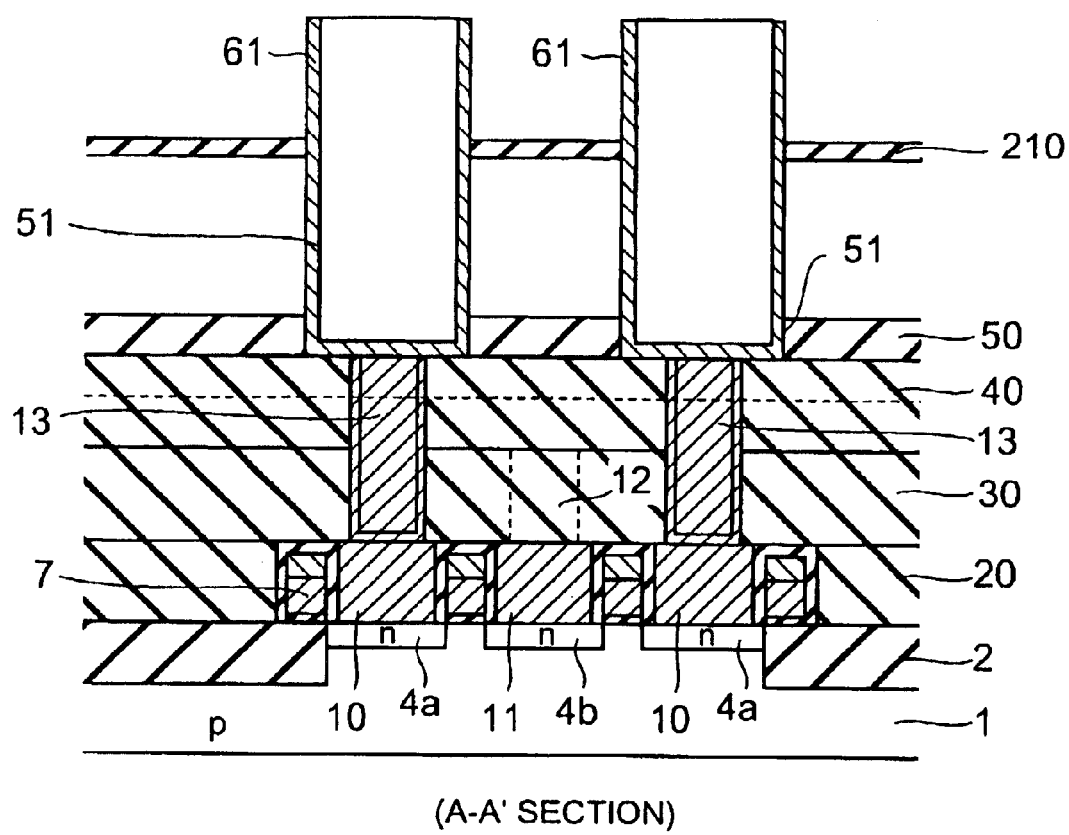
FIGS. 24A and 24B are views illustrating production steps in the method of producing the semiconductor memory according to the second embodiment of the present invention, FIG. 24A being a sectional view taken on line A–A' of FIG. 17, and FIG. 24B being a plan view for FIG. 24A.
Figure 24B:
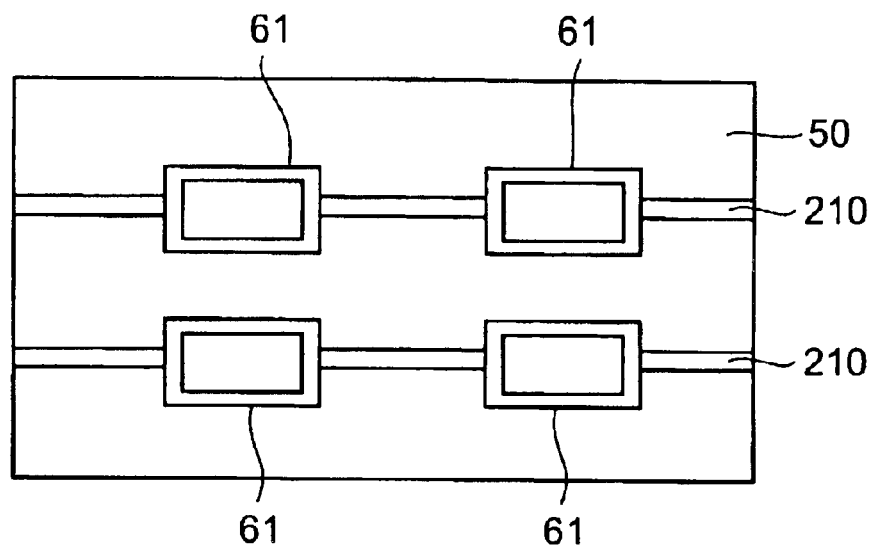

Disclosed next with reference to FIGS. 19 to 24B is a method of producing the semiconductor memory in the second embodiment. FIGS. 19 to 24B are views illustrating production steps: FIGS. 19, 20A, 21A, 22A, 22B, 23 and 24A are sectional views taken on line A–A' of FIG. 17; and FIGS. 20B, 21B and 24B are plan views for FIGS. 20A, 21A and 24A, respectively.

The processes from the beginning to forming the capacitor contact plugs 13 in the production method of the second embodiment shown in FIGS. 19 to 24B are identical to those in the production method of the first embodiment shown in FIGS. 4A to 8B.

The insulator mount 50 to be used for supporting capacitor lower electrodes is then deposited on the third interlayer insulating film 40 having the buried capacitor contact plugs 13. For example, a silicon nitride film of about 200 nm in thickness is deposited by LP-CVD as the insulator mount 50. The insulator mount 50 will work as an etching stopper in a later step.

The first dummy insulating film 80 made of a material exhibiting an etching property different from the insulator mount 50 is formed thereon. For example, an about 500 nm-thick silicon oxide film is deposited on the insulator mount 50, by LP-CVD, as the first dummy insulating film 80. An oxide film, such as, a BPSG film doped with impurities or an undoped oxide film may be used as the first dummy insulating film 80.

Figure 19:
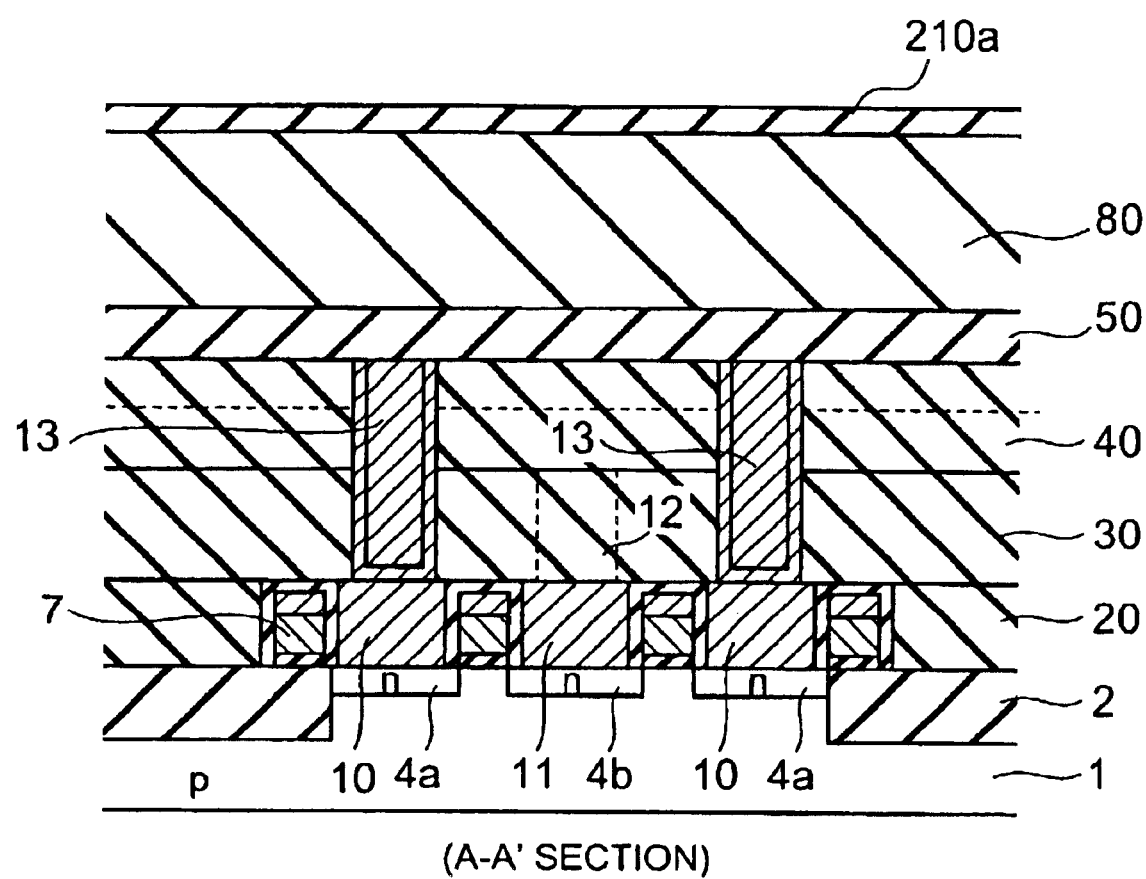
FIG. 19 is a sectional view taken on line A–A' of FIG. 17, illustrating production steps in a method of producing the semiconductor memory according to the second embodiment of the present invention.

The first dummy insulating film 80 is polished by CMP and, for example, an about 50 nm-thick silicon nitride film is deposited thereon by LP-CVD to form an insulating film 210a to be used for forming beam-like insulators that will connect stacked capacitors (FIG. 19).

The insulating film 210a may be an insulating film exhibiting an etching property different from the first dummy insulating film 80. A good choice for the film 210a, in addition to the silicon nitride film is, for example, a TaO film, an $Al_2O_3$ film, a BST film, an STO film a BTO film, a PZT film and an SBT film.

Figure 20A:
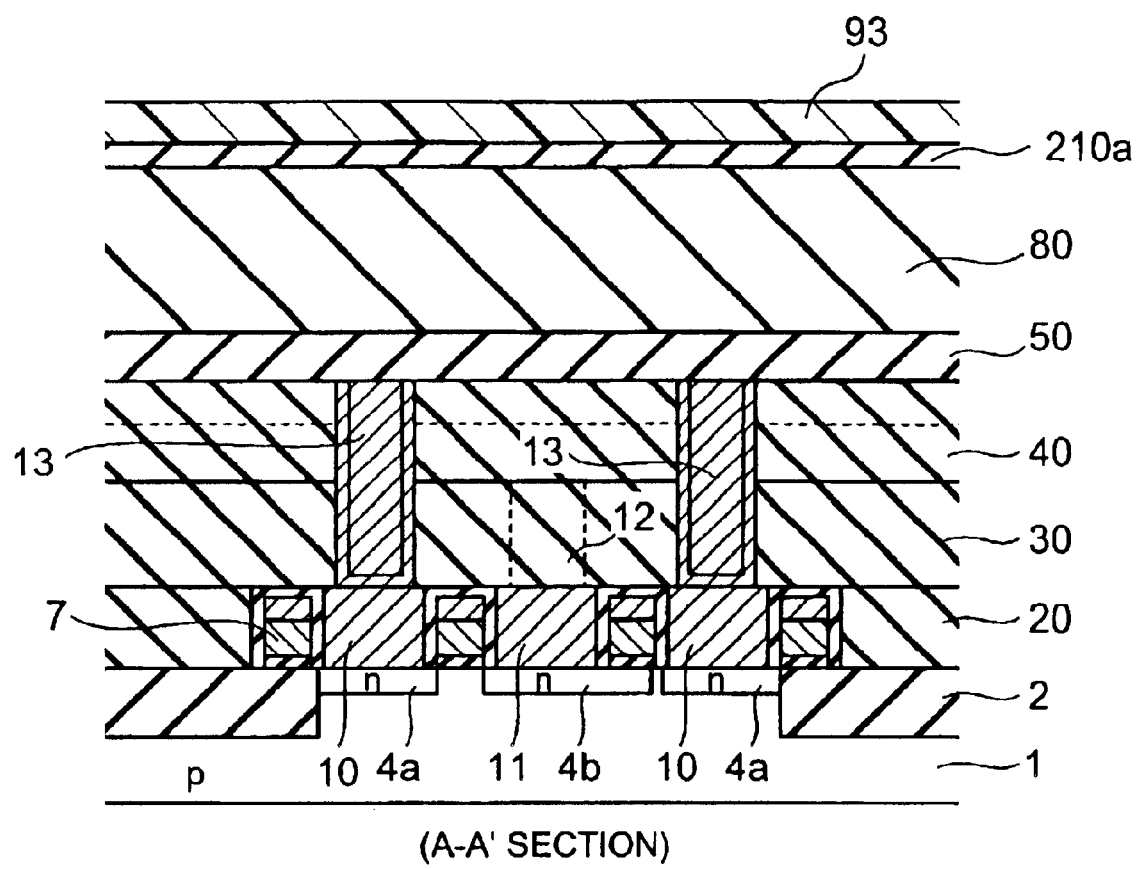
FIGS. 20A and 20B are views illustrating production steps in the method of producing the semiconductor memory according to the second embodiment of the present invention, FIG. 20A being a sectional view taken on line A–A' of FIG. 17, and FIG. 20B being a plan view for FIG. 20A.
Figure 20B:
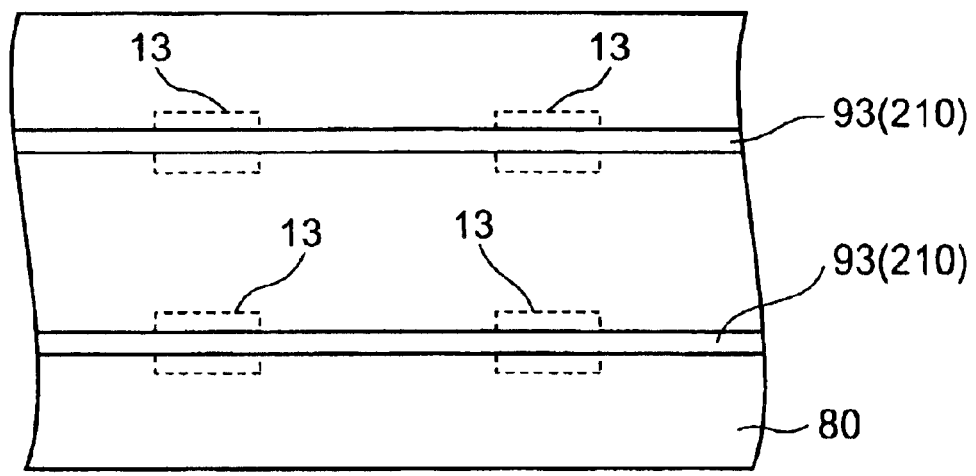

A fine straight photoresist pattern 93 of, for example, about 50 nm in width is then formed on the insulating film 210a in the column direction. The film 210a is etched by dry etching while masked by the pattern 93 to form straight beam-like insulators 210 such that each beam-like insulator traverses the capacitor contact plugs 13 aligned in the column direction among the plugs 13 arranged in a grid (FIGS. 20A and 20B).

Like the step shown in FIG. 11A in the first embodiment, after the photoresist pattern 93 is removed, the second dummy insulating film 81 is formed over the first dummy insulating film 80 via the beam-like insulator 210. The second dummy insulating film 81 may be an about 500 nm-thick silicon oxide film deposited by CVD. A better choice for the second film 81 is an insulating film exhibiting an etching property almost the same as the first film 80 but different from the beam-like insulators 210, for example, an impurity-doped silicon oxide film such as a BPSG film or a nondoped silicon oxide film.

Figure 21A:
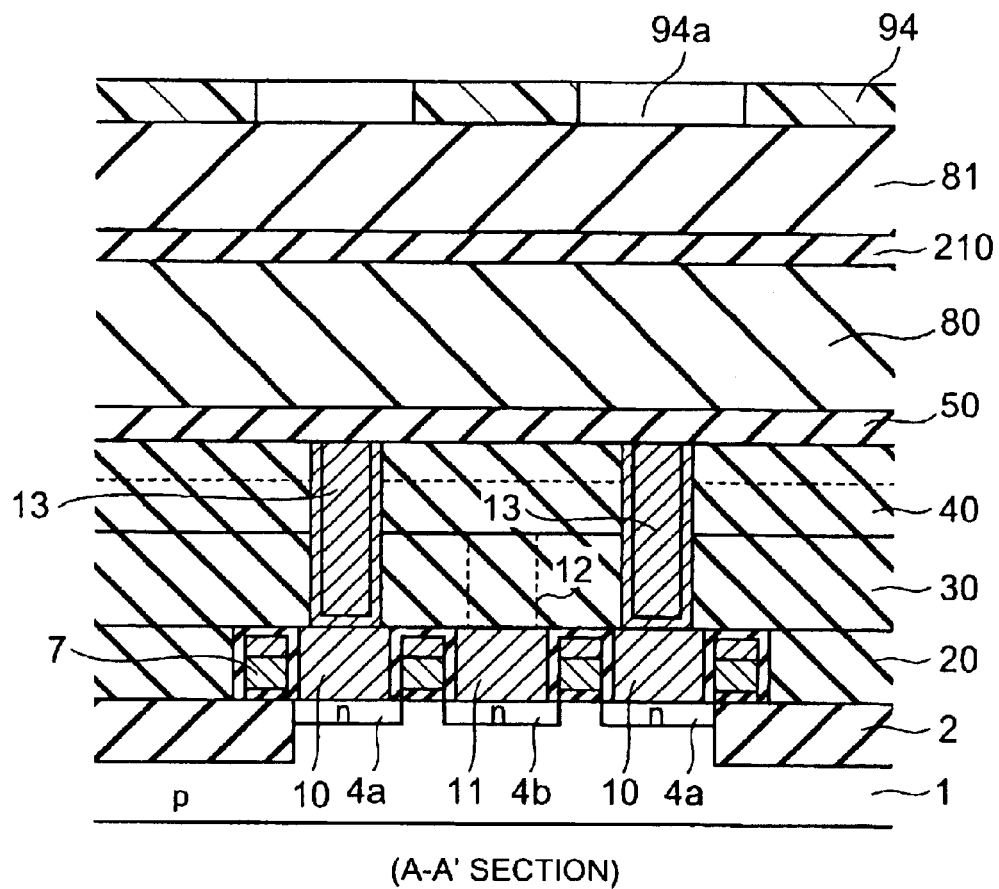
FIGS. 21A and 21B are views illustrating production steps in the method of producing the semiconductor memory according to the second embodiment of the present invention, FIG. 21A being a sectional view taken on line A–A' of FIG. 17, and FIG. 21B being a plan view for FIG. 21A.
Figure 21B:
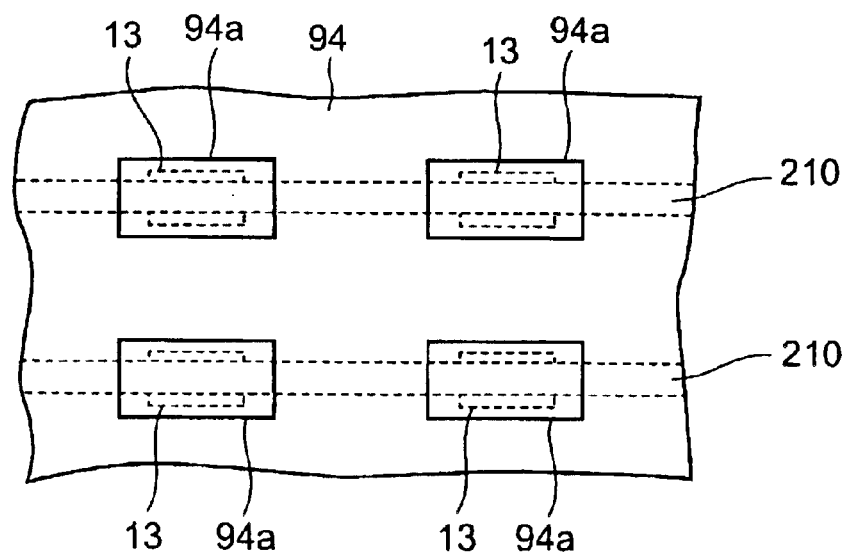

A grid photoresist pattern 94 having rectangular openings 94a is formed on the second dummy insulating film 81 (FIGS. 21A and 21B). Each opening 94a is formed into a rectangle of 300 nm in long side and 200 nm in short side, for example.

Figure 22A:
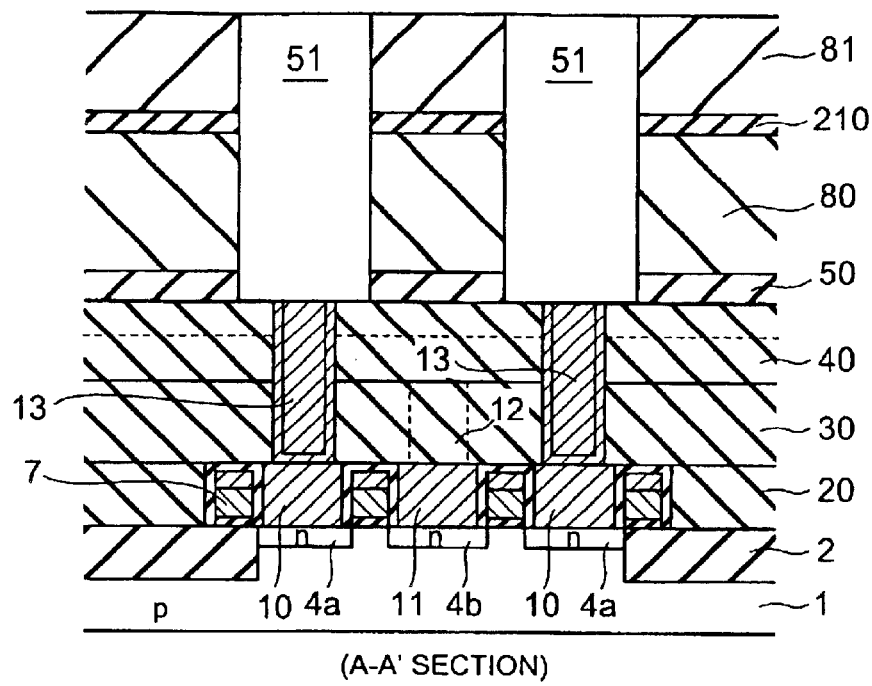
FIGS. 22A and 22B are sectional views taken on line A–A' of FIG. 17, illustrating production steps in the method of producing the semiconductor memory according to the second embodiment of the present invention.

Like the step in FIG. 12 in the first embodiment, the second dummy insulating film 81, the portions of the beam-like insulators 210 located above the capacitor contact plugs 13, the first dummy insulating film 80 and the insulator mount 50 are successively etched by dry etching while masked by the photoresist pattern 94, to provide the through holes 51 through which the capacitor contact plugs 13 are exposed (FIG. 22A).

Figure 22B:
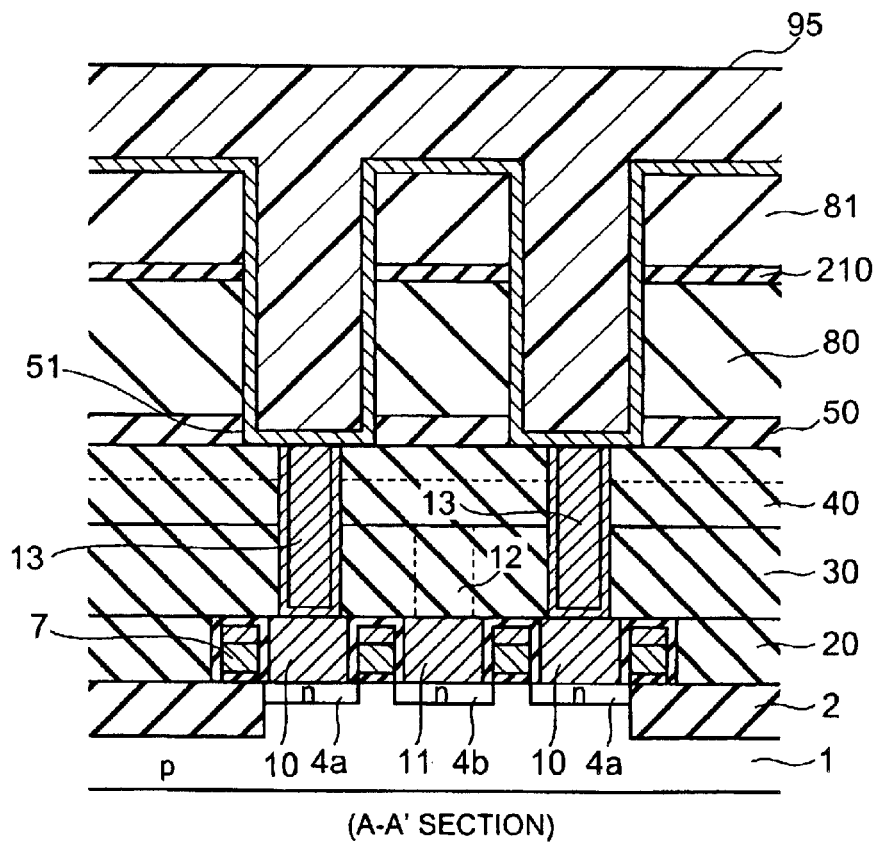
Figure 23:
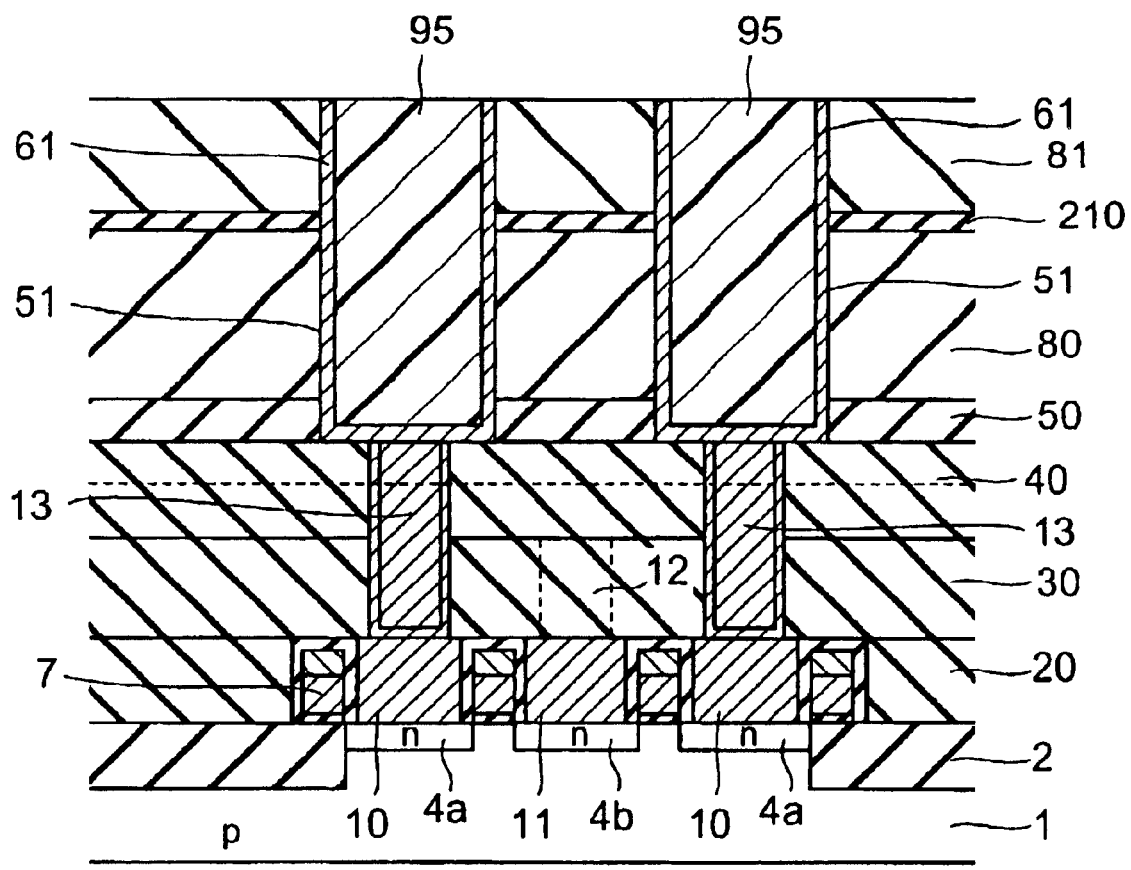
FIG. 23 is a sectional view taken on line A–A' of FIG. 17, illustrating production steps in the method of producing the semiconductor memory according to the second embodiment of the present invention.

Like the step shown in FIG. 12B in the first embodiment, a Ru film to become the capacitor lower electrodes 61 is formed, for example, at 30 nm in film thickness by CVD, on the inner wall of the through holes 51, and the surfaces of the second dummy insulating film 81 between the holes 51 and the capacitor contact plugs 13. A photoresist 95 is deposited as having a thickness so that the through holes 51 can be completely filled with the photoresist (FIG. 22B).

The lower-electrode portion formed on the second dummy insulating film 81 between the through holes 51 is removed, for example, by CMP and RIE after the photoresist 95 is etched back, thus, the lower electrodes 61 being electrically separated from each other (FIG. 23), like the step in FIG. 13 in the first embodiment.

The photoresist 95 in each through hole 51 is removed by a solvent, such as, thinner, like the step in FIG. 14A in the first embodiment. Thinner is the best choice for selective removal of the photoresist 95 with no damages to the second dummy insulating film 81 and the lower electrodes 61.

The second and the first dummy insulating films 81 and 80 between the through holes 51 are removed by a hydrofluoric-acid aqueous solution, thus the rectangular lower electrodes 61 are supported at their bottoms by the insulator mounts 50. The capacitor lower electrodes 61 adjacent in a specific direction are supported as joined to each other via the beam-like insulators 210 between the insulator mounts 50 and the upper lower-electrode portions (FIGS. 24A and 24B).

Like the steps shown from FIG. 15A in the first embodiment, a dielectric film is formed, upper electrodes are formed, an insulating film is buried in the inside and the outside walls of capacitors and wirings are formed to finish memory cells having transistors and cylinder-type capacitors, such as shown in FIGS. 18A and 18B.

In the semiconductor memory in the second embodiment, the capacitor lower electrodes 61 adjacent in a specific direction are supported as joined to each other via the beam-like insulators 210 connected to them between the insulator mounts 50 and the upper lower-electrode portions, for high mechanical strength. Therefore, like the first embodiment, the second embodiment achieves increase in capacitance, or large capacitance. Especially, in the second embodiment, each lower electrode is connected, only at two outer surfaces, to the beam-like insulators, thus offering capacitance larger than the first embodiment.

Moreover, the lower electrodes are protected from falling down like the first embodiment, thus the second embodiment also achieves high yields.

(Third Embodiment)

Figure 25:
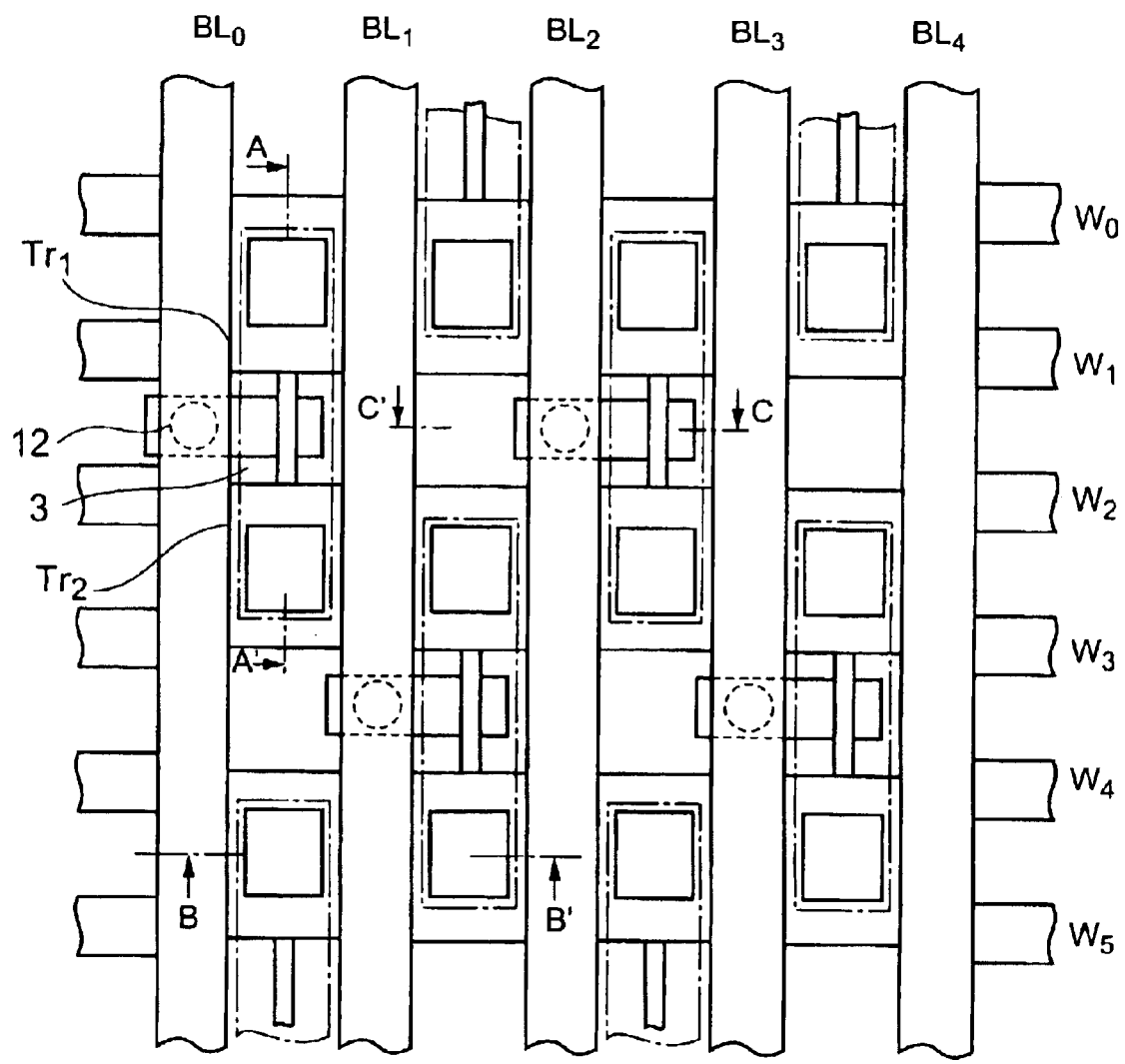
FIG. 25 is a schematic plan view showing a structure of a semiconductor memory according to a third embodiment of the present invention.

Disclosed next with reference to FIGS. 25 to 32B are a semiconductor memory and its production method according to a third embodiment of the present invention. FIG. 25 is a schematic plan view showing a structure of the semiconductor memory according to the third embodiment of the present invention. Elements in FIGS. 26A to 32B that are the same as or analogous to the elements in the first embodiment are referenced by the same reference numbers and will not be explained in detail.

Figure 26A:
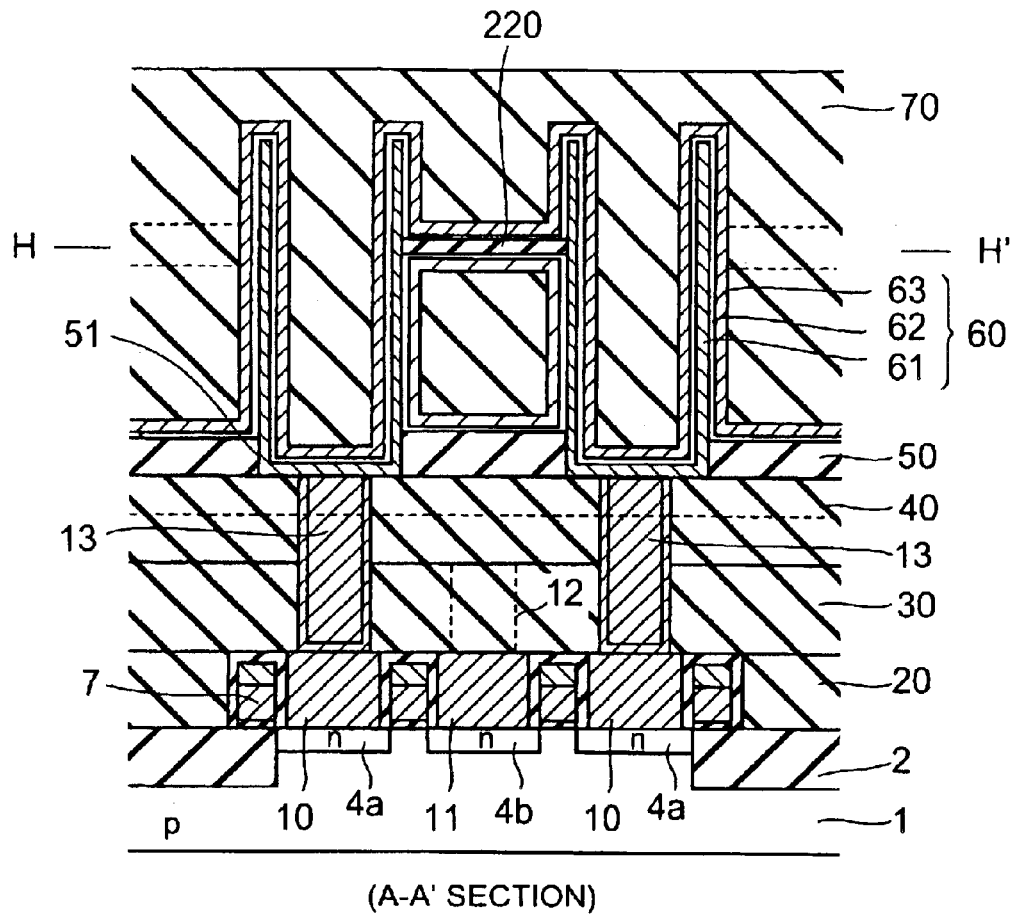
FIGS. 26A and 26B are views showing the structure of the semiconductor memory according to the third embodiment of the present invention, FIG. 26A being a sectional view taken on line A–A' of FIG. 25, and FIG. 26B being a sectional view taken on line H–H' of FIG. 26A.
Figure 26B:
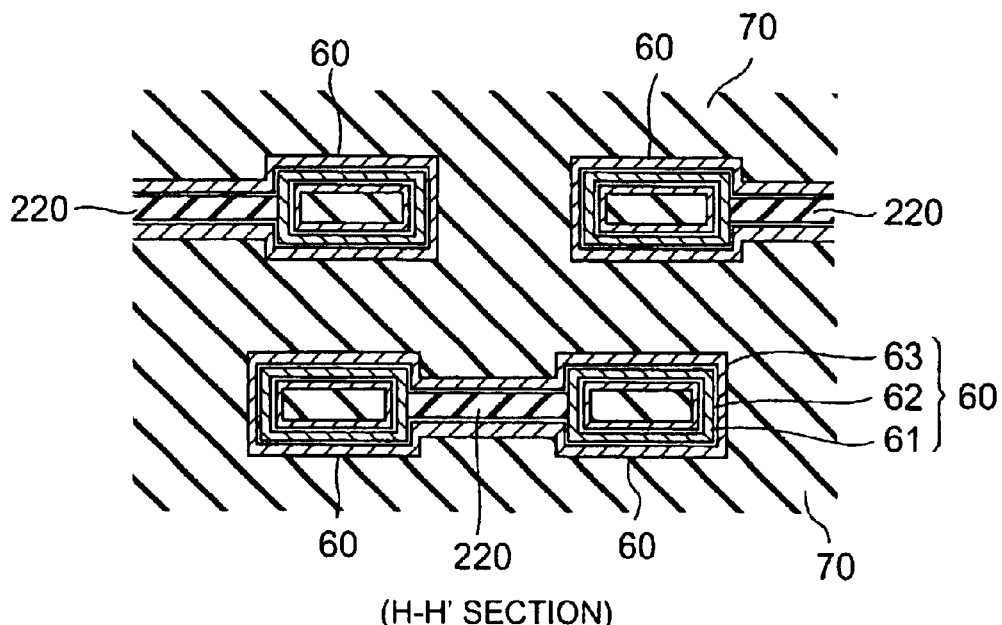

FIGS. 26A and 26B are views of the semiconductor memory in the third embodiment. In detail, FIG. 26A is a sectional view taken on line A–A' of FIG. 25 while FIG. 26B is a sectional view taken on line H–H' of FIG. 26A.

As shown in FIGS. 26A and 26B, the semiconductor memory in the third embodiment has several pairs of two adjacent lower electrodes 61 in a specific direction, for example, a column direction. A beam-like insulator 220 is provided between the lower electrodes 61 of each pair, not between adjacent pairs. The adjacent lower electrodes 61 in each pair are supported as joined to each other via the beam-like insulator 220 connected to them at portions on their facing surfaces between the insulator mounts 50 and the upper lower-electrode portions. The other structure is identical to the first embodiment.

Figure 30A:
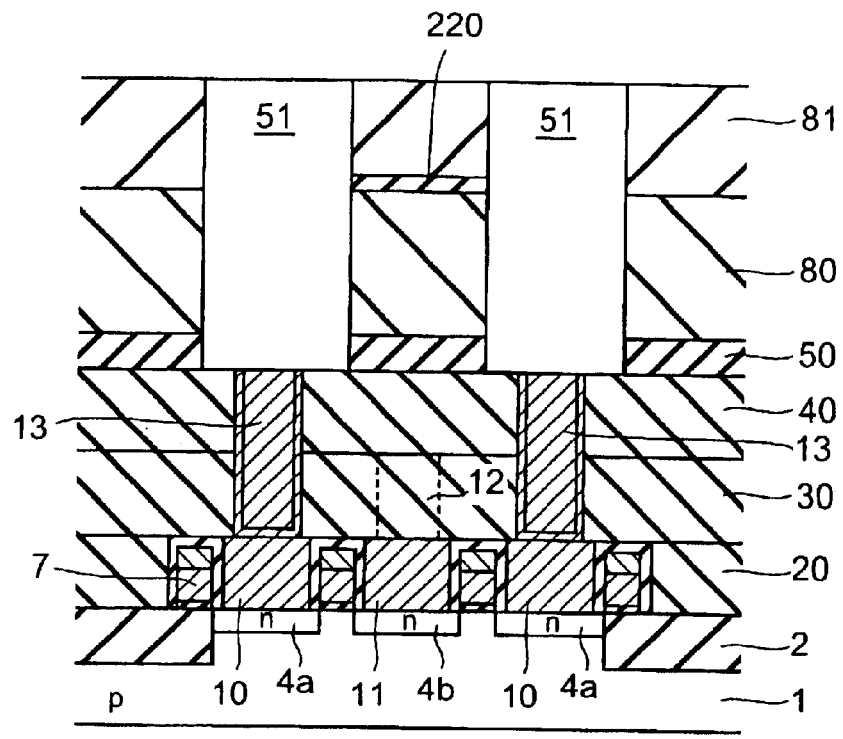
FIGS. 30A and 30B are views taken on line A–A' of FIG. 25, illustrating production steps in the method of producing the semiconductor memory according to the third embodiment of the present invention.
Figure 30B:
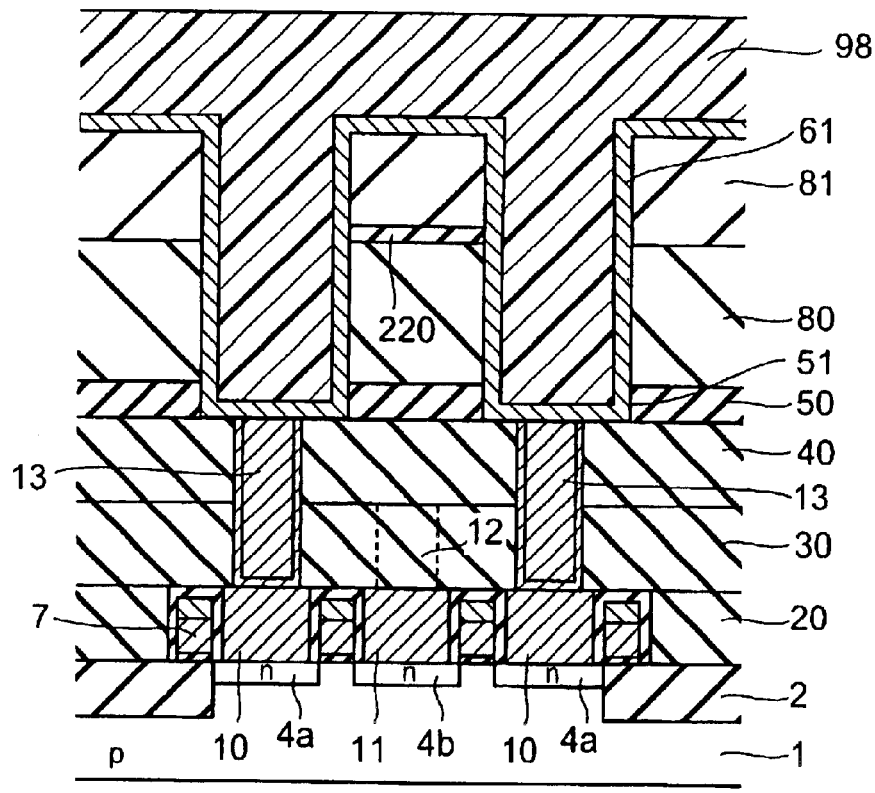
Figure 31:
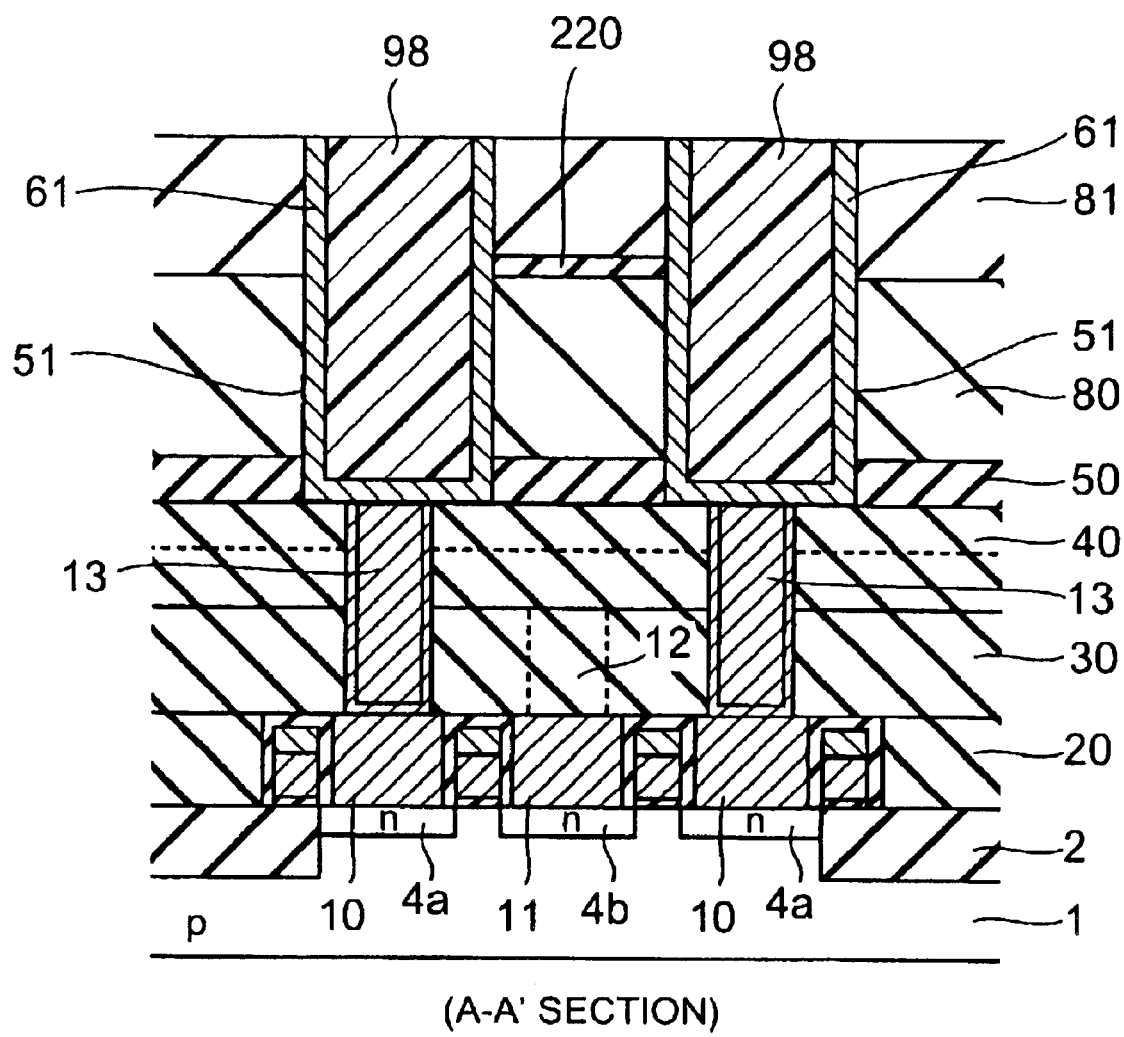
FIG. 31 is a sectional view taken on line A–A' of FIG. 25, illustrating production steps in the method of producing the semiconductor memory according to the third embodiment of the present invention.
Figure 32A:
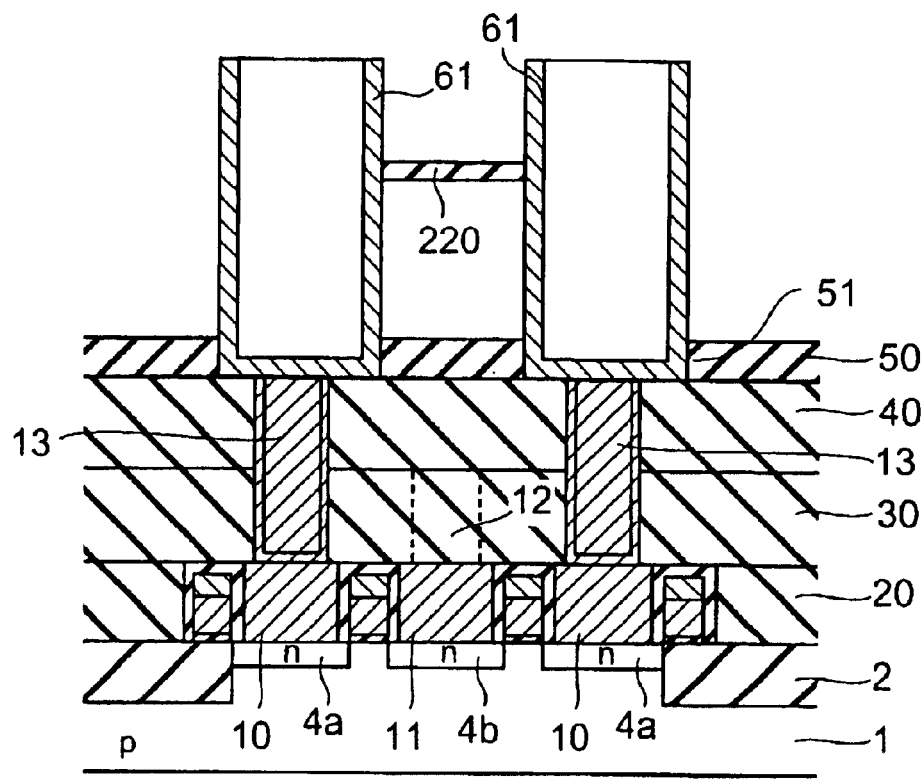
FIGS. 32A and 32B are views illustrating production steps in the method of producing the semiconductor memory according to the third embodiment of the present invention, FIG. 32A being a sectional view taken on line A–A' of FIG. 25, and FIG. 32B being a plan view for FIG. 32A.
Figure 32B:
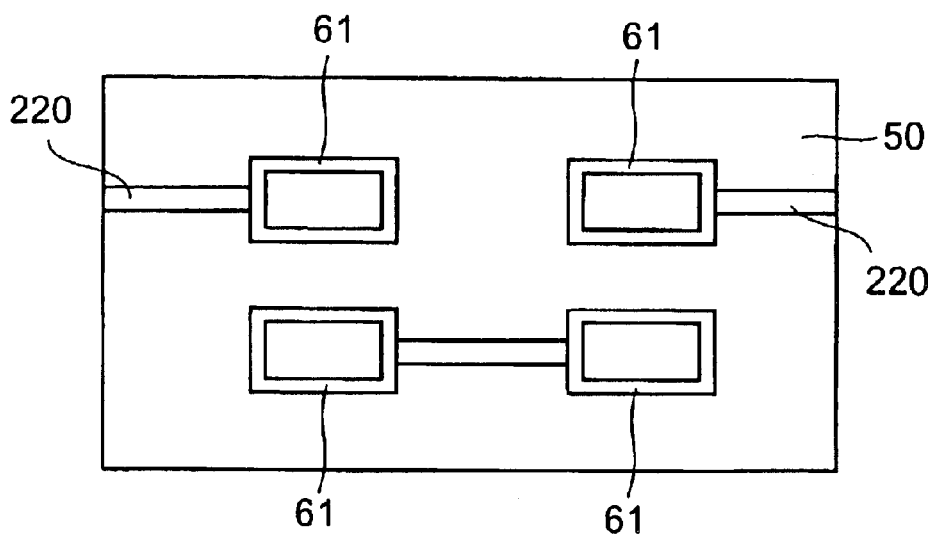

Disclosed next with reference to FIGS. 27 to 32B is a method of producing the semiconductor memory in the third embodiment. FIGS. 27 to 32B are views illustrating production steps: FIGS. 27, 28A, 29A, 30A, 30B, 31 and 32A are sectional views taken on line A–A' of FIG. 25; and FIGS. 28B, 29B and 32B are plan views for FIGS. 28A, 29A and 32A, respectively.

The processes from the beginning to forming the capacitor contact plugs 13 in the production method of the third embodiment shown in FIGS. 27 to 32B are identical to those in the production method of the first embodiment shown in FIGS. 4A to 8B.

The insulator mount 50 to be used for supporting capacitor lower electrodes is then deposited on the third interlayer insulating film 40 having the buried capacitor contact plugs 13. For example, a silicon nitride film of about 200 nm in thickness is deposited by LP-CVD as the insulator mount 50. The insulator mount 50 will work as an etching stopper in a later step.

The first dummy insulating film 80 made of a material exhibiting an etching property different from the insulator mount 50 is formed thereon. For example, an about 500 nm-thick silicon oxide film is deposited on the insulator mount 50, by LP-CVD, as the first dummy insulating film 80. An oxide film, such as, a BPSG film doped with impurities or an undoped oxide film may be used as the first dummy insulating film 80.

Figure 27:
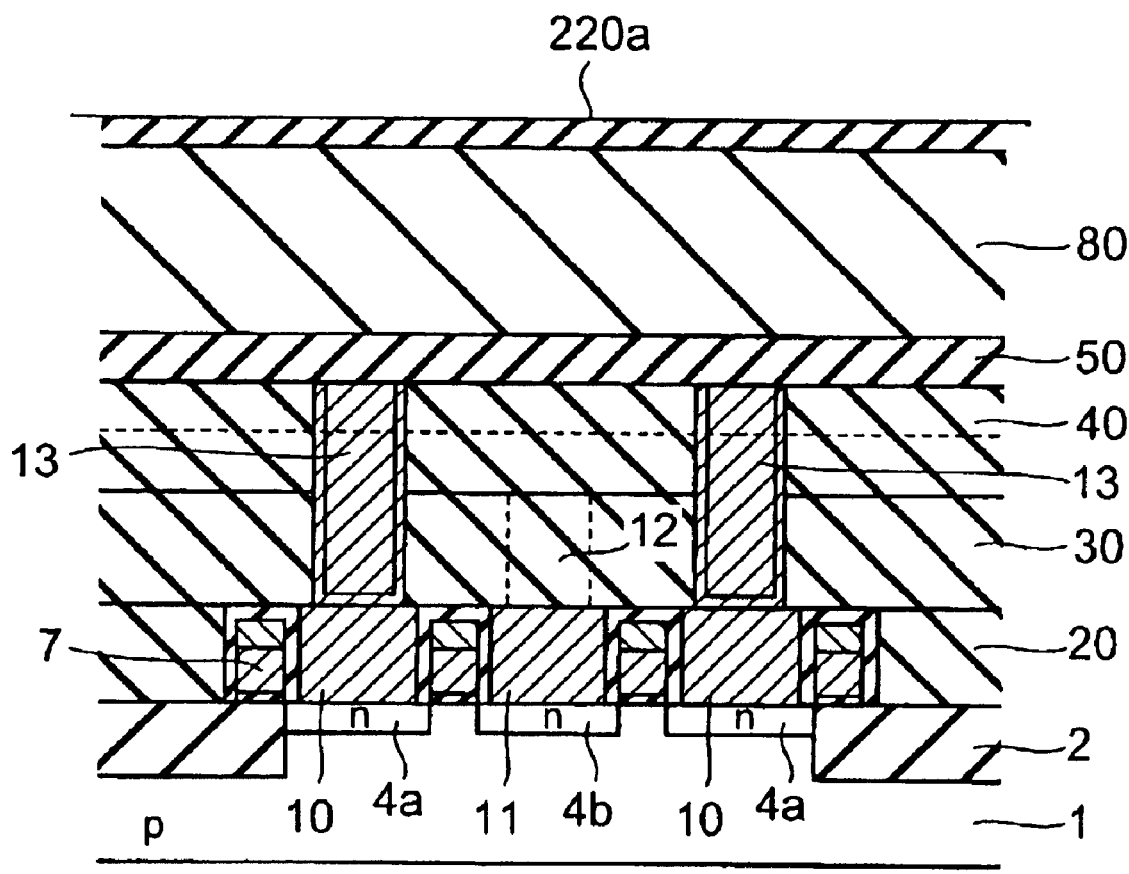
FIG. 27 is a sectional view taken on line A–A' of FIG. 25, illustrating production steps in a method of producing the semiconductor memory according to the third embodiment of the present invention.

The first dummy insulating film 80 is polished by CMP and, for example, an about 50 nm-thick silicon nitride film is deposited thereon by LP-CVD to form an insulating film 220a to be used for forming beam-like insulators that will connect stacked capacitors (FIG. 27).

The insulating film 220a may be an insulating film exhibiting an etching property different from the first dummy insulating film 80. A good choice for the film 210a, in addition to the silicon nitride film is, for example, a TaO film, an $Al_2O_3$ film, a BST film, an STO film a BTO film, a PZT film and an SBT film.

Figure 28A:
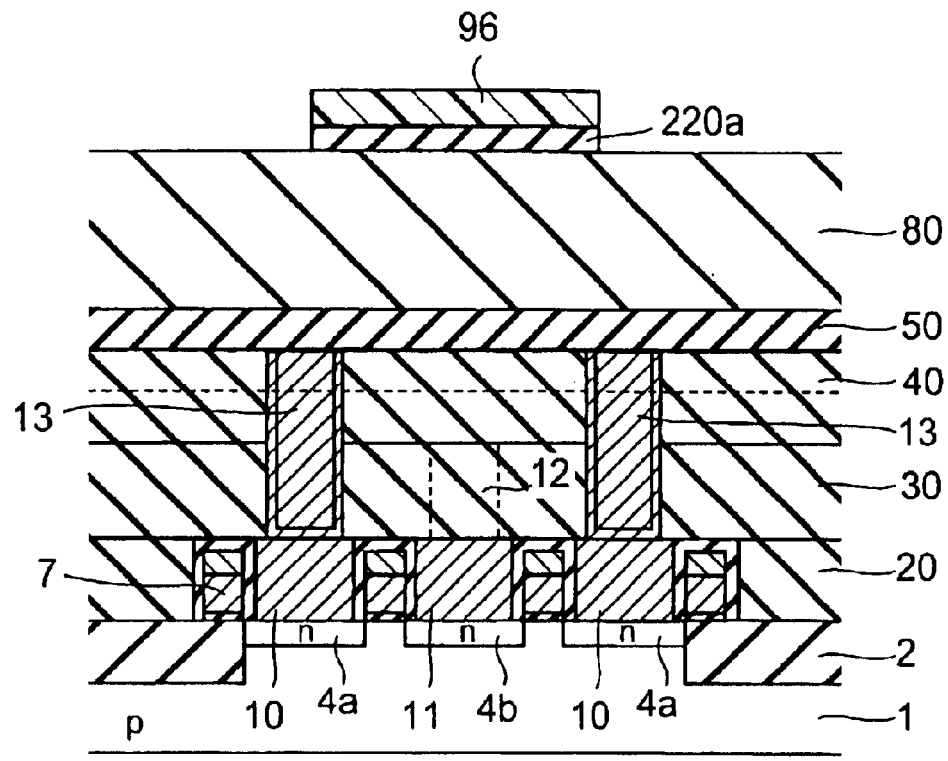
FIGS. 28A and 28B are views illustrating production steps in the method of producing the semiconductor memory according to the third embodiment of the present invention, FIG. 28A being a sectional view taken on line A–A' of FIG. 25, and FIG. 28B being a plan view for FIG. 28A.
Figure 28B:
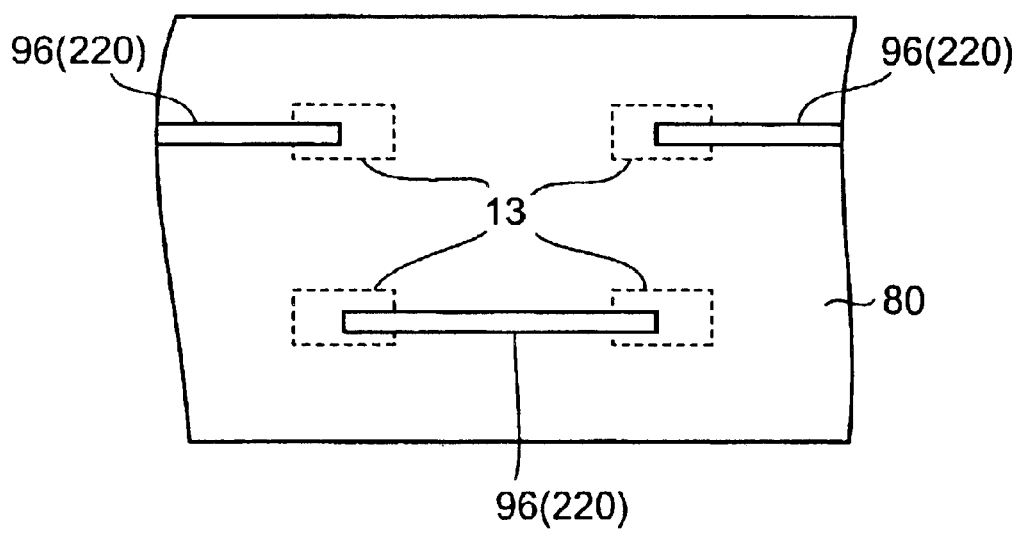

As shown in FIGS. 28A and 28B, fine straight photoresist patterns 96 of, for example, about 50 nm in width are formed on the insulating film 220a, with a specific interval in the column direction. In detail, the photoresist patterns 96 are provided on each row of the capacitor contact plugs 13 arranged in the column direction such that an upper edge of each pattern is located above the center of each plug 13. Moreover, each photoresist pattern 96 is provided only between the contact plugs 13 of each of several pairs aligned on the row direction, not between the plug pairs. Each straight photoresist pattern 96 is formed as having a length that reaches the contact plugs 13 of each pair.

The insulating film 220a is etched by dry etching while masked by the straight photoresist patterns 96 to form straight beam-like insulators 220 each reaching the capacitor contact plugs 13 of any pair on each row of the plugs 13 in the column direction (FIGS. 28A and 28B).

Like the step shown in FIG. 11A in the first embodiment, after the photoresist pattern 96 is removed, the second dummy insulating film 81 is formed over the first dummy insulating film 80 via the beam-like insulators 220. The second dummy insulating film 81 may be an about 500 nm-thick silicon oxide film deposited by CVD. A better choice for the second film 81 is an insulating film exhibiting an etching property almost the same as the first film 80 but different from the beam-like insulators 220, for example, an impurity-doped silicon oxide film such as a BPSG film or a nondoped silicon oxide film.

Figure 29A:
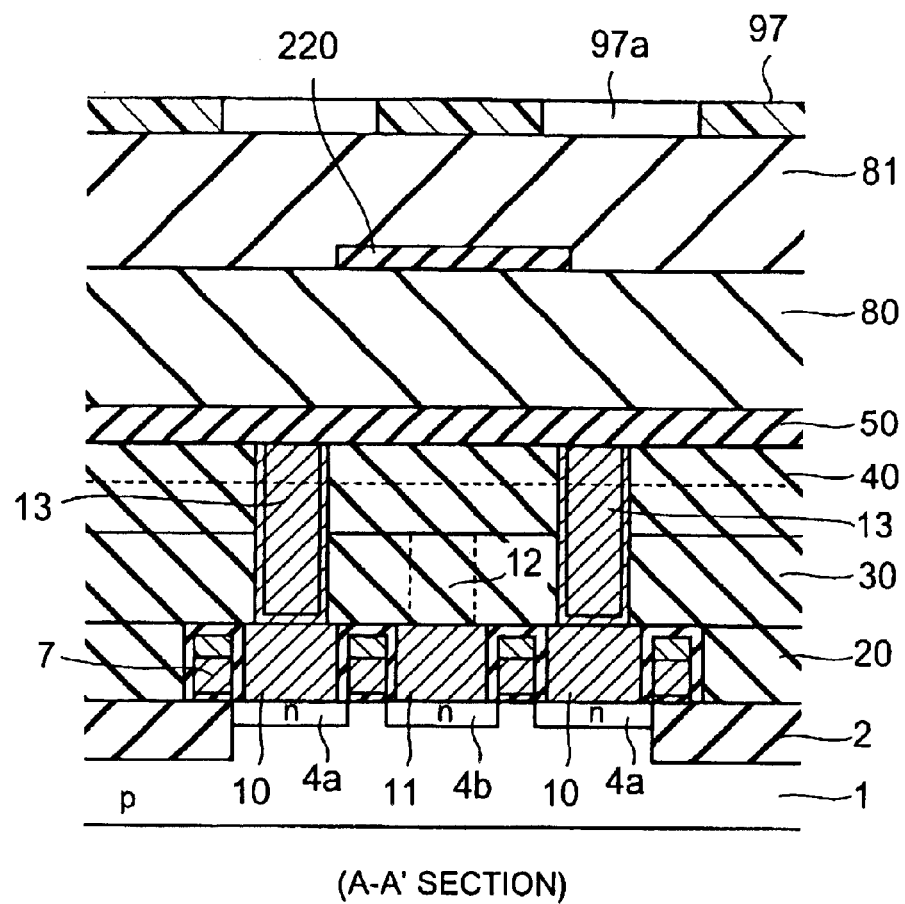
FIGS. 29A and 29B are views illustrating production steps in the method of producing the semiconductor memory according to the third embodiment of the present invention, FIG. 29A being a sectional view taken on line A–A' of FIG. 25, and FIG. 29B being a plan view for FIG. 29A.
Figure 29B:
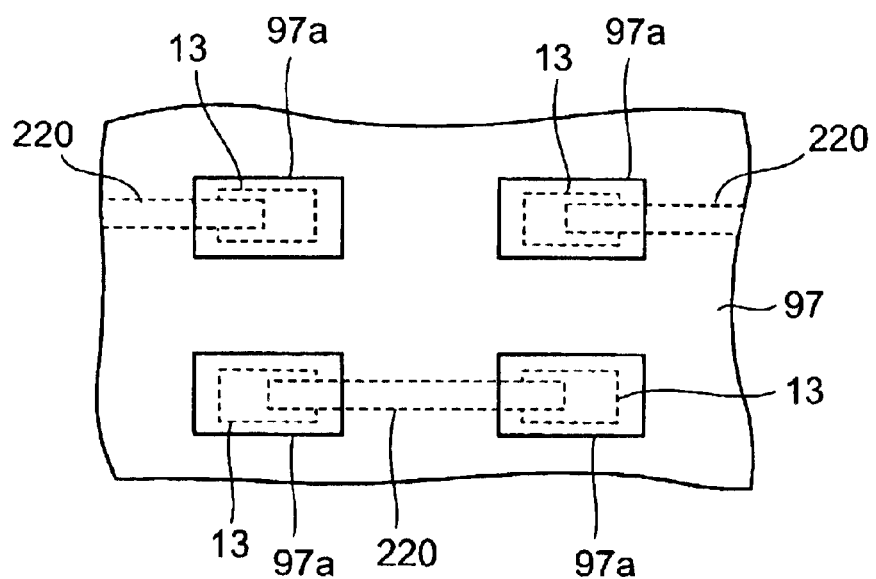

A grid photoresist pattern 97 having rectangular openings 97a is formed on the second dummy insulating film 81 (FIGS. 29A and 29B). Each opening 97a is formed into a rectangle of 300 nm in long side and 200 nm in short side, for example.

Like the step in FIG. 12A in the first embodiment, the second dummy insulating film 81, the portions of the beam-like insulators 220 located above the capacitor contact plugs 13, the first dummy insulating film 80 and the insulator mount 50 are successively etched by dry etching while masked by the photoresist pattern 97, to provide the through holes 51 through which the capacitor contact plugs 13 are exposed (FIG. 28A).

Like the step shown in FIG. 12B in the first embodiment, a Ru film to become the capacitor lower electrodes 61 is formed, for example, at 30 nm in film thickness by CVD, on the inner wall of the through holes 51, and the surfaces of the second dummy insulating film 81 between the holes 51 and the capacitor contact plugs 13. A photoresist 98 is deposited as having a thickness so that the through holes 51 can be completely filled with the photoresist (FIG. 30B).

The lower-electrode portion formed on the second dummy insulating film 81 between the through holes 51 is removed, for example, by CMP and RIE, after the photoresist 98 is etched back, thus the lower electrodes 61 being electrically separated from each other, like the step in FIG. 13 in the first embodiment (FIG. 31).

The photoresist 98 in each through hole 51 is removed by a solvent, such as, thinner, like the step in FIG. 14A in the first embodiment. Thinner is the best choice for selective removal of the photoresist 98 with no damages to the second dummy insulating film 81 and the lower electrodes 61.

The second and the first dummy insulating films 81 and 80 between the through holes 51 are removed by a hydrofluoric-acid aqueous solution, thus the rectangular lower electrodes 61 are supported at their bottoms by the insulator mounts 50. The lower electrodes 61 of each of several pairs aligned in the column direction are supported as joined to each other via the beam-like insulators 220 connected to them between the insulator mounts 50 and the upper lower-electrode portions (FIGS. 32A and 32B).

Like the steps shown from FIG. 15A in the first embodiment, a dielectric film is formed, upper electrodes are formed, an insulating film is buried in the inside and the outside walls of capacitors and wirings are formed to finish memory cells having transistors and cylinder-type capacitors such as shown in FIGS. 26A and 26B.

In the semiconductor memory in the third embodiment, the lower electrodes 61 of each of several pairs aligned in a specific direction are supported as joined to each other via the beam-like insulators 220 connected to them between the insulator mounts 50 and the upper lower-electrode portions, for high mechanical strength. Therefore, like the first embodiment, the third embodiment achieves increase in capacitance, or large capacitance. Especially, in the third embodiment, each lower electrode is connected, only at one outer surface, to one beam-like insulator, thus offering capacitance larger than the first and second embodiments.

Moreover, the lower electrodes are protected from falling down like the first and second embodiments, thus the third embodiment also achieves high yields.

(Fourth Embodiment)

Disclosed next with reference to FIGS. 33A to 40 are a semiconductor memory and its production method according to a fourth embodiment of the present invention. Elements in FIGS. 33A to 40 that are the same as or analogous to the elements in the first embodiment are referenced by the same reference numbers and will not be explained in detail.

Figure 33A:
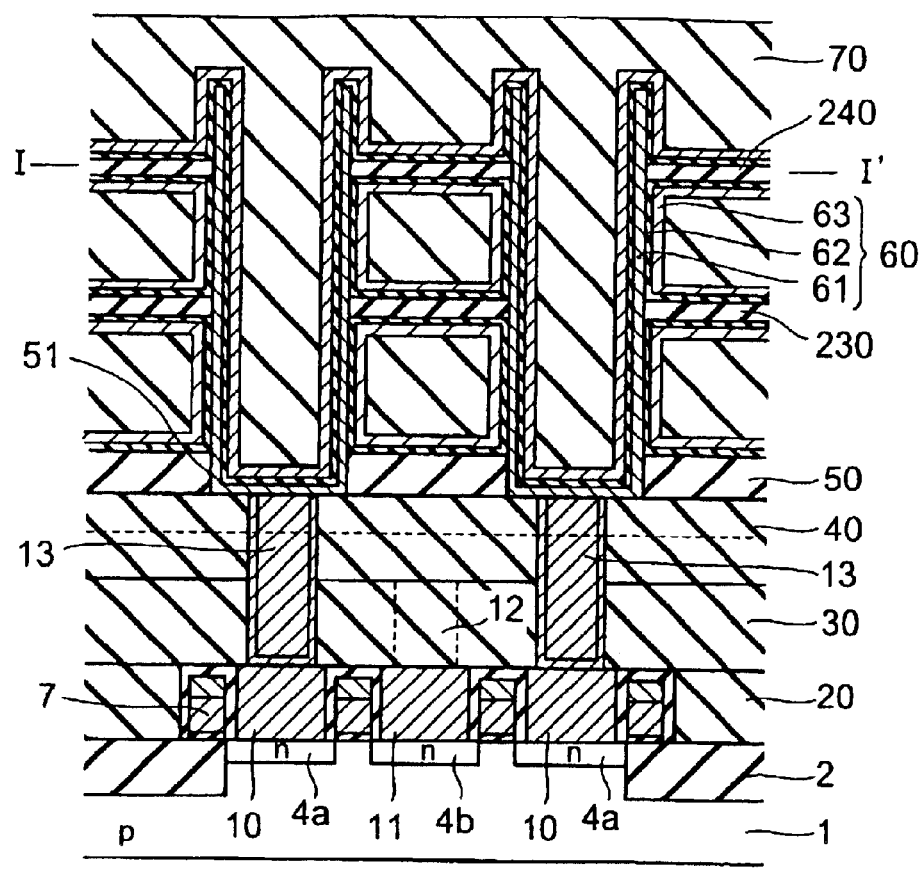
FIGS. 33A and 33B are views showing a structure of a semiconductor memory according to a fourth embodiment of the present invention, FIG. 33A being a sectional view taken on line A–A' of FIG. 1, and FIG. 33B being a sectional view taken on line I–I' of FIG. 33A.
Figure 33B:
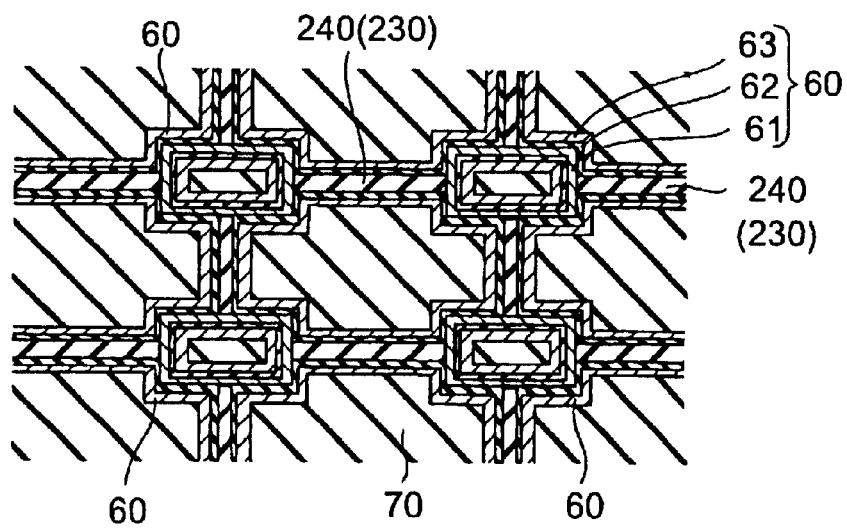
Figure 34:
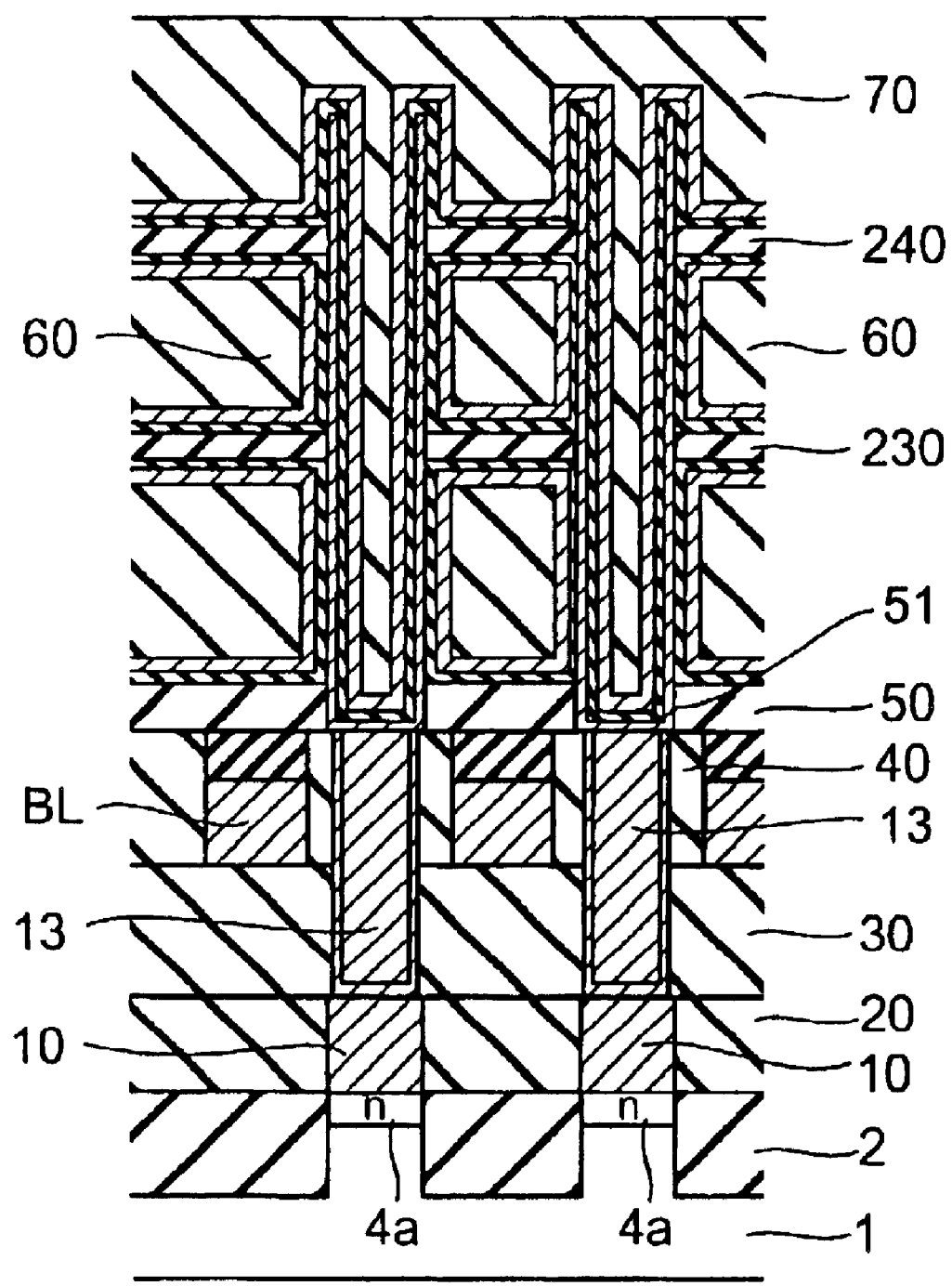
FIG. 34 is a sectional view taken on line B–B' of FIG. 1, showing the semiconductor memory according to the fourth embodiment of the present invention.

FIGS. 33A, 33B and 34 are sectional views showing a structure of the semiconductor memory in the fourth embodiment. In detail, FIG. 33A is a sectional view taken on line A–A' of FIG. 1 while FIG. 33B is a sectional view taken on line I–I' of FIG. 33A. Moreover, FIG. 34 is a sectional view taken on line B–B' of FIG. 1.

As shown in FIGS. 33A to 34, the semiconductor memory in the fourth embodiment has two beam-like insulators 230 and 240 provided vertically between upper portions of adjacent lower electrodes 61 and the insulator mounts 50. The adjacent lower electrodes 61 are supported as joined to each other via the beam-like insulators 230 and 240 connected to them at portions on their facing surfaces. The other structure is identical to the first embodiment.

Disclosed next with reference to FIGS. 35 to 40 is a method of producing the semiconductor memory in the fourth embodiment. FIGS. 35 to 40 are views illustrating production steps: FIGS. 35, 36A, 37A, 38A, 38B, 39A and 40 are sectional views taken on line A–A' of FIG. 1; and FIGS. 36B, 37B and 39B are plan views for FIGS. 36A, 37A and 39A, respectively.

Figure 35:
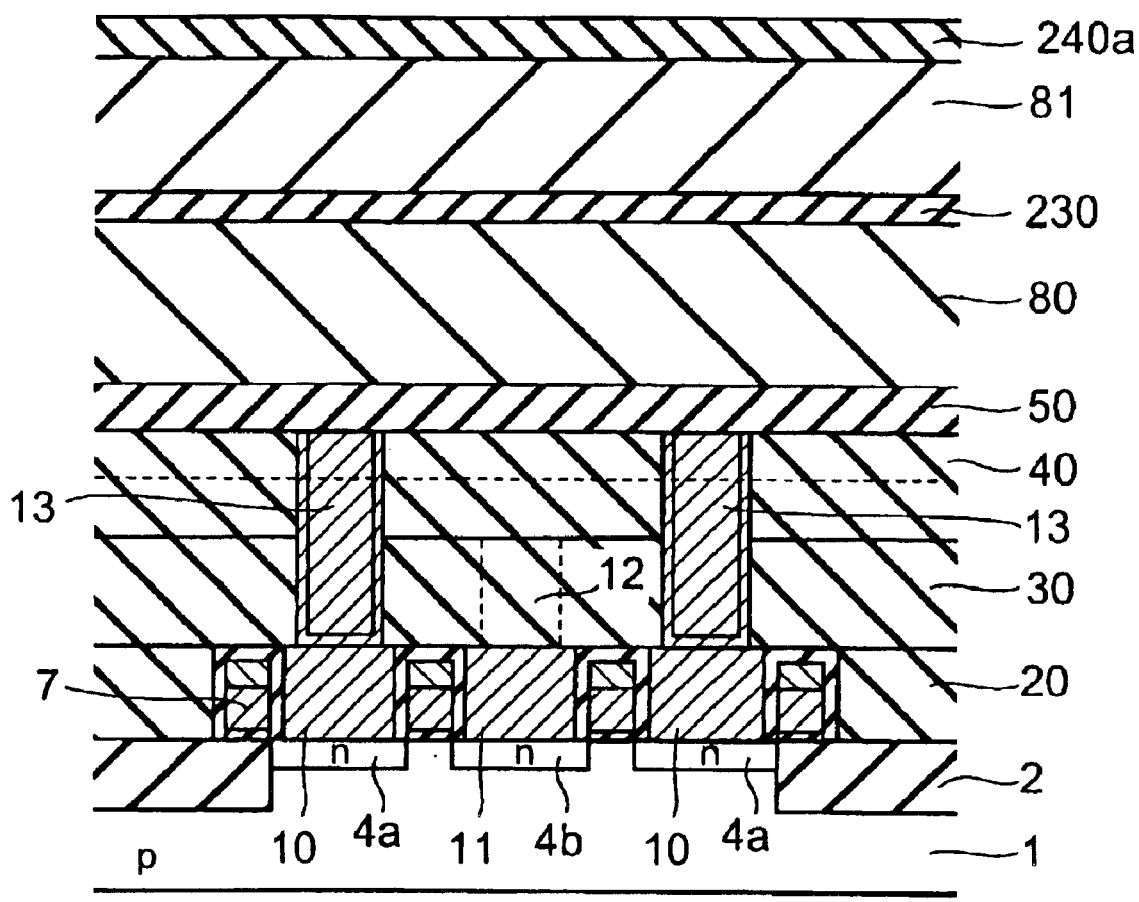
FIG. 35 is a sectional view taken on line A–A' of FIG. 1, showing production steps in a method of producing the semiconductor memory according to the fourth embodiment of the present invention.

As shown in FIG. 35, the processes from the beginning to forming the first grid beam-like insulators 230 (corresponding to the counterpart 200 in the first embodiment) on the first dummy insulating film 80, each having the intersections above the capacitor contact plugs 13, are identical to those in the production method of the first embodiment shown in FIGS. 4A to 10B.

After the photoresist pattern used for patterning the first beam-like insulators 230 is removed, the second dummy insulating film 81 is formed over the first dummy insulating film 80 via the beam-like insulators 230. The second dummy insulating film 81 may be an about 300 nm-thick silicon oxide film deposited by CVD (FIG. 35). A better choice for the second film 81 is an insulating film exhibiting an etching property almost the same as the first film 80 but different from the first beam-like insulators 230, for example, an impurity-doped silicon oxide film such as a BPSG film or a nondoped silicon oxide film.

The second dummy insulating film 81 is polished by CMP and, for example, an about 50 nm-thick silicon nitride film is deposited thereon by LP-CVD to form a second insulating beak-like film 240a to be used for forming the second beam-like insulator in a later step for connecting the stacked capacitors (FIG. 35).

The second insulating film 240a may be an insulating film exhibiting an etching property different from the first and second dummy insulating films 80 and 81. A good choice for the film 240a, in addition to the silicon nitride film is, for example, an silicon oxide film such as an HDP-TEOS film, a TaO film, an $Al_2O_3$ film, a BST film, an STO film, a BTO film, a PZT film and an SBT film.

Figure 36A:
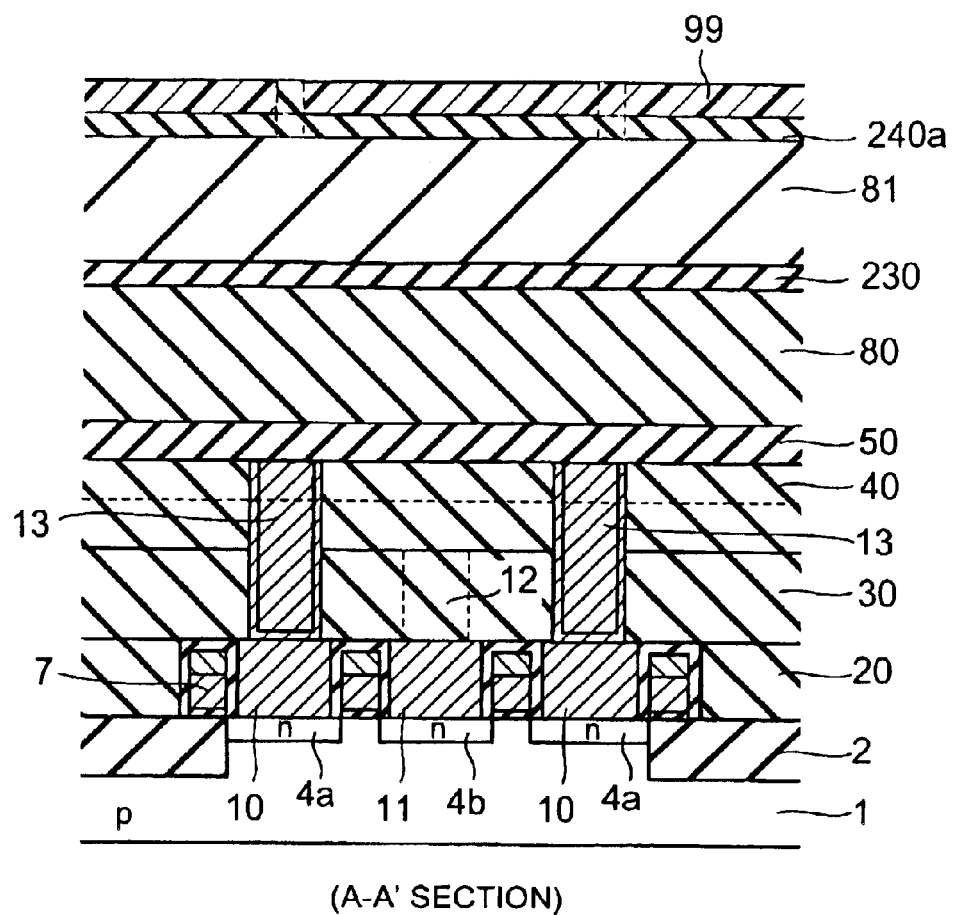
FIGS. 36A and 36B are views illustrating production steps in the method of producing the semiconductor memory according to the fourth embodiment of the present invention, FIG. 36A being a sectional view taken on line A–A' of FIG. 1, and FIG. 36B being a plan view for FIG. 36A.
Figure 36B:
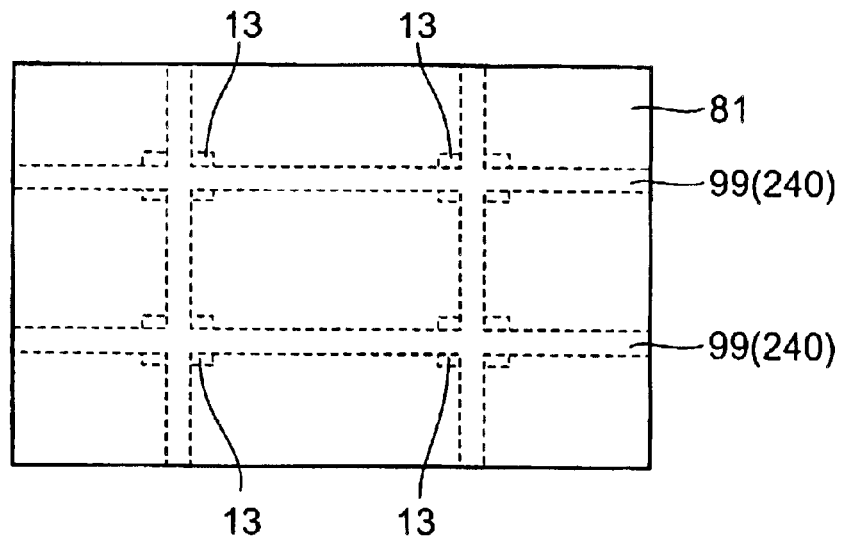

A fine grid photoresist pattern 99 of, for example, about 50 nm in grid width is then formed on the second insulating film 240a. The film 240a is etched by dry etching while masked by the pattern 99 to form second grid beam-like insulators 240 above the capacitor contact plugs 13. The second beam-like insulators 240 are formed above the first beam-like insulators 230, both having the same shape (FIGS. 36A and 36B).

After the photoresist pattern 99 is removed, a third dummy insulating film 82 is formed over the second dummy insulating film 81 via the second beam-like insulators 240. The third dummy insulating film 82 may be an about 300 nm-thick silicon oxide film deposited by CVD. A better choice for the third film 82 is an insulating film exhibiting an etching property almost the same as the first and second insulating films 80 and 81 but different from the second beam-like insulators 240, for example, an impurity-doped silicon oxide film such as a BPSG film or a nondoped silicon oxide film.

Figure 37A:
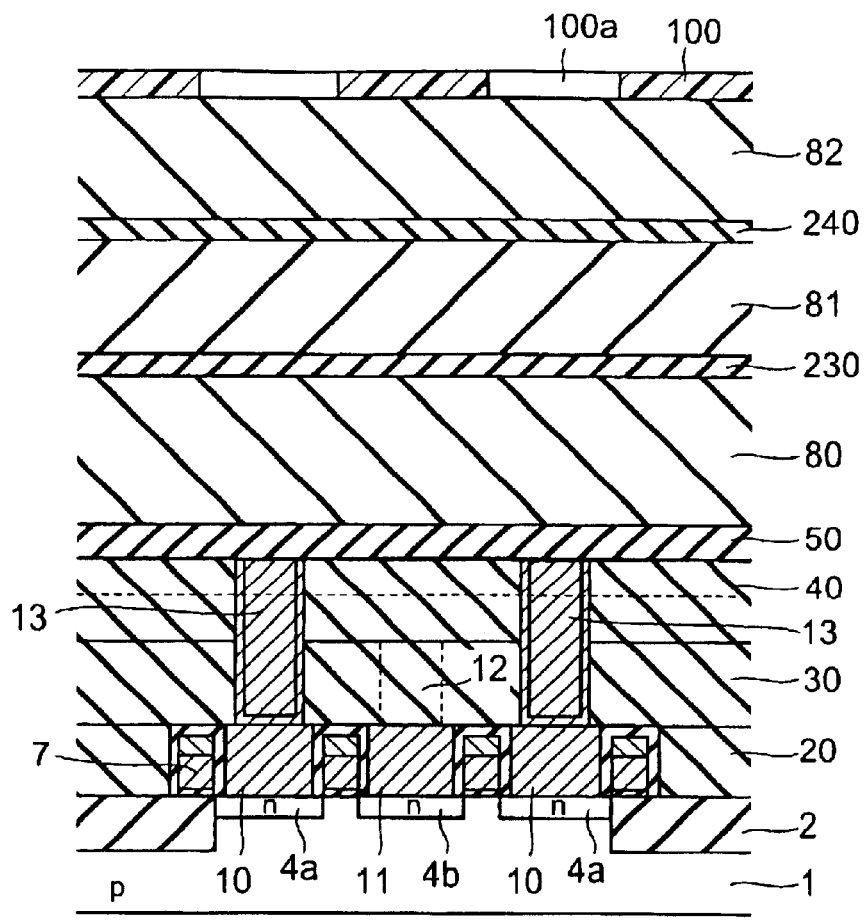
FIGS. 37A and 37B are views illustrating production steps in the method of producing the semiconductor memory according to the fourth embodiment of the present invention, FIG. 37A being a sectional view taken on line A–A' of FIG. 1, and FIG. 37B being a plan view for FIG. 37A.
Figure 37B:
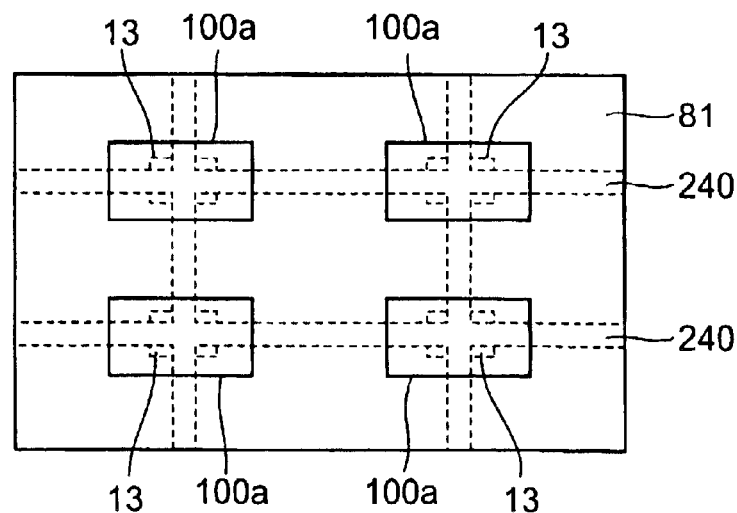

A grid photoresist pattern 100 is formed on the third dummy insulating film 82, having a rectangular opening 100a on each intersection of the second grid beam-like insulators 240 (FIGS. 37A and 37B). The opening 98a is formed into a rectangle of 300 nm in long side and 200 nm in short side, for example.

The third dummy insulating film 82, the intersections of the second beam-like insulators 240, the second dummy insulating film 81, the intersections of first the beam-like insulators 230, the first dummy insulating film 80 and the insulator mount 50 are successively etched by dry etching while masked by the photoresist pattern 100, to provide through holes 51 through which the transistors' capacitor contact plugs 13 are exposed.

Figure 38A:
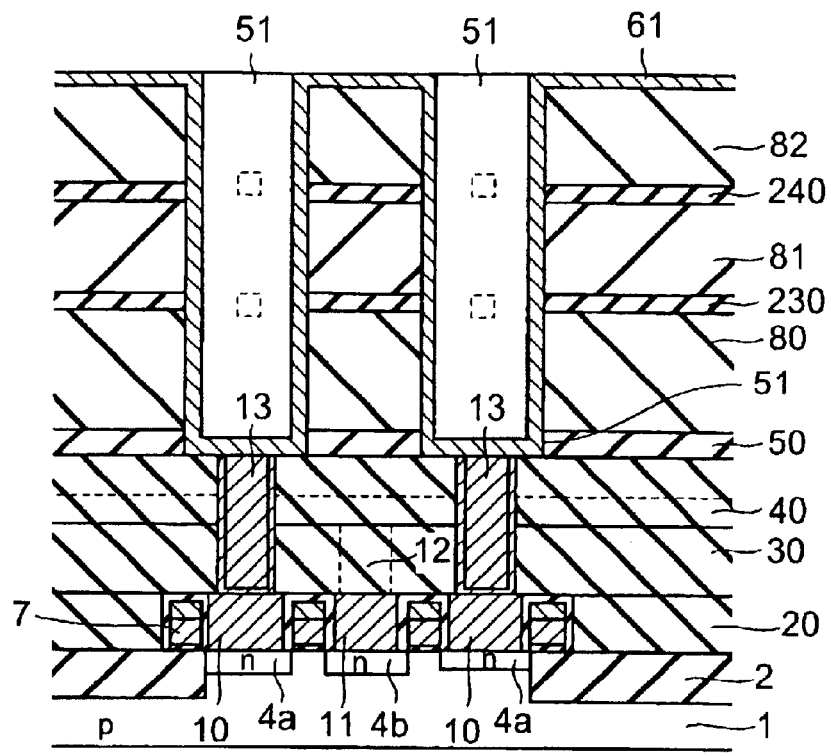
FIGS. 38A and 38B are views taken on line A–A' of FIG. 1, illustrating production steps in the method of producing the semiconductor memory according to the fourth embodiment of the present invention.

After removal of the pattern 100, a first conductive film to become the capacitor lower electrodes 61 is formed on the inner wall of the through holes 51, and the surfaces of the third dummy insulating film 82 between the holes 51 and the capacitor contact plugs 13. For example, a Ru film of about 30 nm in thickness is formed, by CVD, as the lower electrodes (FIG. 38A). The lower electrodes 61 may be of another conductive film such as a Pt film and TiN film.

Figure 38B:
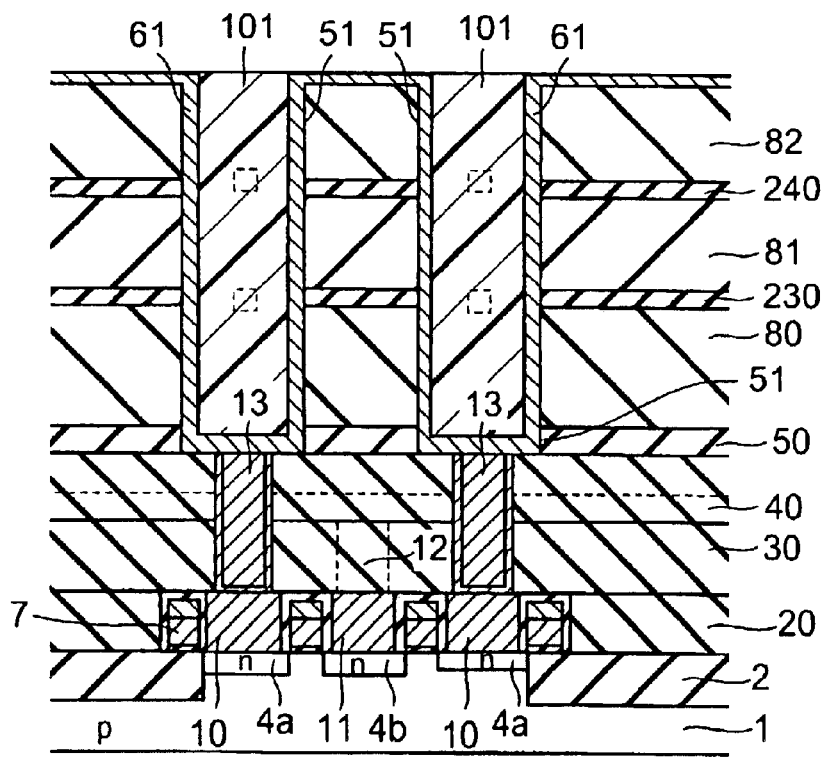

A photoresist 101 is deposited as having a thickness so that the through holes 51 can be completely filled with the photoresist. The photoresist 101 is then etched back to fill the through holes 51 with the photoresist (FIG. 38B).

The lower-electrode portion formed on the third dummy insulating film 82 between the through holes 51 is removed by, for example, by CMP and RIE, thus the lower electrodes 61 being electrically separated from each other.

The photoresist 101 in each through hole 51 is removed by a solvent, such as, thinner. Thinner is the best choice for selective removal of the photoresist 101 with no damages to the thrid dummy insulating film 82 and the lower electrodes 61.

Figure 39A:
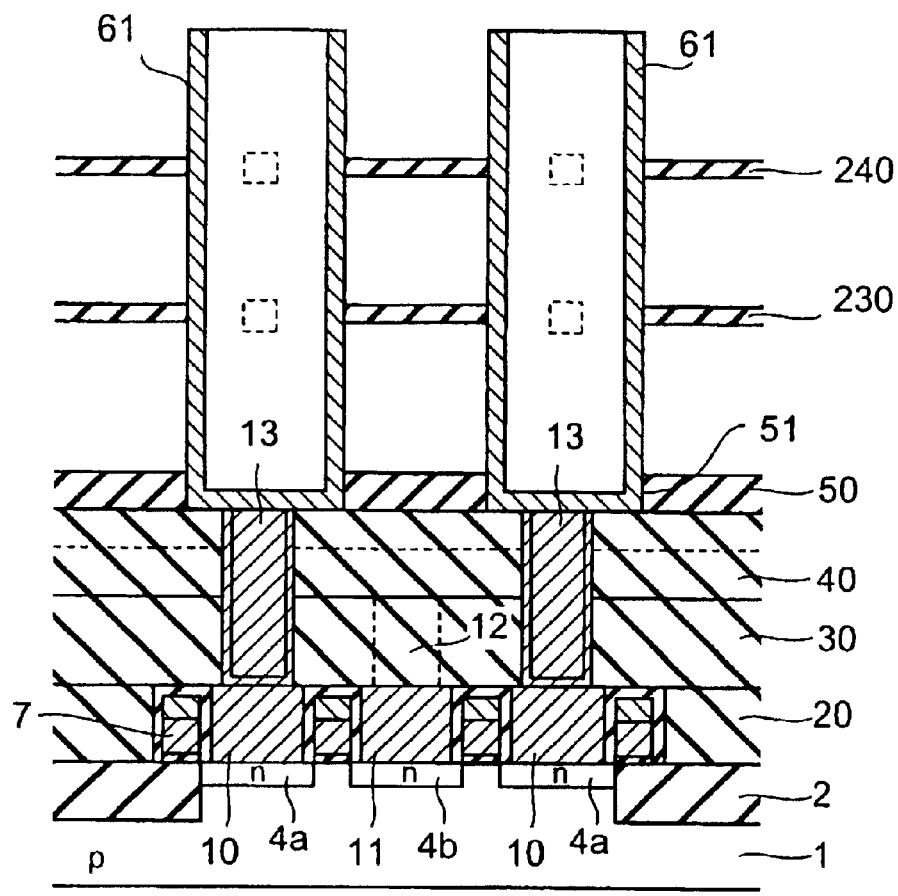
FIGS. 39A and 39B are views illustrating production steps in the method of producing the semiconductor memory according to the fourth embodiment of the present invention, FIG. 39A being a sectional view taken on line A–A' of FIG. 1, and FIG. 39B being a plan view for FIG. 39A.
Figure 39B:
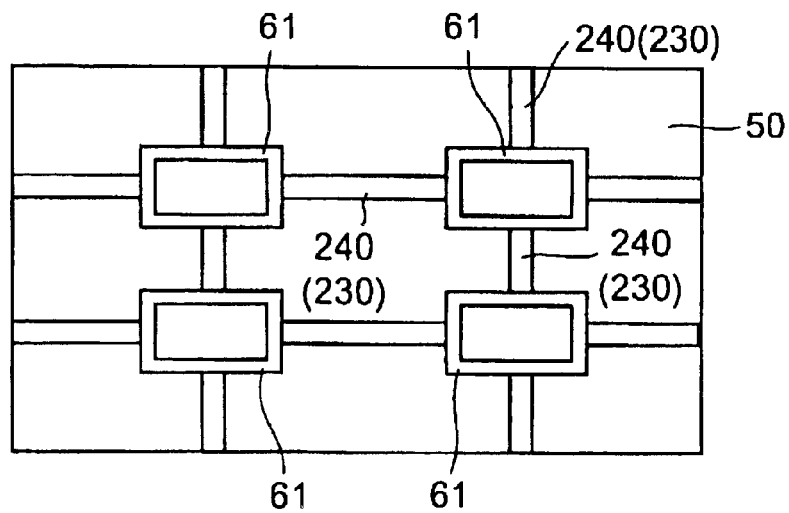

The third, the second and the first dummy insulating films 82, 81 and 80 between the through holes 51 are removed by a hydrofluoric-acid aqueous solution, thus the rectangular-cylinder-type lower electrodes 61 are supported at their bottoms by the insulator mounts 50. The adjacent lower electrodes 61 are supported as joined to each other via the first and second grid beam-like insulators 230 and 240 arranged vertically with a specific gap and connected to the lower electrodes 61 on their facing surface portions between the insulator mounts 50 and the upper lower-electrode portions (FIGS. 39A and 39B).

The dielectric film 62 is formed to cover the lower-electrodes 61. In detail, an about 10 nm-thick $Ta_2O_5$ film, for example, is deposited as the dielectric film, which corresponds to an about 1.3 nm-thick silicon oxide film. The film 62 may be of a highly dielectric film, such as, $SrBi_2Ta_2O_9$ (SBT), $BaSrTiO_3$(BST) and $Al_2O_3$.

Figure 40:
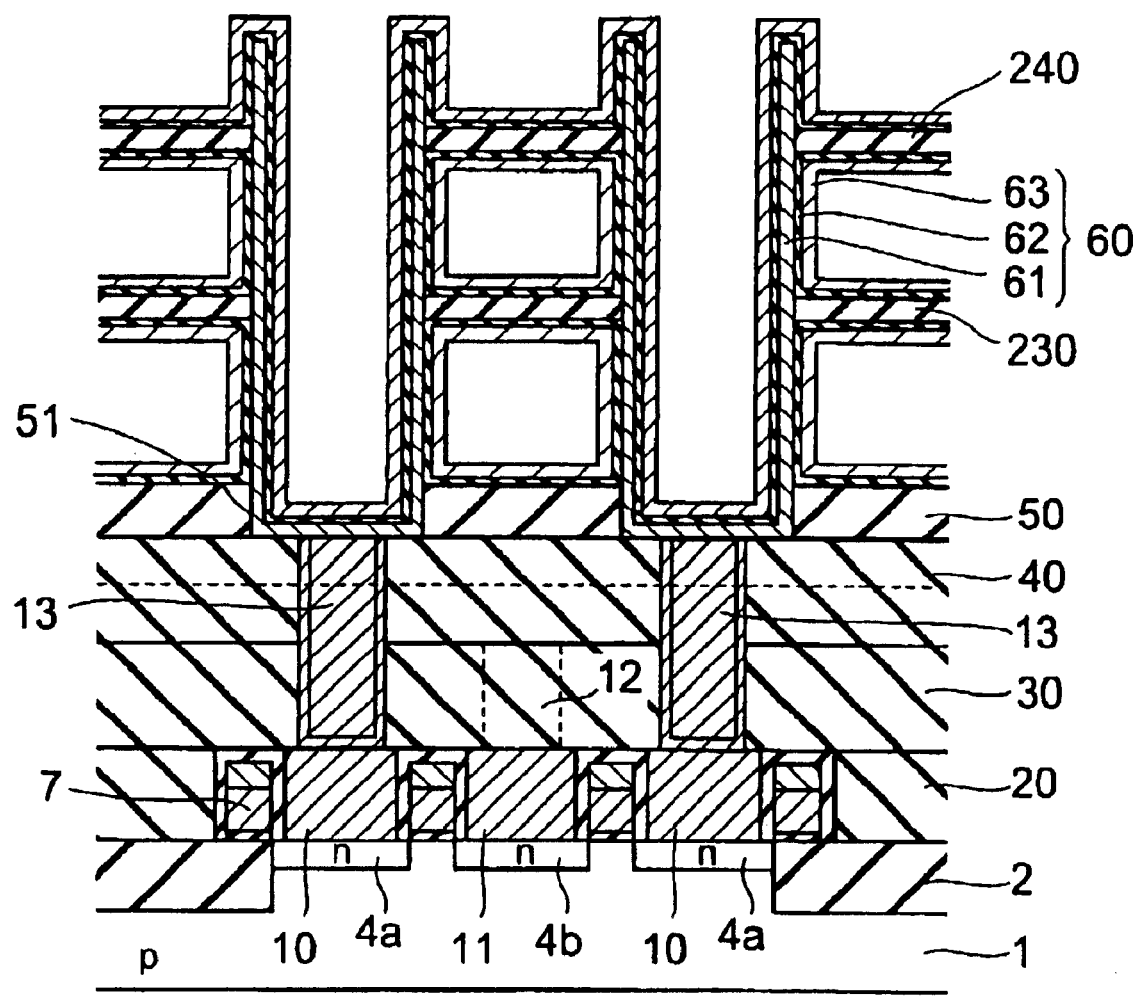
FIG. 40 is a sectional view taken on line A–A' of FIG. 1, illustrating production steps in the method of producing the semiconductor memory according to the fourth embodiment of the present invention.

A second conductive film, such as, a Ru film is formed by LP-CVD on the inner and the outside walls of each lower electrode 61 coated with the dielectric film 62 to form the upper electrode 63. The lower electrode 61, the dielectric film 62 and the upper electrode 63 constitute each capacitor 60 (FIG. 40).

An insulating material 70 is deposited inside and outside the capacitors 60 and polished, followed by upper electrode and wiring formation by a known wiring technique to finish memory cells each having one transistor and one cylinder-type capacitor such as shown in FIGS. 33A, 33B, and 34.

The semiconductor memory in the fourth embodiment has the first and the second beam-like insulators 230 and 240 provided vertically that connect the adjacent lower electrodes 61 to each other in the middle section of their facing surfaces between the insulator mounts 50 and the upper lower-electrode portions. This structure offers mechanical strength higher than the first to the third embodiments, thus gaining larger capacitance.

Moreover, the production method in the fourth embodiment can protect the capacitors from falling down much more than the first to the third embodiments, thus achieving higher yields.

(Fifth Embodiment)

Disclosed next with reference to FIGS. 41A to 47B are a semiconductor memory and its production method according to a fifth embodiment of the present invention. Elements in FIGS. 41A to 47B that are the same as or analogous to the elements in the first embodiment are referenced by the same reference numbers and will not be explained in detail.

Figure 41A:
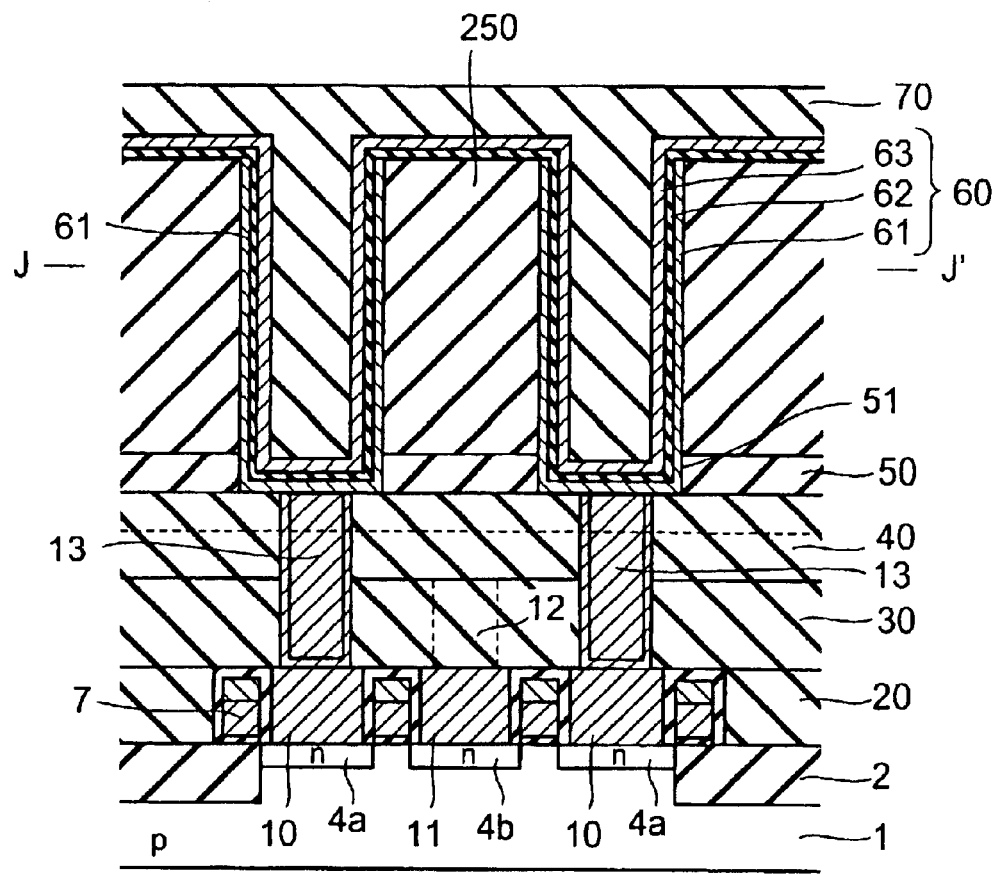
FIGS. 41A and 41B are views showing a structure of a semiconductor memory according to a fifth embodiment of the present invention, FIG. 41A being a sectional view taken on line A–A' of FIG. 1, and FIG. 41B a sectional view taken on line J–J' of FIG. 41A.
Figure 41B:
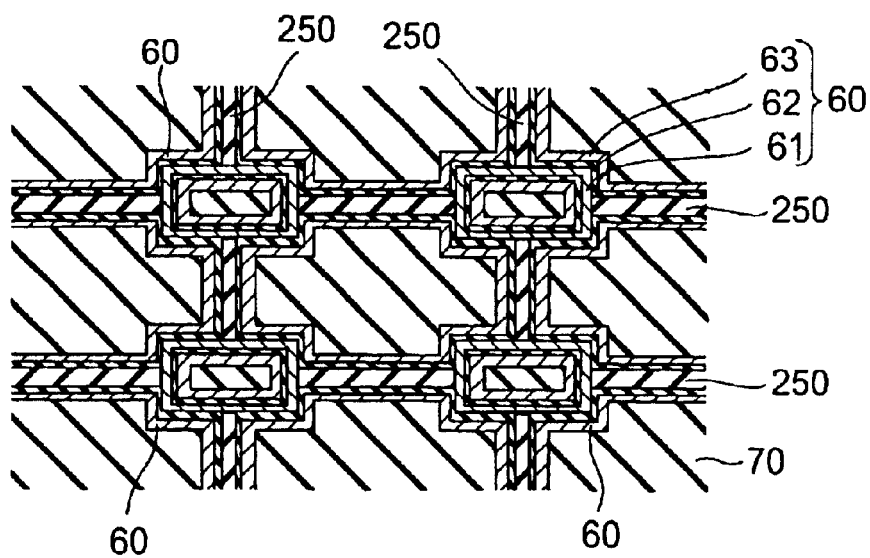

FIGS. 41A and 41B are sectional views showing a structure of the semiconductor memory in the fifth embodiment. In detail, FIG. 41A is a sectional view taken on line A–A' of FIG. 1 and FIG. 41B is a sectional view taken on line J–J' of FIG. 41A.

As shown in FIGS. 41A and 41B, the semiconductor memory in the fifth embodiment has beam-like insulators 250 each standing between two cylinder-type lower electrodes 61 to cover the entire length of the lower electrodes. Adjacent two lower electrodes 61 are supported by each beam-like insulator 250 as connected to each other via the beam-like insulator. Each beam-like insulator 250 is made of, for example, a silicon nitride film having 50 nm in thickness and 1000 nm in height. Not only the silicon nitride film, the beam-like insulator 250 may be made of an oxide film, such as, an HDP-TEOS film, a TaO film, an $Al_2O_3$ film, a BST film, an STO film, a BTO film, a PZT film and a SBT film. The other components in the fifth embodiment are identical to the counterparts in the first embodiment.

Figure 42A:
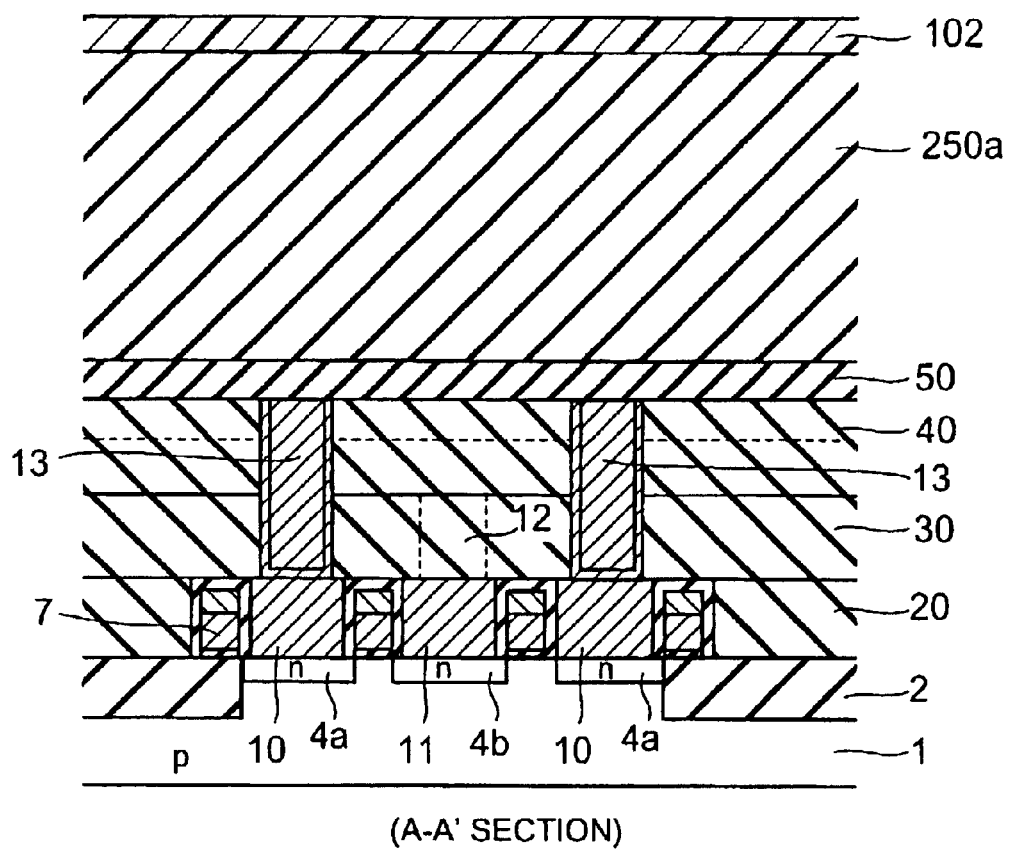
FIGS. 42A and 42B are views illustrating production steps in a method of producing the semiconductor memory according to the fifth embodiment of the present invention, FIG. 42A being a sectional view taken on line A–A' of FIG. 1, and FIG. 42B being a plan view for FIG. 42A.
Figure 42B:
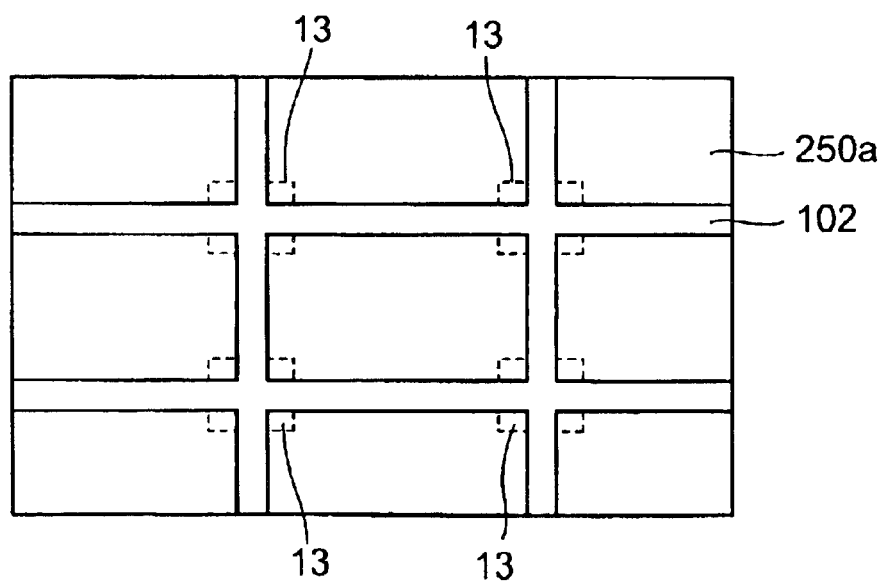
Figure 43A:
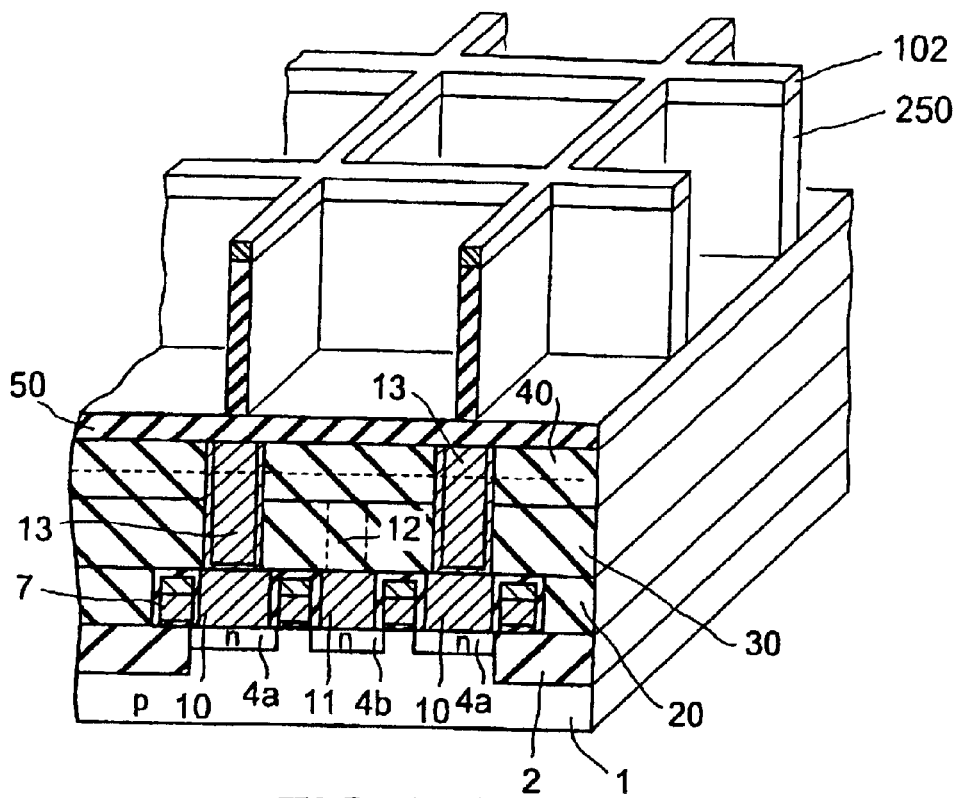
FIGS. 43A and 43B are perspective views illustrating production steps in the method of producing the semiconductor memory according to the fifth embodiment of the present invention.
Figure 43B:
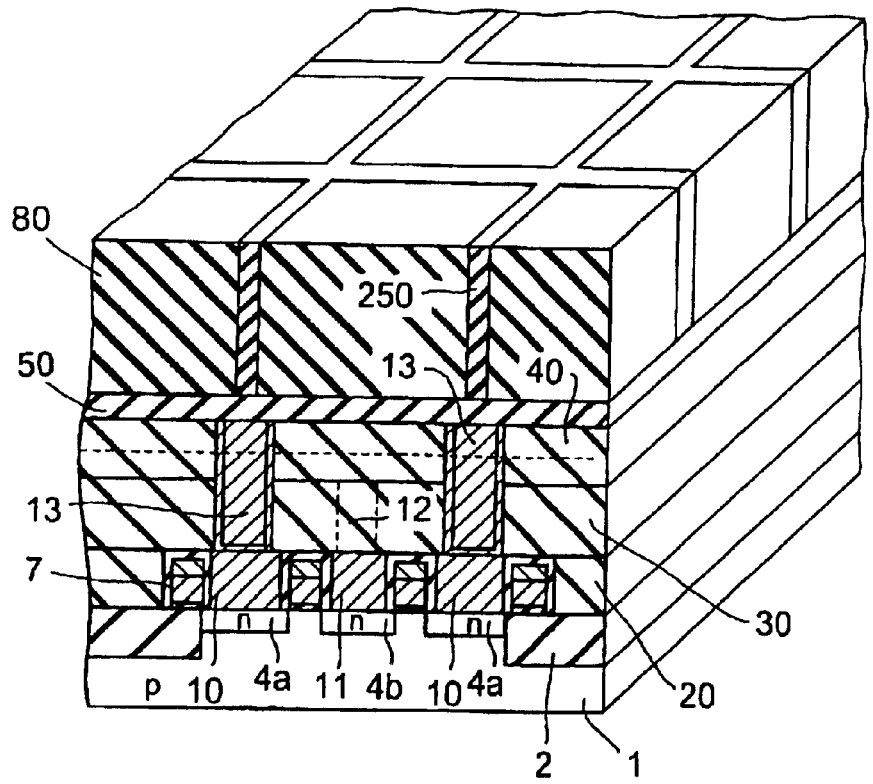
Figure 44:
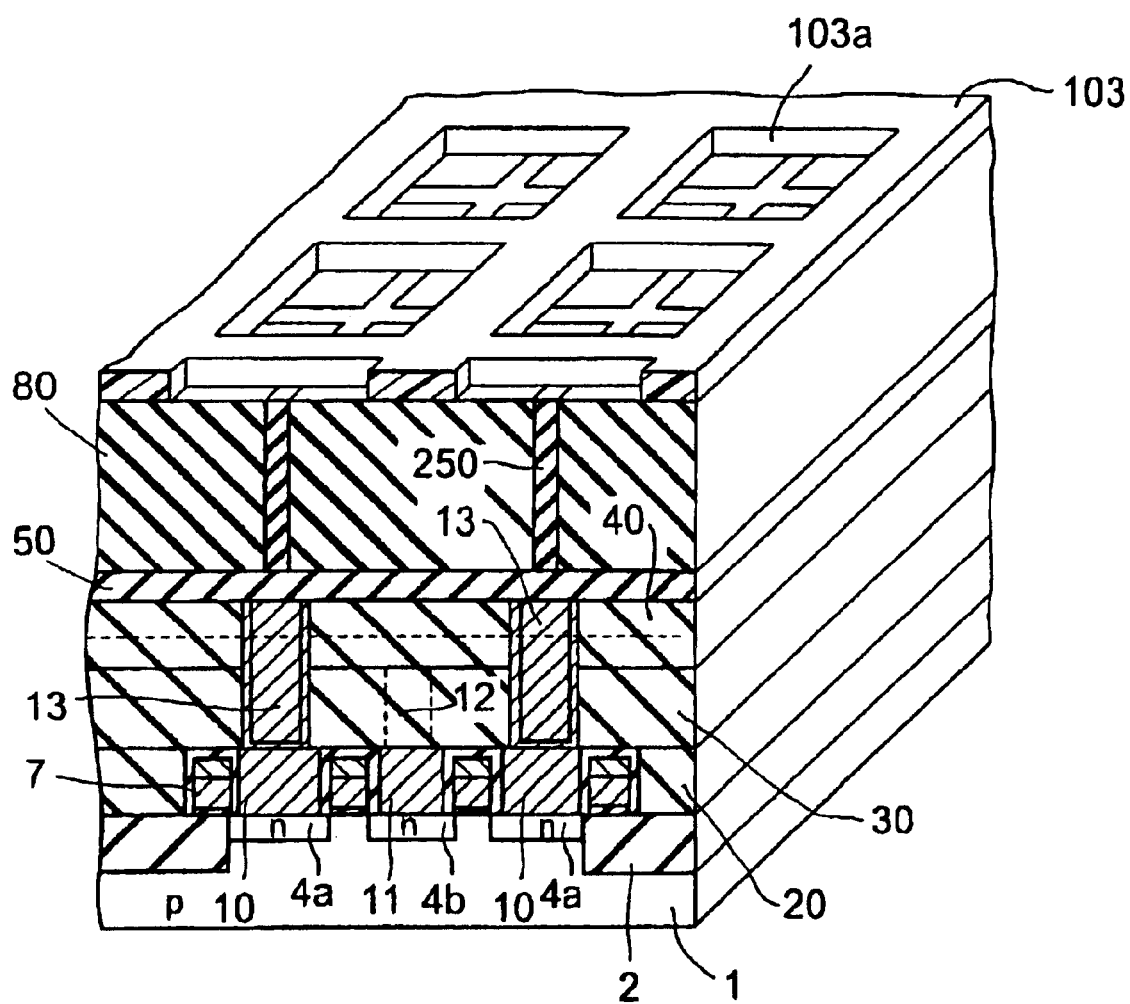
FIG. 44 is a perspective view illustrating production steps in the method of producing the semiconductor memory according to the fifth embodiment of the present invention.
Figure 45A:
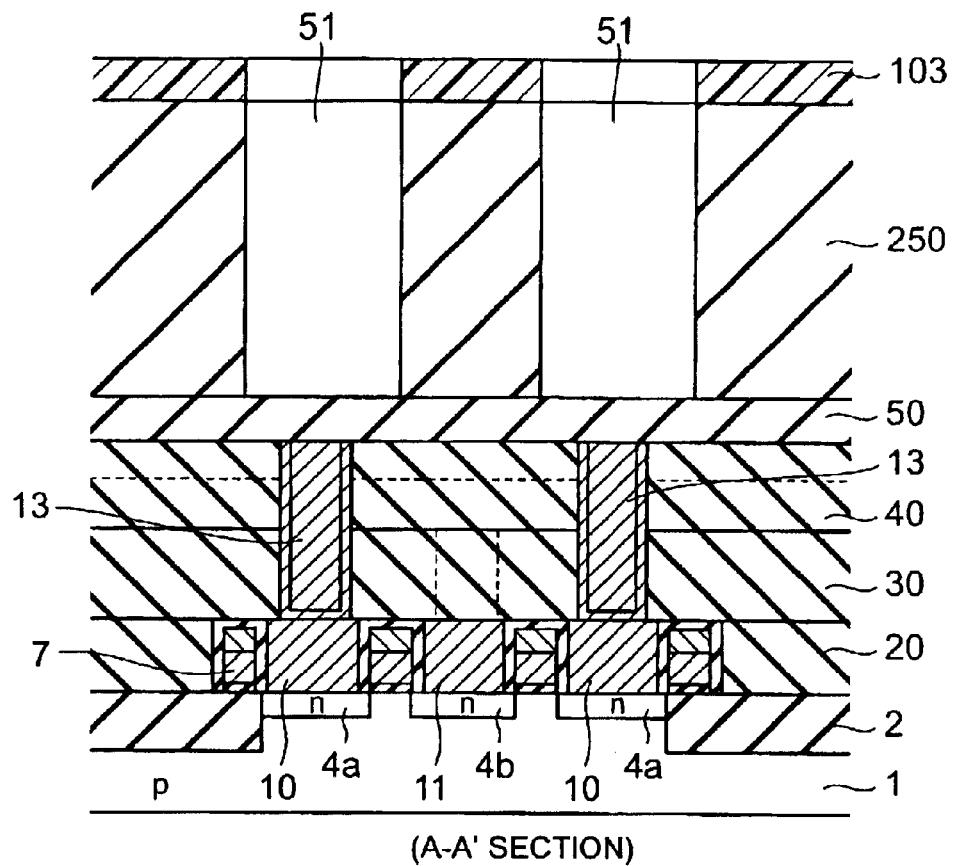
FIGS. 45A and 45B are views illustrating production steps in the method of producing the semiconductor memory according to the fifth embodiment of the present invention, FIG. 45A being a sectional view taken on line A–A' of FIG. 1, and FIG. 45B being a plan view for FIG. 45A.
Figure 45B:
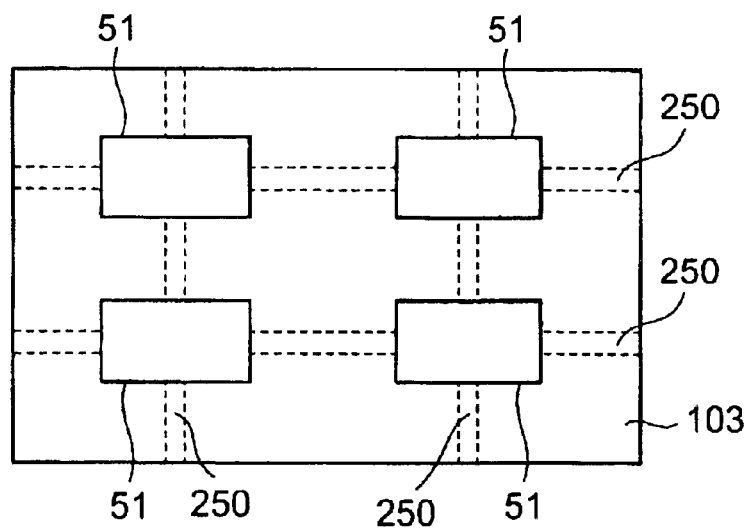
Figure 46A:
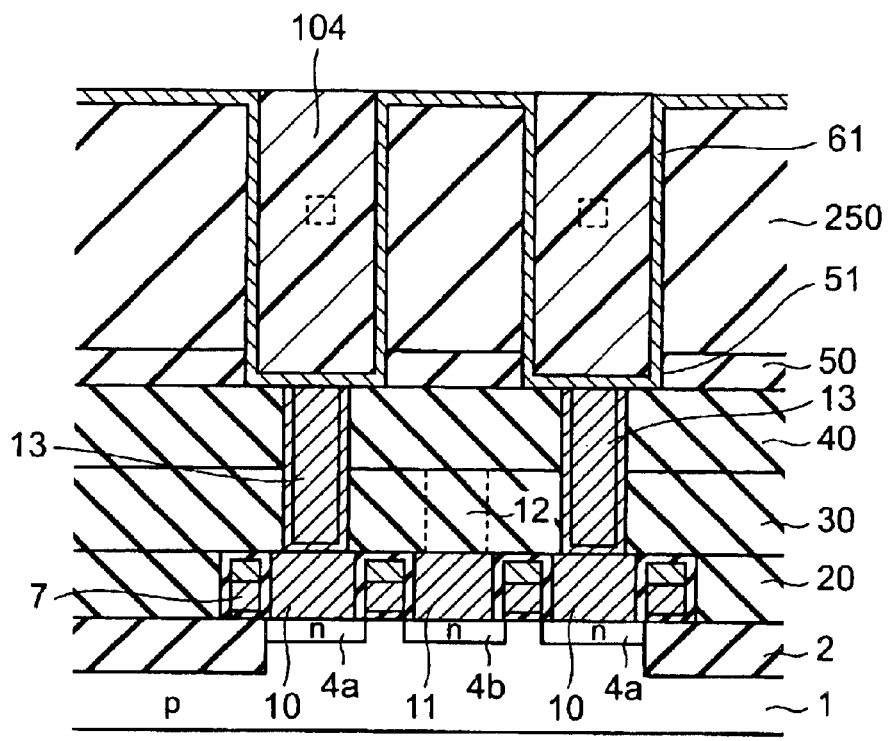
FIGS. 46A and 46B are sectional views taken on line A–A' of FIG. 1, illustrating production steps in the method of producing the semiconductor memory according to the fifth embodiment of the present invention.
Figure 46B:
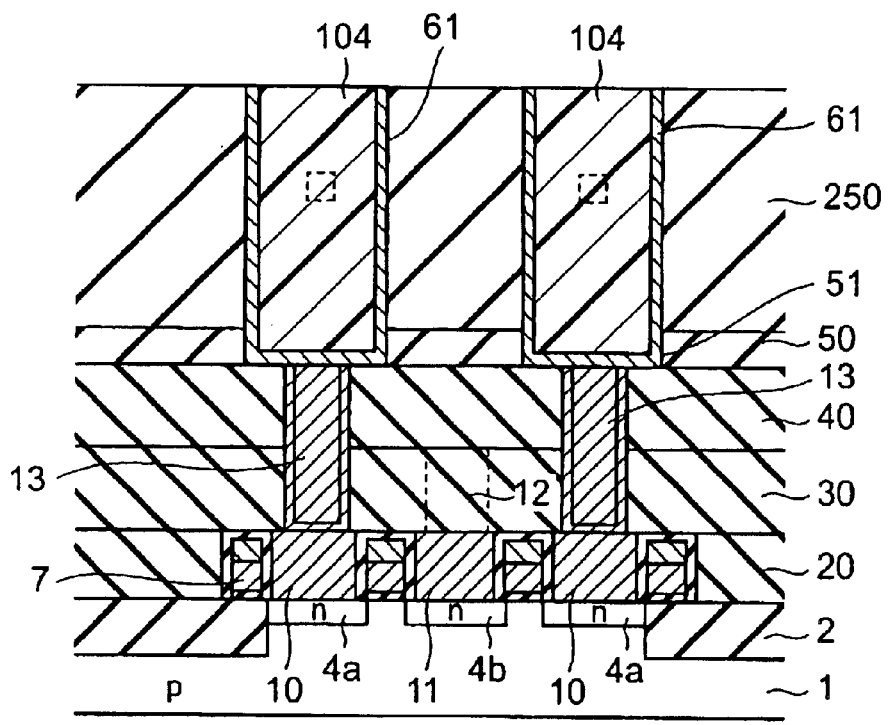
Figure 47A:
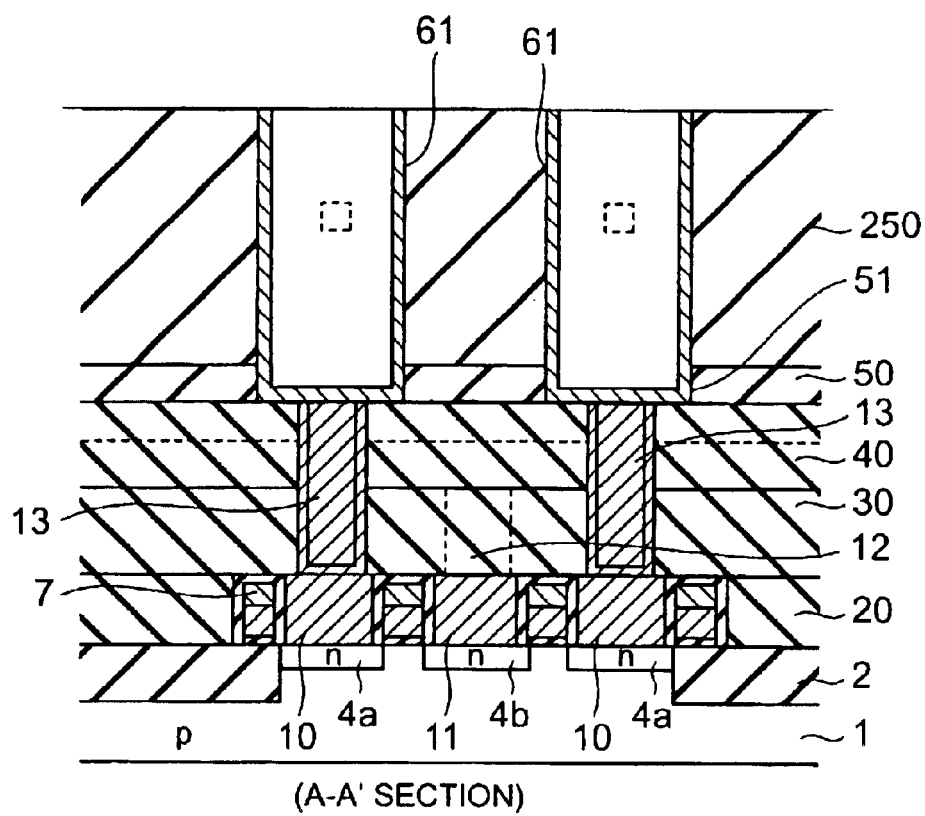
FIGS. 47A and 47B are views illustrating production steps in the method of producing the semiconductor memory according to the fifth embodiment of the present invention, FIG. 47A being a sectional view taken on line A–A' of FIG. 1, and FIG. 47B being a plan view for FIG. 47A.
Figure 47B:
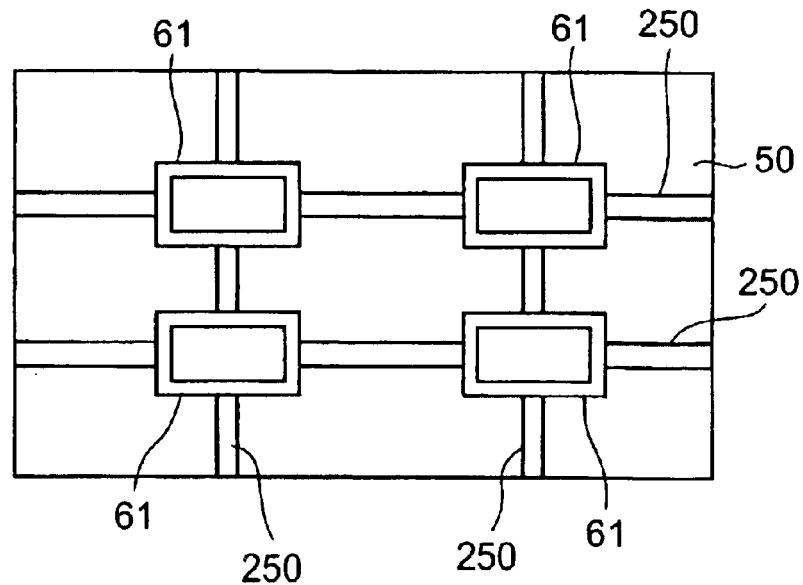

Disclosed next with reference to FIGS. 42A to 47B is a method of producing the semiconductor memory in the fifth embodiment. FIGS. 42A, 45A, 46A, 46B and 47A are sectional views illustrating production steps, taken on line A–A' of FIG. 1. FIGS. 43A, 43B, and 44 are perspective views. FIGS. 42B and 47B are plan views for FIGS. 42A and 47A, respectively.

The processes from the beginning to forming the capacitor contact plugs 13 in the production method of the fifth embodiment shown in FIG. 42A are identical to those in the production method of the first embodiment shown in FIGS. 4A to 8B.

As shown in FIG. 42A, the insulator mount 50 to be used for supporting capacitor lower electrodes is then deposited on the third interlayer insulating film 40 having the buried capacitor contact plugs 13. For example, a silicon nitride film of about 200 nm in thickness is deposited by LP-CVD as the insulator mount 50. The insulator mount 50 will work as an etching stopper in a later step.

An insulating film 250a of about 1000 nm in thickness is deposited by LP-CVD on the insulator mount 50, which will be used for connecting stacked capacitors. Not only the silicon nitride film, the insulating film 250a may be of an oxide film, such as, an HDP-TEOS film, a TaO film, an $Al_2O_3$ film, a BST film, an STO film, a BTO film, a PZT film and a SBT film.

A fine grid photoresist pattern 102 of, for example, about 50 nm in grid width is then formed on the insulating film 250a, such that the intersections of the grid are located above the capacitor contact plugs 13 (FIGS. 42A and 42B).

The insulating film 250a is etched by dry etching while masked by the photoresist pattern 102 to form grid beam-like insulators 250 above the capacitor contact plugs 13 (FIG. 43A).

After the photoresist pattern 102 is removed, a dummy insulating film 80 is formed on the insulator mount 50 so that grid beam-like insulators 250 will be buried in the film 80. The dummy insulating film 80 maybe an about 1000 nm-thick silicon oxide film deposited by CVD (FIG. 43B).

A better choice for the film 80 is an insulating film exhibiting an etching property different from the insulating film 250a, for example, an impurity-doped silicon oxide film such as a BPSG film or a nondoped silicon oxide film.

A grid photoresist pattern 103 is formed on the dummy insulating film 80, having a rectangular opening 103a on each intersection of the grid beam-like insulator 250 (FIG. 44). The opening 103a is formed into a rectangle of 300 nm in long side and 200 nm in short side, for example.

The dummy insulating film 830, the intersections of the beam-like insulators 250 and the insulator mount 50 are successively etched by dry etching while masked by the photoresist pattern 103, to provide the through holes 51 through which the capacitor contact plugs 13 are exposed (FIGS. 45A and 45B).

After the photoresist pattern 103 is removed, a conductive film to become the capacitor lower electrodes 61 is formed on the inner wall of the through holes 51, and the surfaces of the dummy insulating film 80 between the holes 51 and the capacitor contact plugs 13. For example, a Ru film of about 30 nm in thickness is formed as the lower electrodes 61. The lower electrodes 61 may be of another conductive film such as a Pt film and TiN film.

A photoresist 104 is deposited as having a thickness so that the through holes 51 can be completely filled with the photoresist. The photoresist 104 is then etched back to fill the through holes 51 with the photoresist (FIG. 46A).

The lower electrodes 61 are electrically separated from each other by removing the lower-electrode portions formed on the beam-like insulators 250 and dummy insulating film 80 by CMP and RIE (FIG. 46B).

The photoresist 104 in each through hole 51 is removed by a solvent, such as, thinner. Thinner is the best choice for selective removal of the photoresist 104 with no damages to the dummy insulating film 80 the beam-like insulators 250 and the lower electrodes 61.

The dummy insulating film 80 between the through holes 51 is removed by a hydrofluoric-acid aqueous solution, thus the rectangular lower electrodes 61 are supported at their bottoms by the insulator mounts 50. Moreover, the adjacent lower electrodes 61 are supported as joined to each other via the standing beam-like insulators 250 connected to them at the middle section on their facing surfaces (FIGS. 47A and 47B).

Like the steps shown from FIG. 15A in the first embodiment, a dielectric film is formed, upper electrodes are formed, an insulating film is buried in the inside and the outside walls of capacitors and wirings are formed to finish memory cells each having one transistor and one cylinder-type capacitor such as shown in FIGS. 41A and 41B.

In the semiconductor memory in the fifth embodiment, the lower electrodes 61 of adjacent capacitors are supported as joined to each other via the beam-like insulators 250 standing along the cylinder, for high mechanical strength. Therefore, the fifth embodiment offers tall lower electrodes 61 with large capacitance.

In general, the lower electrodes 61 are thin as having film thickness of about 30 nm and hence mechanically weak. In the fifth embodiment, however, the adjacent lower electrodes 61 are supported as connected via the beam-like insulators 250 standing along the cylinder at their side faces, for high mechanical strength, followed by selective etching to the dummy insulating film between lower electrodes, formation of the dielectric film and the upper lower electrode on the lower electrode, and filling insulating materials in inside and outside capacitors, thus the lower electrodes being protected from falling down, and hence the achieving high manufacturing yields.

The standing beam-like insulators 250 are provided for all side faces of each lower electrode 61 in the fifth embodiment. Not only that, however, the insulators 250 may be provided only between adjacent lower electrodes 61 aligned in a specific direction such as the column direction among those arranged in a grid, like the second embodiment.

Furthermore, the insulators 250 may be provided only between lower electrodes 61 of each of several electrode pairs aligned in a specific direction such as the column direction among those arranged in a grid, like the third embodiment.

Each standing beam-like insulator 250 may be provided between adjacent lower electrodes 61 but cut off halfway, thus the lower electrodes 61 being separated from each other.

(Sixth Embodiment)

Figure 48:
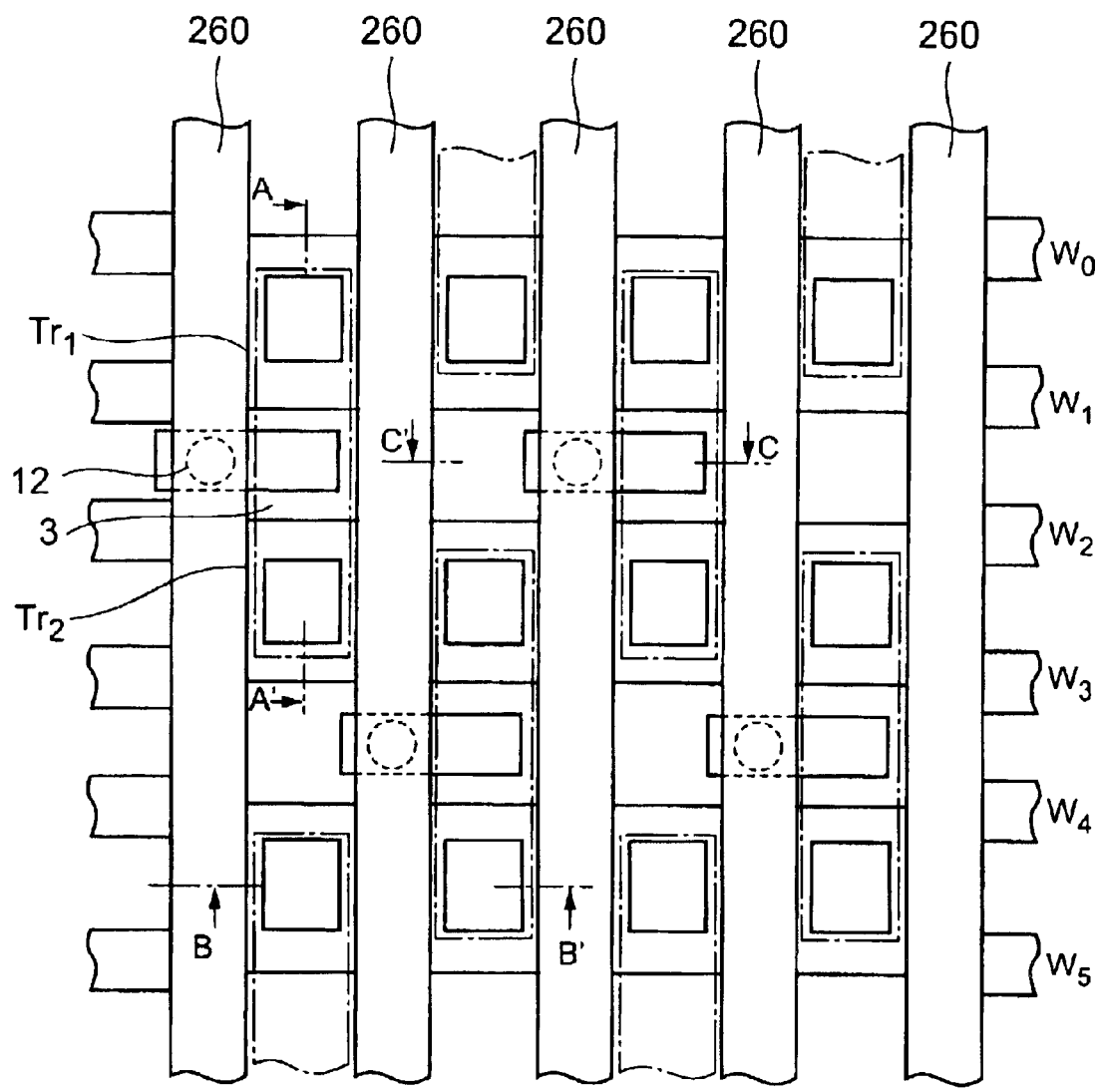
FIG. 48 is a schematic plan view showing a structure of a semiconductor memory according to a sixth embodiment of the present invention.

Disclosed next with reference to FIGS. 48 to 55B are a semiconductor memory and its production method according to a sixth embodiment of the present invention. FIG. 48 is a schematic plan view showing a structure of the semiconductor memory according to the sixth embodiment of the present invention. Elements in FIGS. 48 to 55B that are the same as or analogous to the elements in the first embodiment are referenced by the same reference numbers and will not be explained in detail.

Figure 49A:
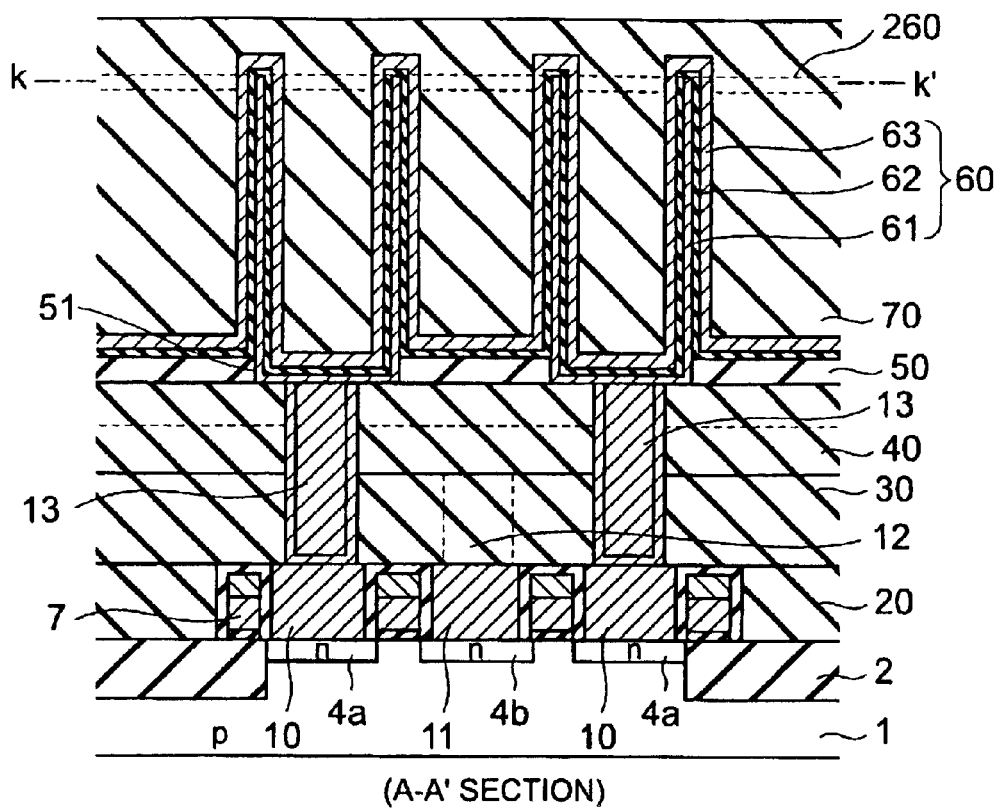
FIGS. 49A and 49B are views showing the structure of the semiconductor memory according to the sixth embodiment of the present invention, FIG. 49A being a sectional view taken on line A–A' of FIG. 48, and FIG. 49B a sectional view taken on line K–K' of FIG. 49A.
Figure 49B:
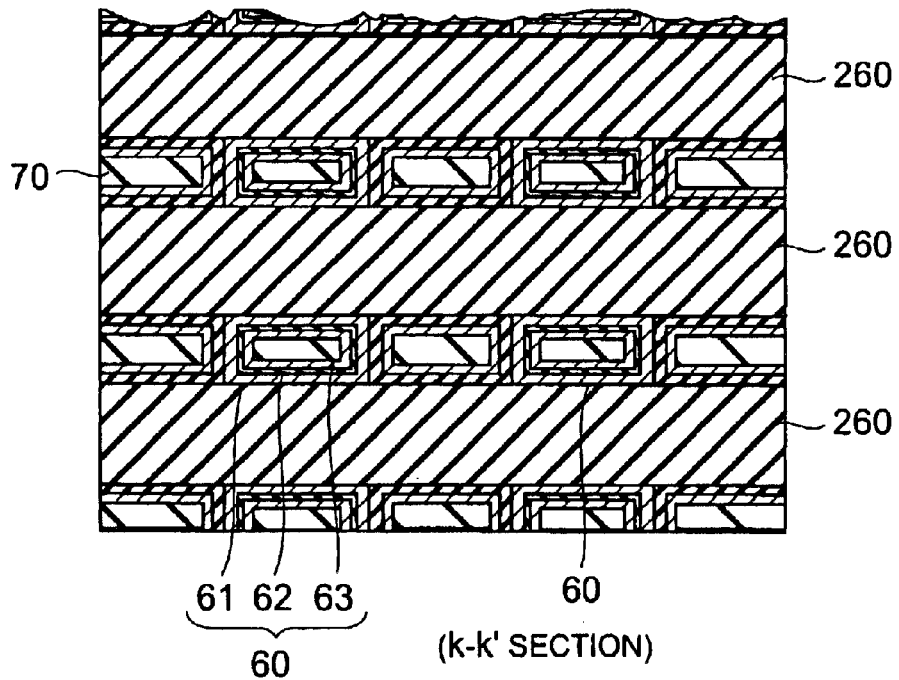

FIGS. 49A and 49B are sectional views showing the structure of the semiconductor memory in the sixth embodiment. In detail, FIG. 49A is a sectional view taken on line A–A' of FIG. 48 and FIG. 49B a sectional view taken on line J–J' of FIG. 49A.

As shown in FIGS. 49A and 49B, the semiconductor memory in the sixth embodiment has straight beam-like insulators 260 on both sides of cylinder-type lower electrodes 61 aligned in the column direction, each insulator 260 covering the entire length of the lower electrodes 61 aligned in each row direction.

In detail, each beam-like insulator 260 is provided at the upper portions of the lower electrodes 61 so that the electrodes are supported as being connected to each other via the insulator.

The insulating film 260 may be a silicon nitride film having about 100 nm in width and about 50 nm in thickness for its rectangular section. A good choice for the film 260, in addition to the silicon nitride film is, for example, an silicon oxide film such as an HDP-TEOS film, a TaO film, an $Al_2O_3$ film, a BST film, an STO film, a BTO film, a PZT film and an SBT film. The other components in the sixth embodiments are identical to the counterparts in the first embodiment.

Figure 50A:
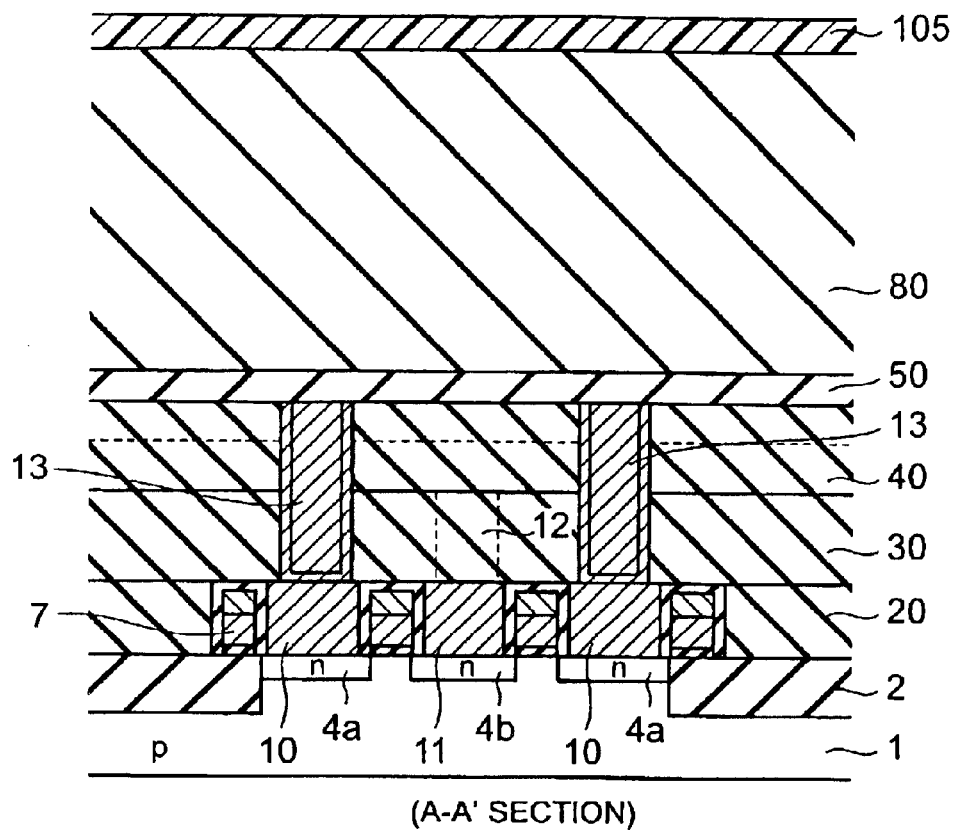
FIGS. 50A and 50B are views illustrating production steps in a method of producing the semiconductor memory according to the sixth embodiment of the present invention, FIG. 50A being a sectional view taken on line A–A' of FIG. 48, and FIG. 50B a plan view for FIG. 50A.
Figure 54A:
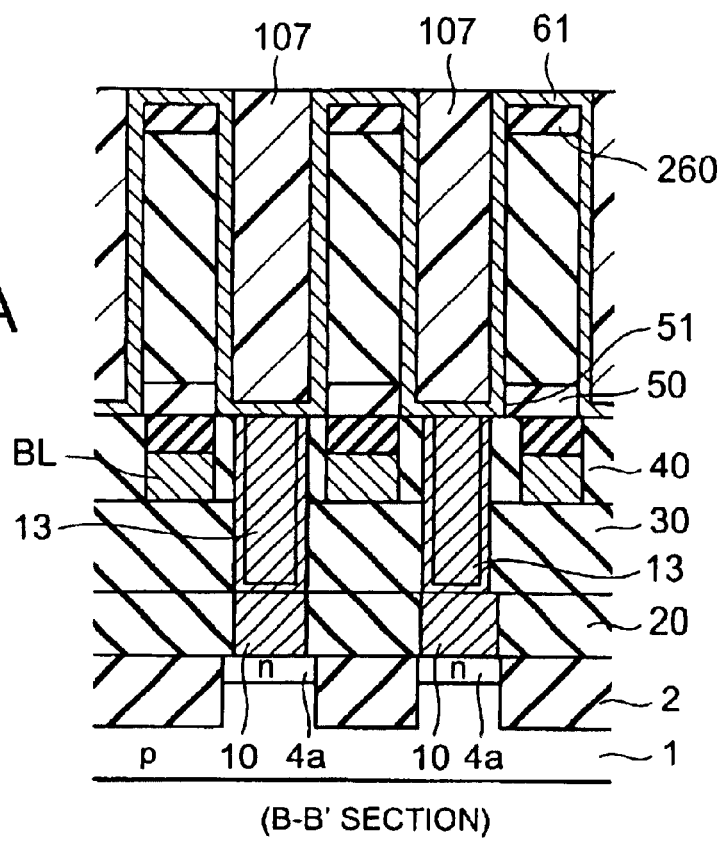
FIGS. 54A and 54B are sectional views taken on line B–B' of FIG. 48, illustrating production steps in the method of producing the semiconductor memory according to the sixth embodiment of the present invention.
Figure 54B:
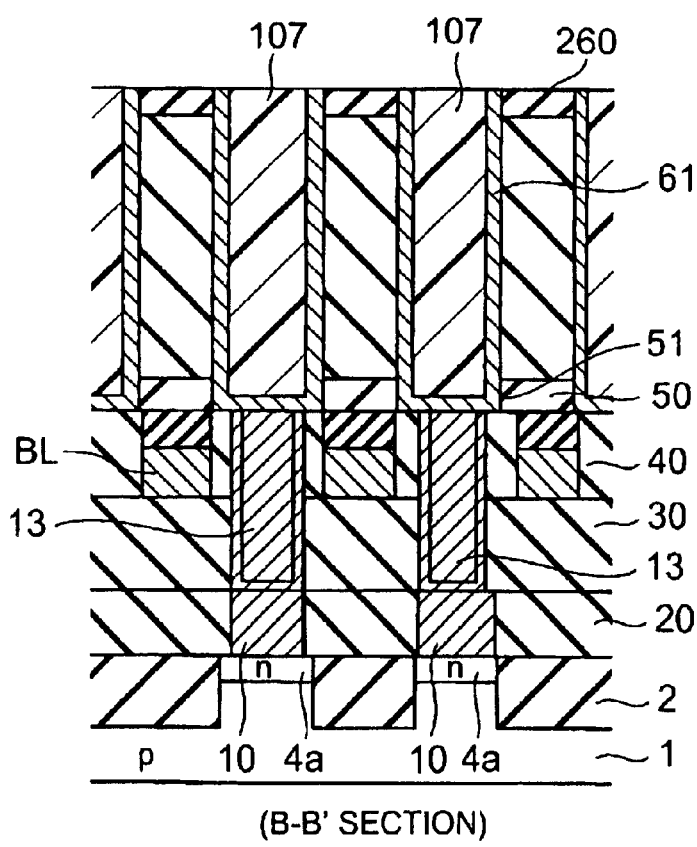
Figure 55A:
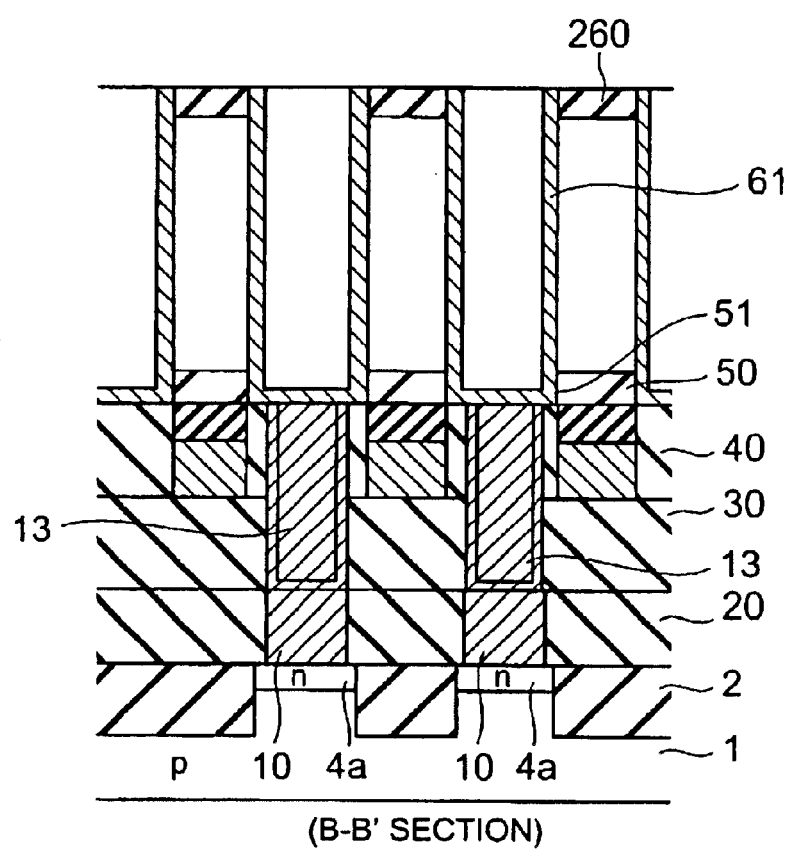
FIGS. 55A and 55B are views illustrating production steps in the method of producing the semiconductor memory according to the sixth embodiment of the present invention, FIG. 55A being a sectional view taken on line B–B' of FIG. 48, and FIG. 55B being a plan view for FIG. 55A.
Figure 55B:
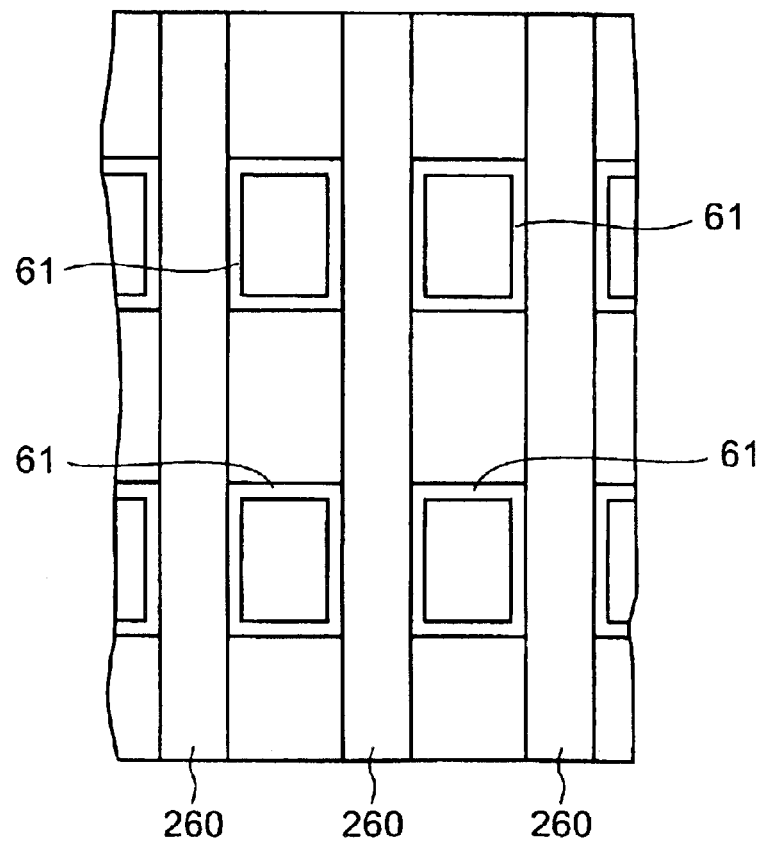
Figure 56:
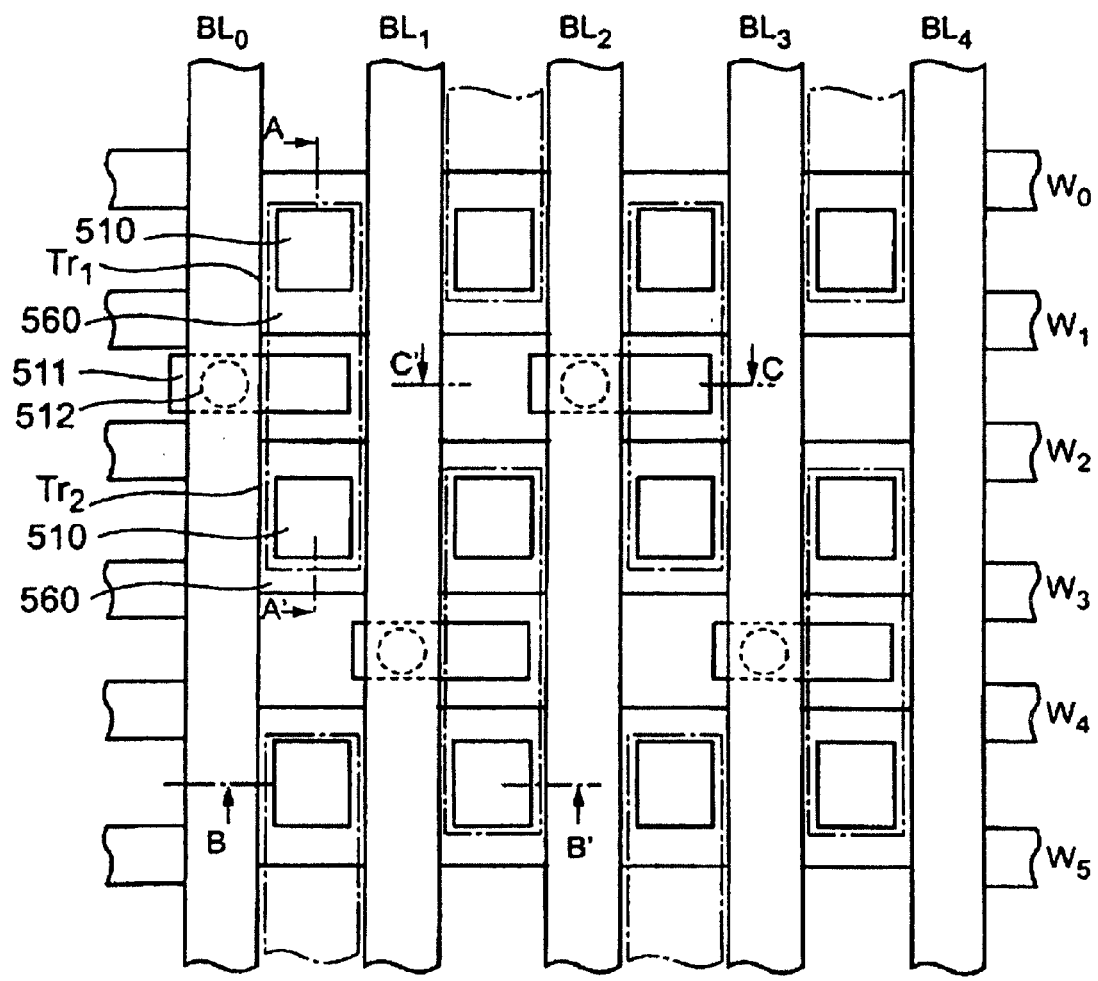
FIG. 56 is a schematic plan view showing a structure of a known semiconductor memory.
Figure 57:
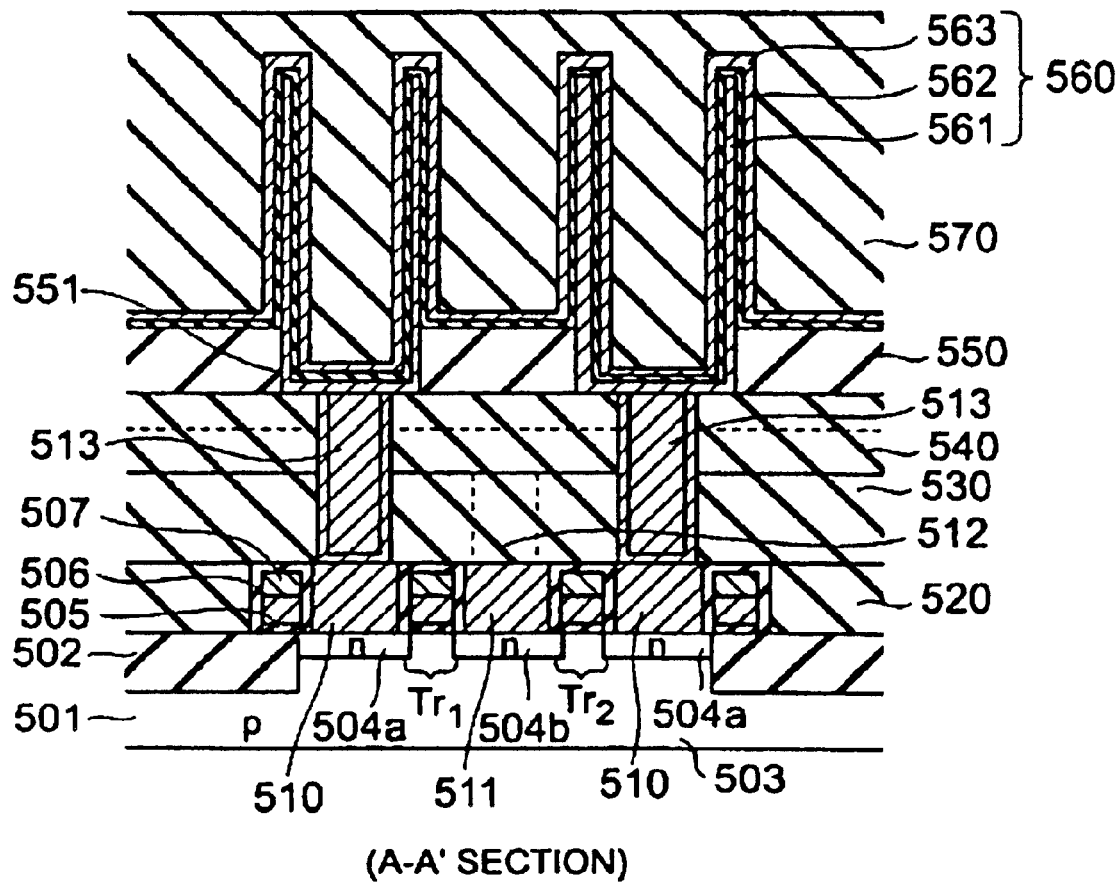
FIG. 57 is a sectional views taken on line A–A' of FIG. 56, showing the known semiconductor memory.
Figure 58:
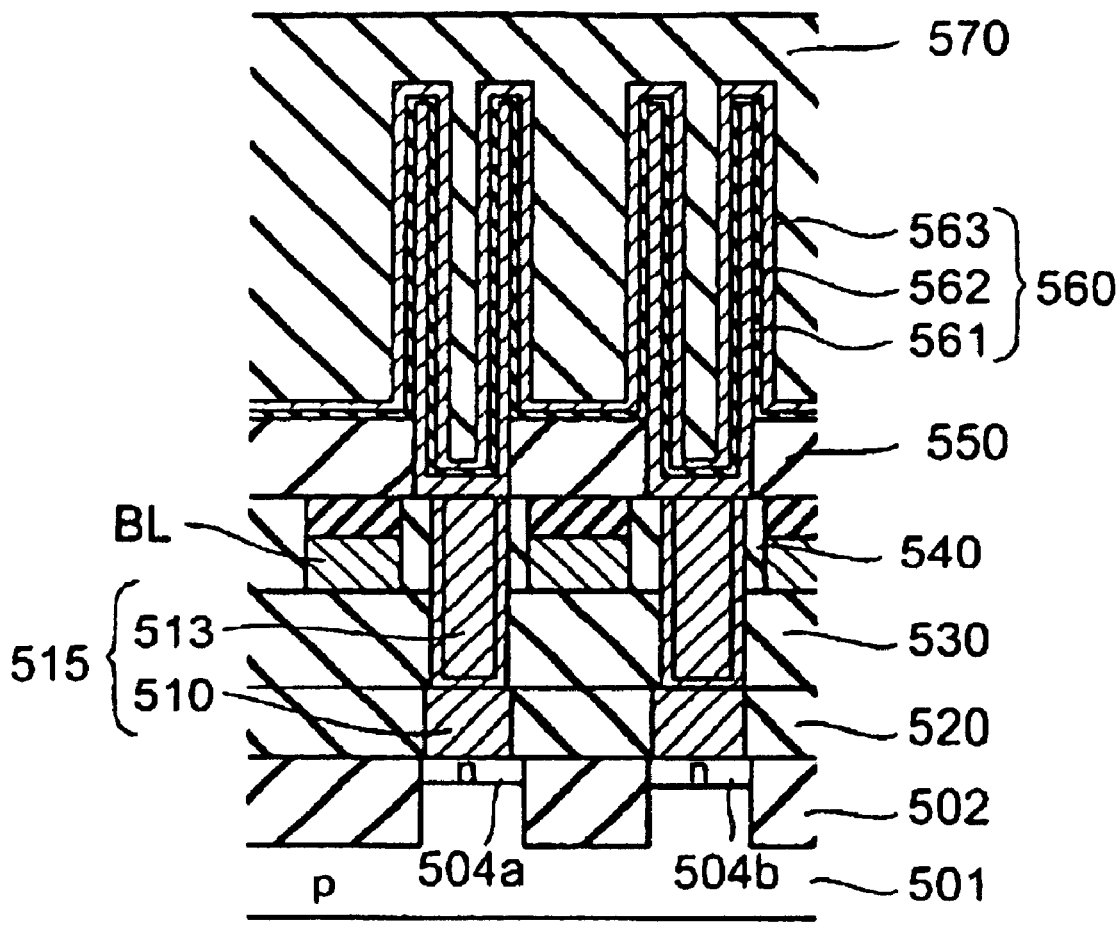
FIG. 58 is a sectional views taken on line B–B' of FIG. 56, showing the known semiconductor memory.
Figure 59A:
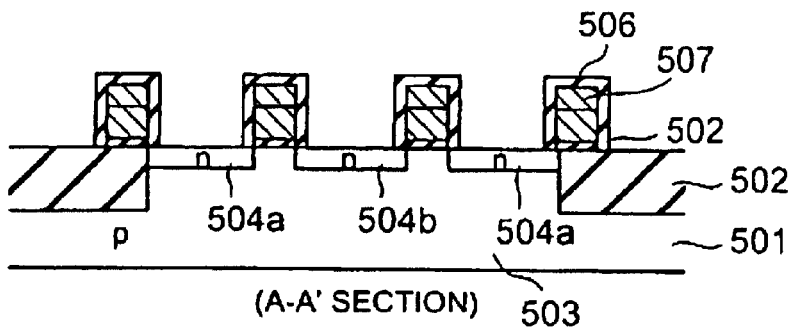
FIGS. 59A to 59D are views illustrating production steps in a method of producing the known semiconductor memory, FIGS. 59A to 59C being sectional views taken on line A–A' of FIG. 56, and FIG. 59D being a sectional view taken on line C–C' of FIG. 56.
Figure 59B:
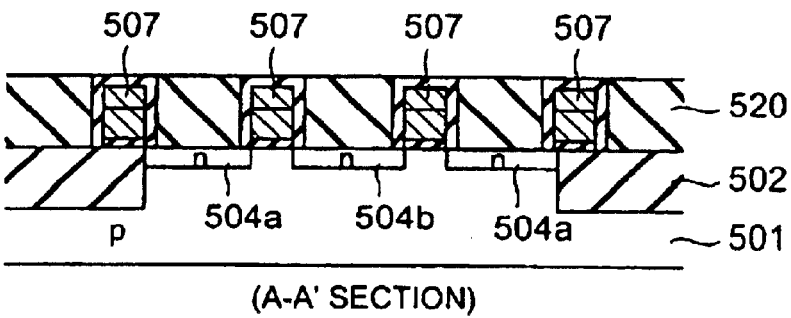
Figure 59C:
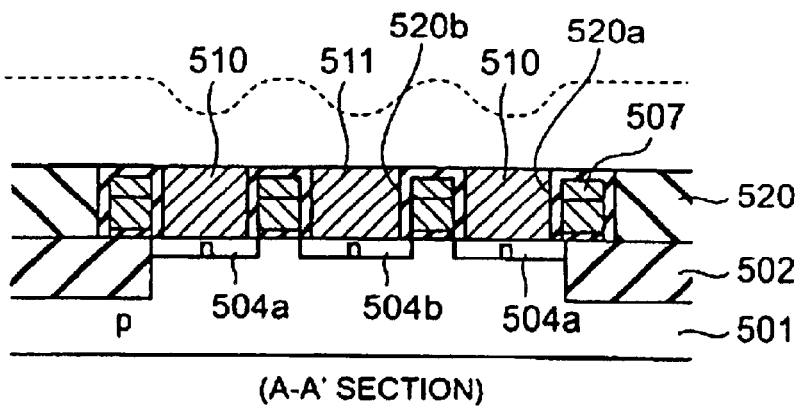
Figure 59D:
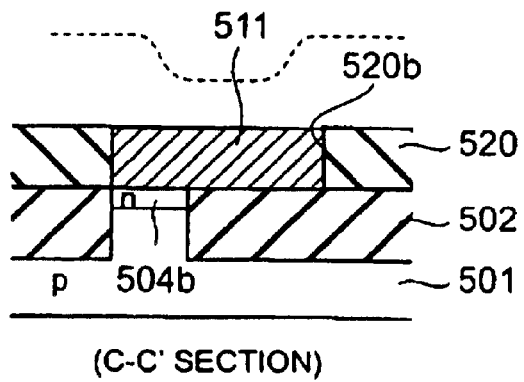
Figure 60A:
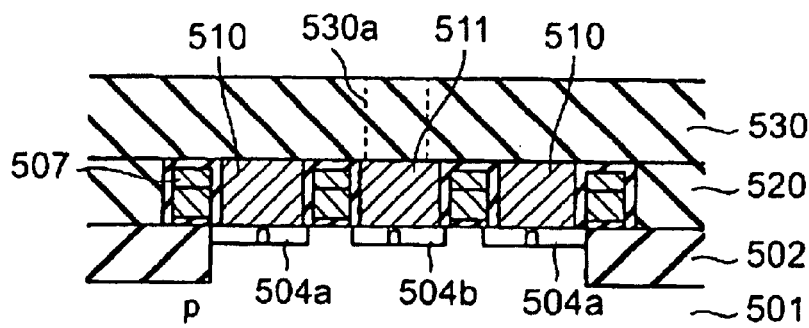
FIGS. 60A to 60D are views illustrating production steps in the method of producing the known semiconductor memory, FIGS. 60A and 60C being sectional views taken on line A–A' of FIG. 56, and FIGS. 60B and 60D being sectional views taken on line C–C' of FIG. 56.
Figure 60B:
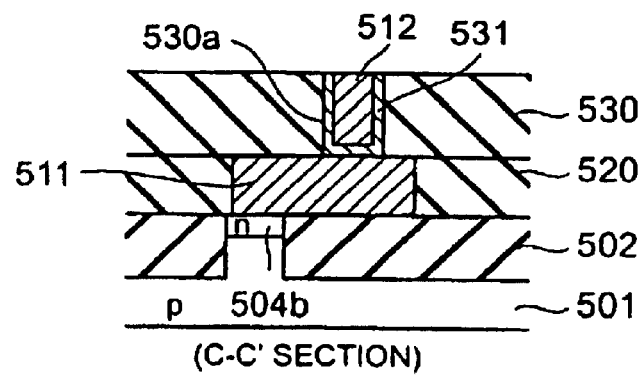
Figure 60C:
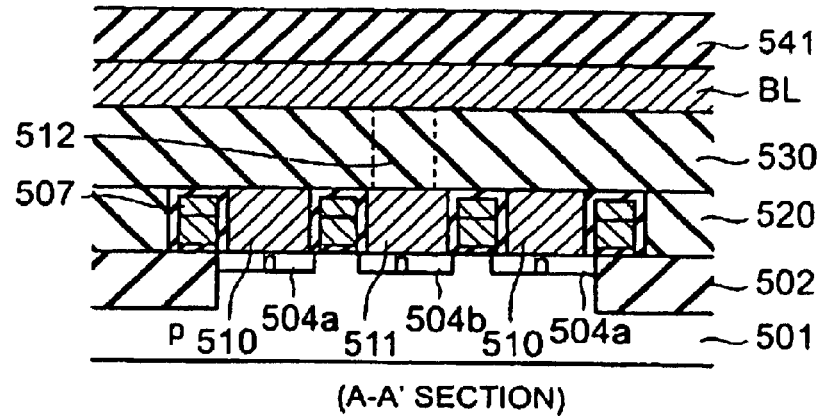
Figure 60D:
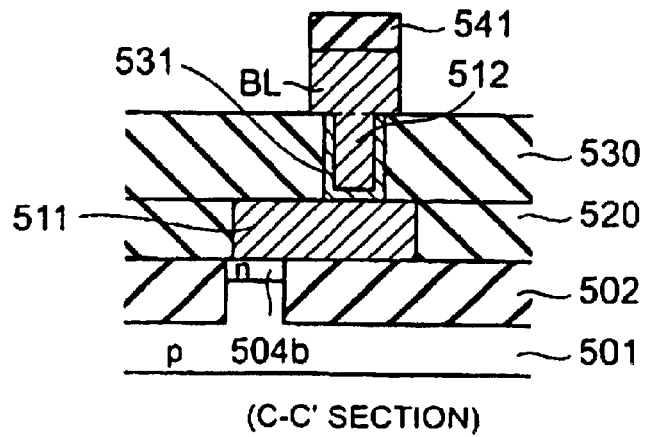
Figure 61A:
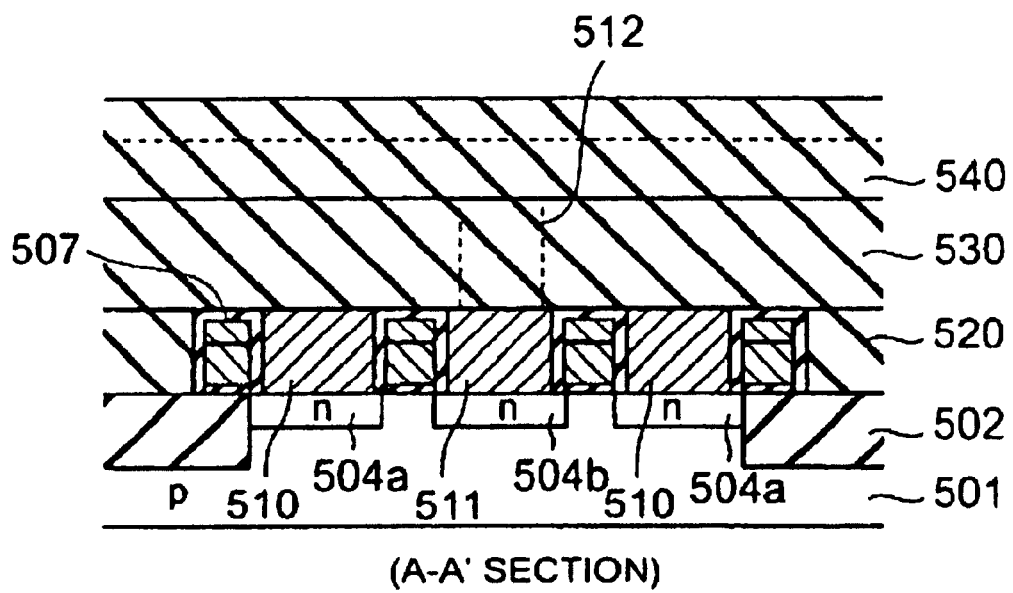
FIGS. 61A and 61B are views illustrating production steps in the method of producing the known semiconductor memory, FIG. 61A being a sectional view taken on line A–A' of FIG. 56, and FIG. 61B a sectional view taken on line C–C' of FIG. 56.
Figure 61B:
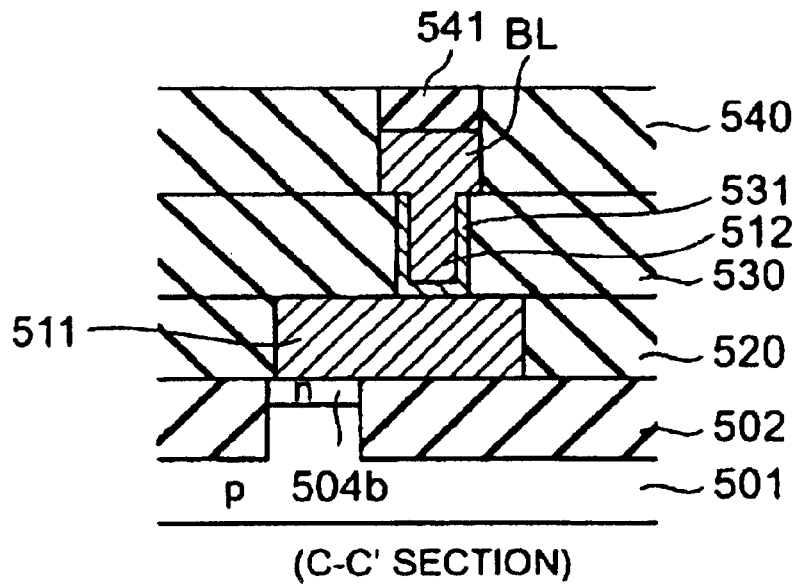
Figure 62A:
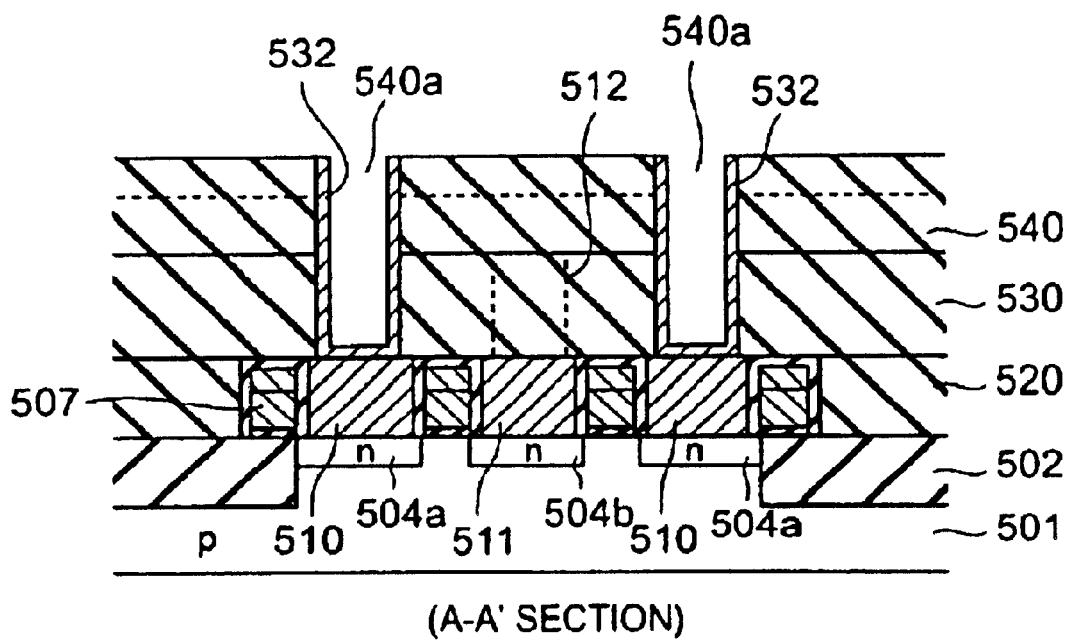
FIGS. 62A and 62B are views illustrating production steps in the method of producing the known semiconductor memory, FIG. 62A being a sectional view taken on line A–A' of FIG. 56, and FIG. 62B a sectional view taken on line B–B' of FIG. 56.
Figure 62B:
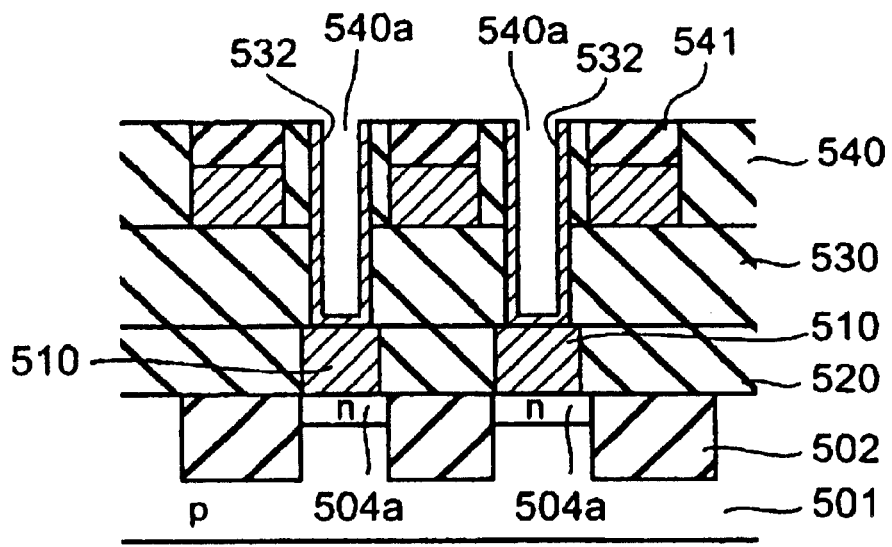
Figure 63A:
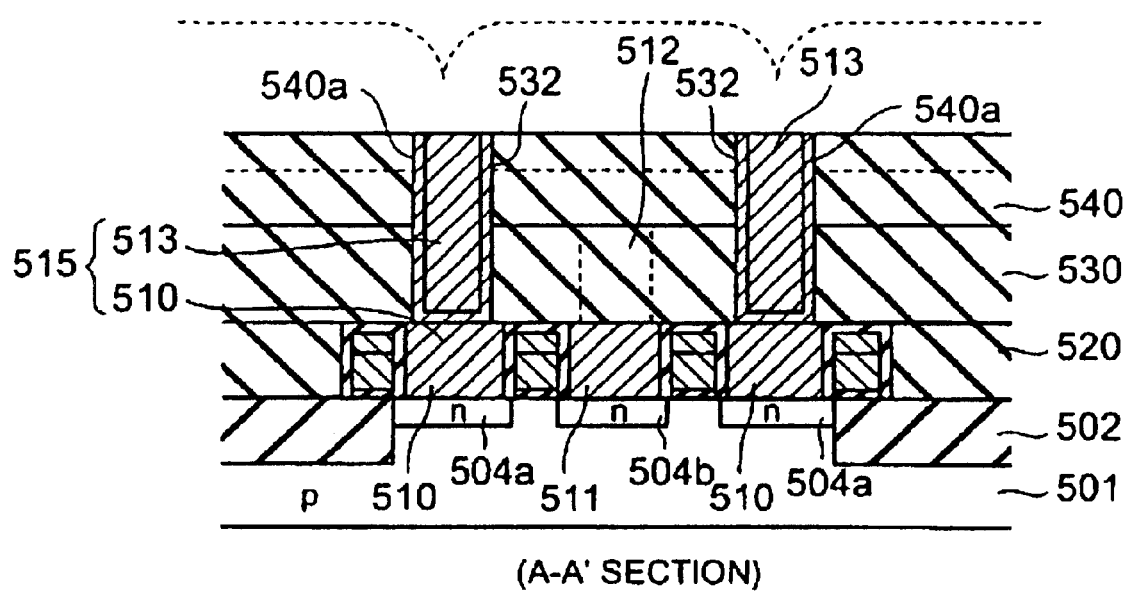
FIGS. 63A and 63B are views illustrating production steps in the method of producing the known semiconductor memory, FIG. 63A being a sectional view taken on line A–A' of FIG. 56, and FIG. 63B a sectional view taken on line B–B' of FIG. 56.
Figure 63B:
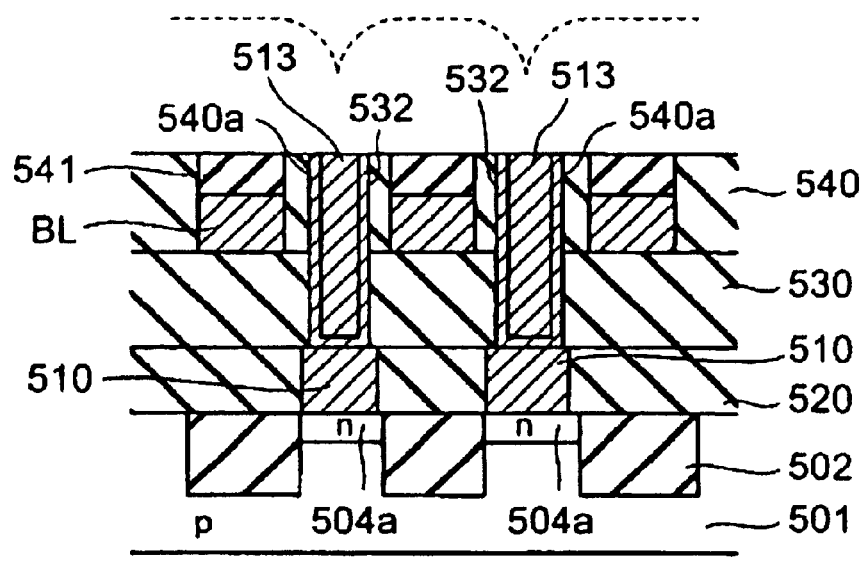
Figure 64A:
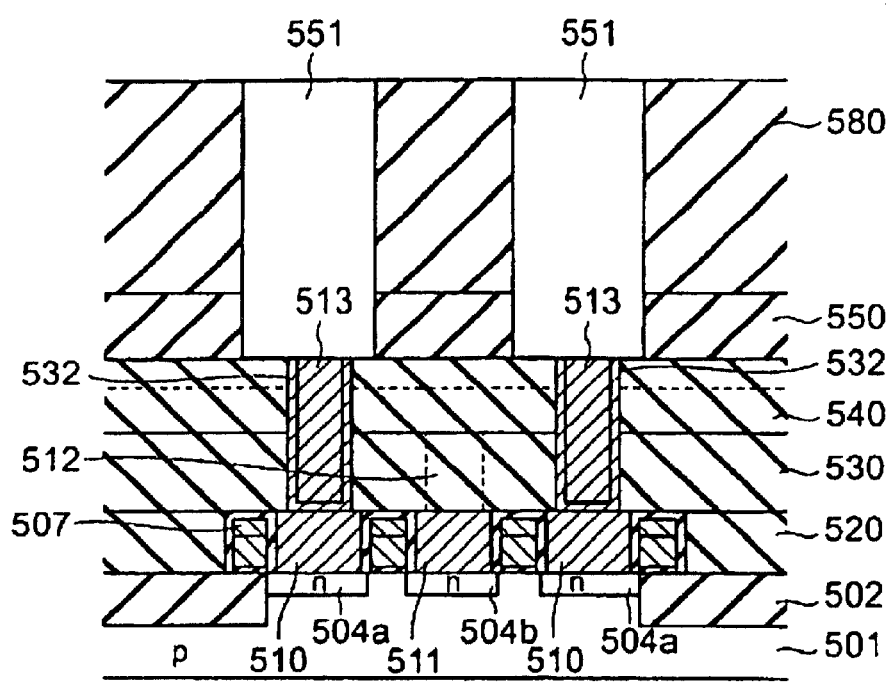
FIGS. 64A and 64B are sectional views taken on line A–A' of FIG. 56, illustrating production steps in the method of producing the known semiconductor memory.
Figure 64B:
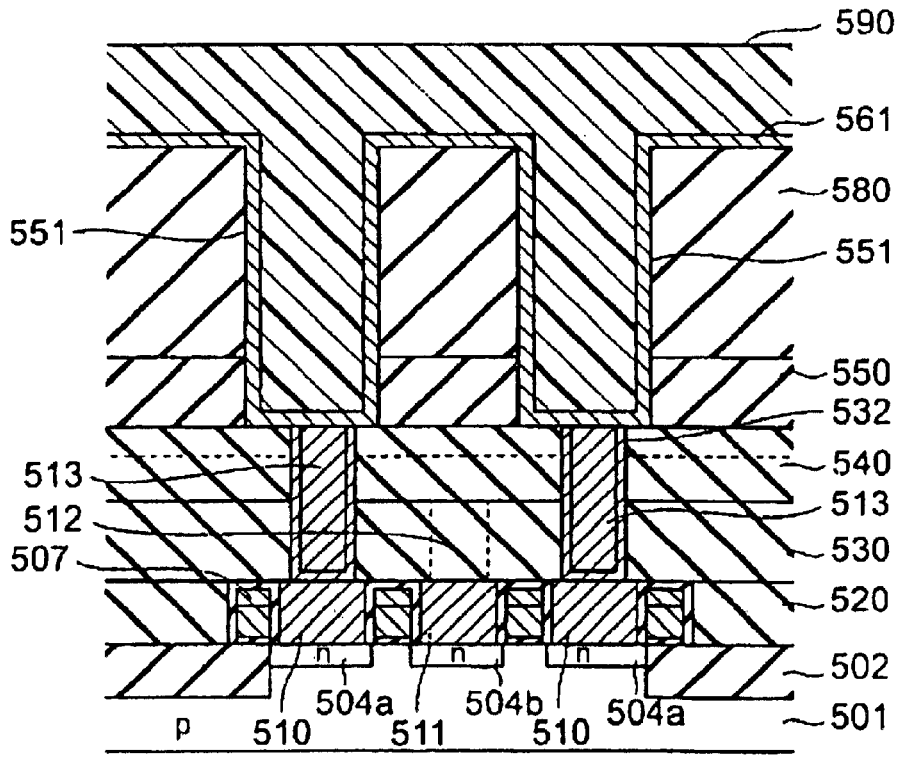
Figure 65A:
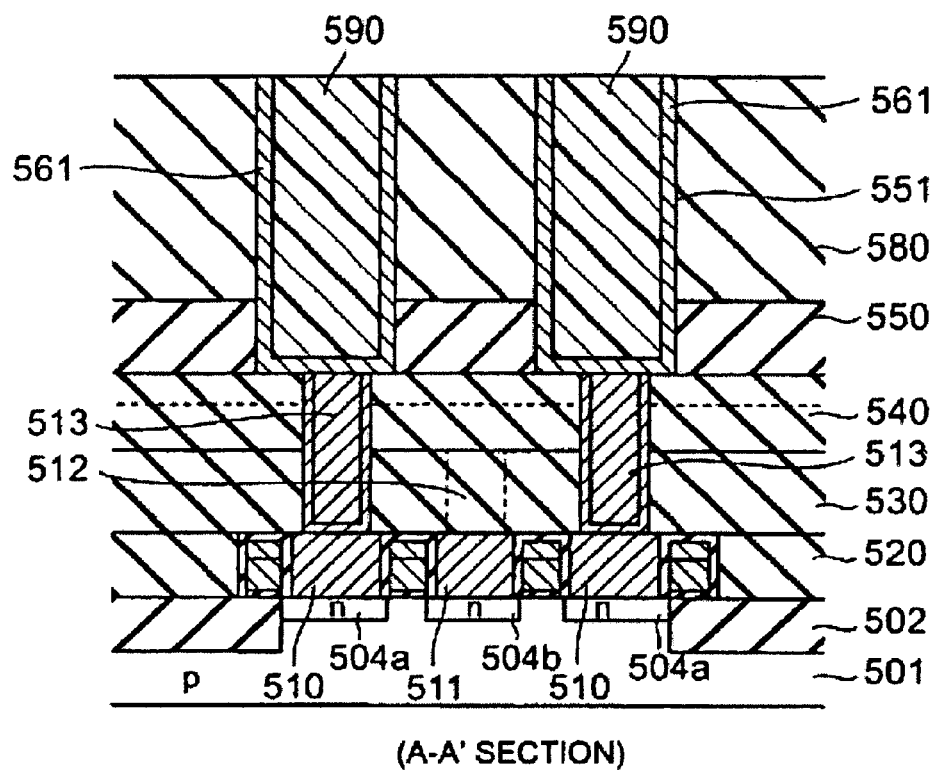
FIGS. 65A and 65B are sectional views taken on line A–A' of FIG. 56, illustrating production steps in the method of producing the known semiconductor memory.
Figure 65B:
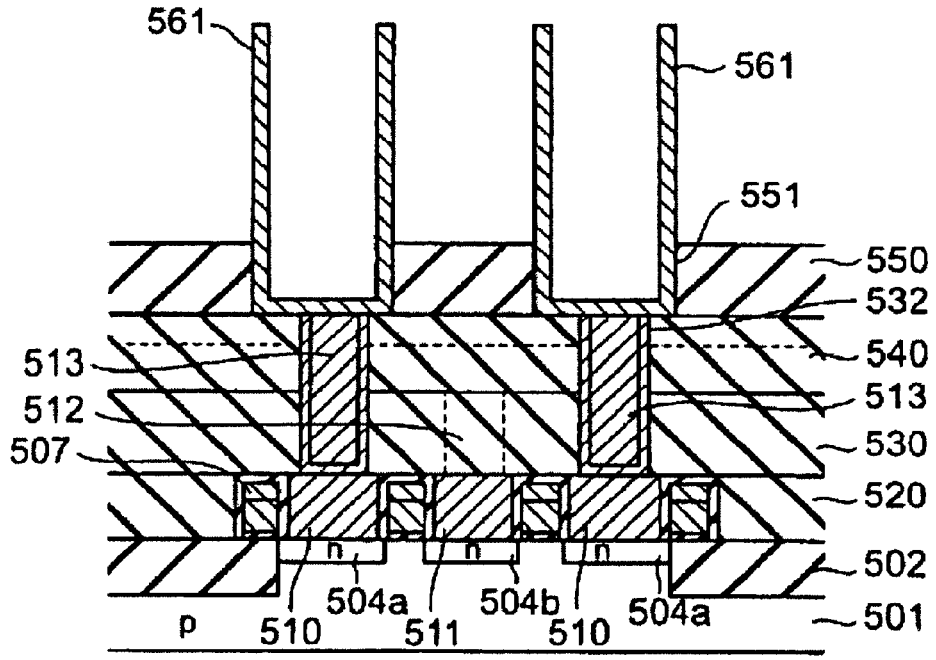
Figure 66A:
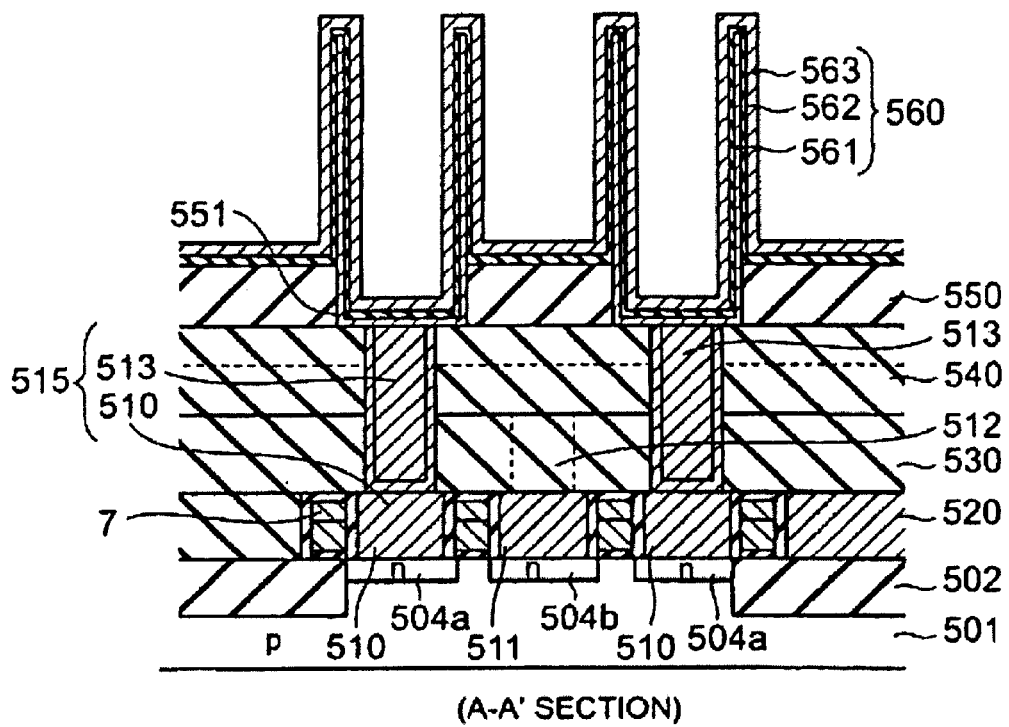
FIGS. 66A and 66B are sectional views taken on line A–A' of FIG. 56, illustrating production steps in the method of producing the known semiconductor memory.
Figure 66B:
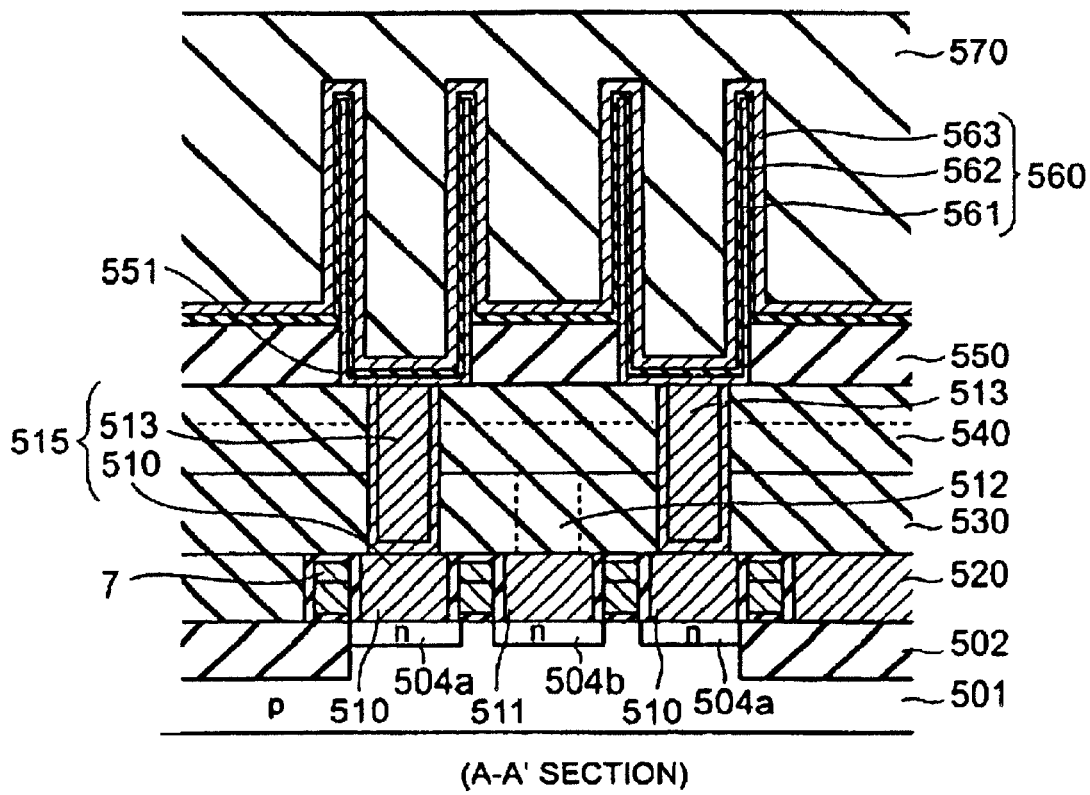

Disclosed next with reference to FIGS. 50A to 55B is a method of producing the semiconductor memory in the sixth embodiment. FIG. 50A is a sectional view illustrating production steps, taken on line A–A' of FIG. 48. FIGS. 51A, 51B, 52A, 53A, 53B, 54A, 54B, and 55A are sectional views illustrating production steps, taken on line B–B' of FIG. 48. FIGS. 50B, 52B and 55B are plan views for FIGS. 50A, 52A and 55A, respectively.

The processes from the beginning to forming the capacitor contact plugs 13 in the production method of the sixth embodiment shown in FIG. 50A are identical to those in the production method of the first embodiment shown in FIGS. 4A to 8B.

The insulator mount 50 to be used for supporting capacitor lower electrodes is then deposited on the third interlayer insulating film 40 having the buried capacitor contact plugs 13. For example, a silicon nitride film of about 200 nm in thickness is deposited by LP-CVD as the insulator mount 50. The insulator mount 50 will work as an etching stopper in a later step.

The dummy insulating film 80, an oxide film, of about 1,000 nm in thickness is deposited by LP-CVD on the insulator mount 50, the former exhibiting an etching property different from the latter. A better choice for the film 80 is, for example, an impurity-doped silicon oxide film such as a BPSG film or a nondoped silicon oxide film, in addition to the oxide film.

Figure 50B:
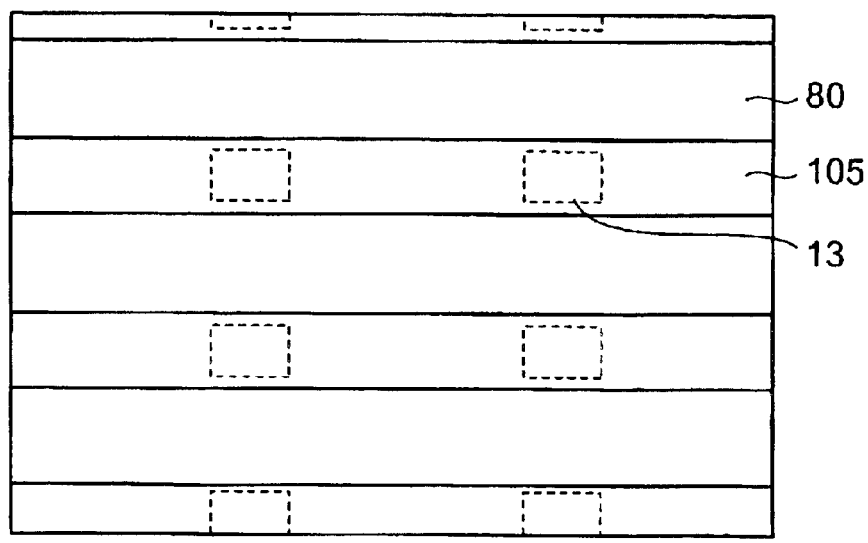

The dummy insulating film 80 is polished by CMP and straight photoresist patterns 105 is formed on the flattened surface thereof. In detail, each photoresist pattern 105 is formed over a row of capacitor contact plugs 13 aligned in the column direction, as having about 200 nm in width and about 100 nm in interval between two patterns (FIGS. 50A and 50B).

Figure 51A:
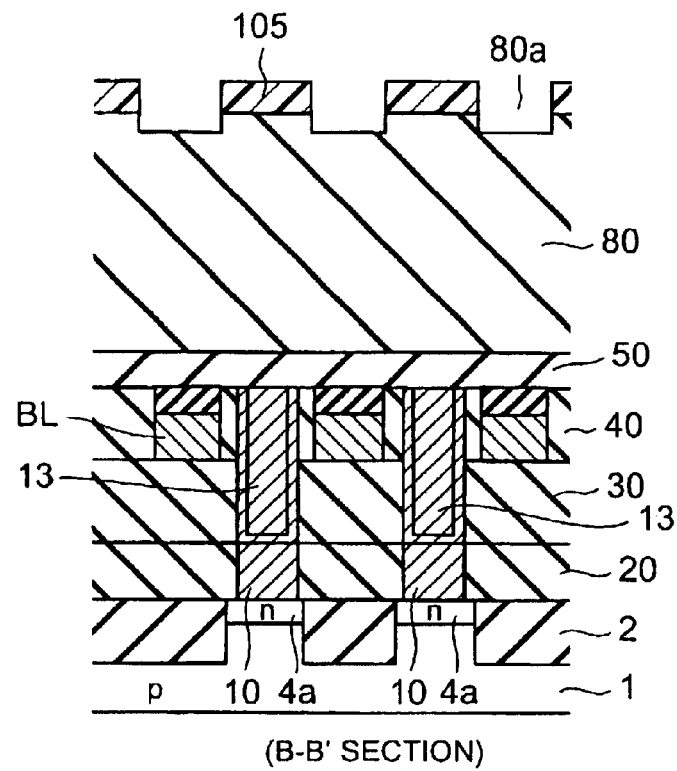
FIGS. 51A and 51B are sectional views taken on line B–B' of FIG. 48, illustrating production steps in the method of producing the semiconductor memory according to the sixth embodiment of the present invention.

Straight grooves 80a are then provided on the dummy insulating film 80 by RIE while masked by the photoresist patterns 105. Each groove 80a has a depth of 50 nm and a length to cover the entire length of capacitor contact plugs 13 aligned in the column direction (FIG. 51A).

Figure 51B:
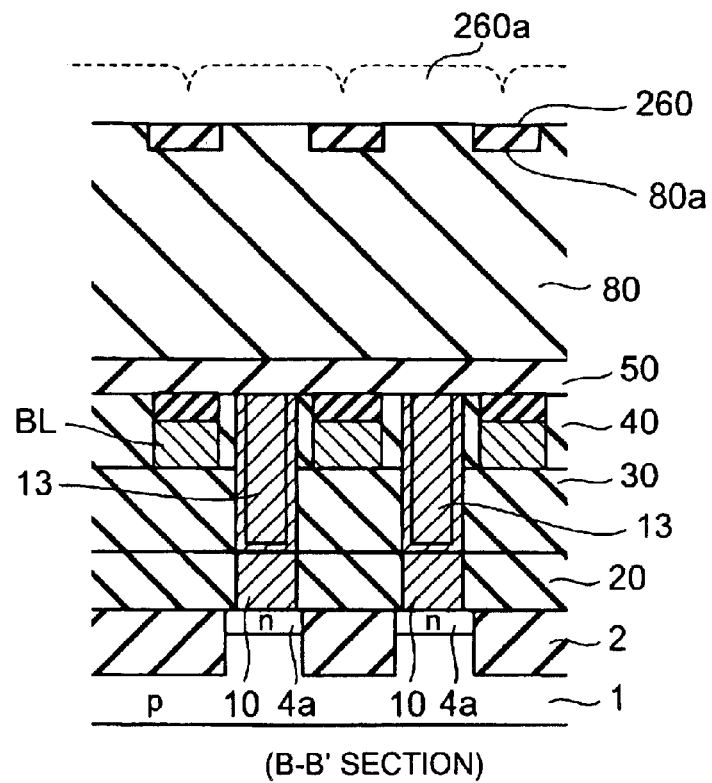

An insulating film 260a, for example, a silicon nitride film is deposited by LP-CVD on the dummy insulating film 80 having the grooves 80a, after the photoresist pattern 105 is removed. The insulating film 260a is polished by CMP until the surface of the insulating film 80 is exposed so that the film 260a will be buried only in the grooves 80a, to form beam-like insulators 260 (FIG. 51B).

The insulating film 260a is preferably an insulating film exhibiting an etching property different from the dummy insulating film 80. Not only the silicon nitride film, the film 270a may be of an oxide film, such as, an HDP-TEOS film, a TaO film, an $Al_2O_3$ film, a BST film, an STO film, a BTO film, a PZT film and a SBT film.

Straight photoresist patterns 106 are formed by lithography as perpendicular to the grooves 80a. In detail, the photoresist patterns 106 are formed on both sides of capacitor contact plugs 13 aligned in the row direction.

Figure 52A:
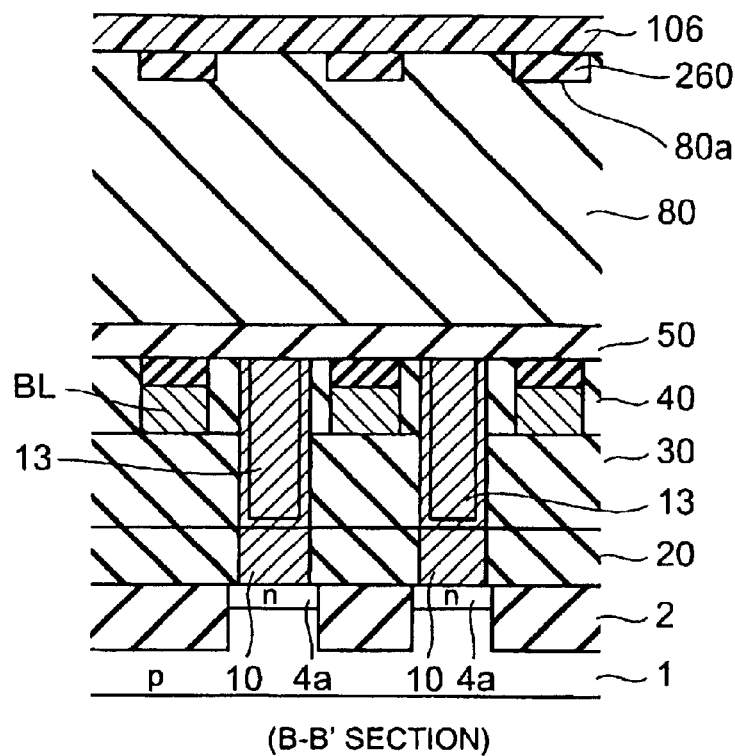
FIGS. 52A and 52B are views illustrating production steps in the method of producing the semiconductor memory according to the sixth embodiment of the present invention, FIG. 52A being a sectional view taken on line B–B' of FIG. 48, and FIG. 52B being a plan view for FIG. 52A.
Figure 52B:
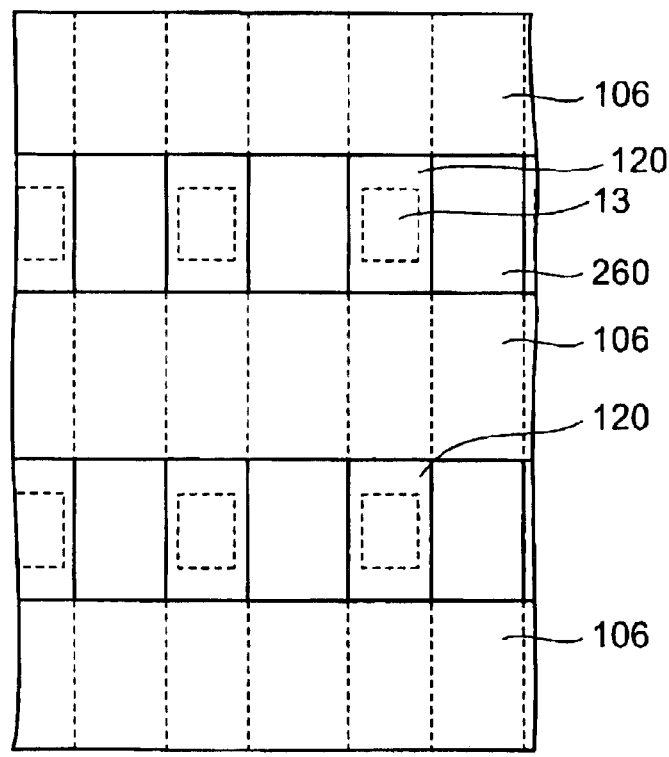

A rectangular opening 120 is then provided on each capacitor contact plug 13 by using the photoresist patterns 106 and the insulating film 260a. The rectangular opening 120 has about 300 nm in long side and about 200 nm in short side, for example (FIGS. 52A and 52B).

The dummy insulating film 80 and the insulator mount 50 in each opening 120 are successively etched by dry etching while masked by the photoresist patterns 106 and the beam-like insulators 260, thus providing a through hole 51 by self-alignment until the corresponding capacitor contact plug 13 is exposed (FIG. 53A).

After the photoresist patterns 106 are removed, a conductive film to become the capacitor lower electrodes 61 is formed on the inner wall of the through holes 51, and the surfaces of the dummy insulating film 80 and the beam-like insulators 260 between the holes 51 and the capacitor contact plugs 13. For example, a Ru film of about 30 nm in thickness is formed as the lower electrodes (FIG. 53B). The lower electrodes 61 may be of another conductive film such as a Pt film and TiN film.

A photoresist 107 is deposited as having a thickness so that the through holes 51 can be completely filled with the photoresist. The photoresist 107 is then etched back by dry etching to fill the through holes 51 with the photoresist (FIG. 54A).

The lower-electrode portion formed on the dummy insulating film 80 and the beam-like insulators 260 between the through holes 51 is removed by, for example, by CMP and RIE, thus the lower electrodes 61 being electrically separated from each other (FIG. 54B).

The photoresist 107 in each through hole 51 is removed by a solvent, such as, thinner. Thinner is the best choice for selective removal of the photoresist 107 with no damages to the dummy insulating film 80, the beam-like insulators 260 and the lower electrodes 61.

The dummy insulating film 80 between the through holes 51 is removed by a hydrofluoric-acid aqueous solution, thus the rectangular-cylinder type lower electrodes 61 are supported at their bottoms by the insulator mounts 50. Adjacent lower electrodes 61 aligned in the column direction are supported as joined to each other via the beam-like insulators 260 connected to them on their facing upper surfaces (FIGS. 55A and 55B).

Like the steps shown from FIG. 15A in the first embodiment, a dielectric film is formed, upper electrodes are formed, an insulating film 70 is buried in the inside and the outside walls of capacitors and wirings are formed to finish memory cells each having one transistor and one cylinder-type capacitor such as shown in FIGS. 49A and 49B.

In the semiconductor memory in the sixth embodiment, the lower electrodes 61 aligned in the row direction are supported as joined to each other via the straight beam-like insulators 260 connected to them at their facing surfaces, for high mechanical strength. Therefore, the sixth embodiment offers tall lower electrodes 61 with large capacitance.

In the sixth embodiment, the adjacent lower electrodes 61 aligned in the row direction are supported as connected via the beam-like insulators 260 at their facing upper surfaces, for high mechanical strength, followed by selective etching to the dummy insulating film between lower electrodes, formation of dielectric film and upper lower electrode on the lower electrode, and filling insulating materials in inside and outside capacitors, thus the lower electrodes being protected from falling down, and hence the achieving high manufacturing yields.

The beam-like insulators 260 are provided on both sides of the lower electrodes 61 aligned in the column direction in the sixth embodiment. Not only that, however, each insulator 260 can be provided at one side of the lower electrodes 61 aligned in the column direction or between the upper portion of each lower electrode 61 and the corresponding insulator mount 50. Moreover, not only one layer, but several layers of beam-like insulators 260 may be provided along the cylinder structure.

Furthermore, the beam-like insulators 260 may be provided, not only at both sides or either side of the lower electrodes 61 aligned in the column direction, but also at both sides or either side of those aligned in the row direction.

Moreover, in the foregoing embodiments, the insulator mounts can be omitted when high mechanical strength can be achieved only with the beam-like insulators.

As disclosed above in detail, the semiconductor memories according to the foregoing embodiments of the present invention have cylinder-type stacked capacitors, the lower electrodes thereof being supported by the beam-like insulators at their upper portions or between the upper portions and the insulator mounts, thus achieving the minimum thickness in insulator amounts and hence increase in capacitance.

Moreover, the semiconductor memories according to the foregoing embodiments of the present invention offer the lower electrodes for semiconductor memory, taller than known devices, thus attaining large capacitance.

Furthermore, the semiconductor-memory production methods according to the foregoing embodiments of the present invention arrange the beam-like insulators at the upper portions of the lower electrodes or between the upper portions and the insulator mounts to support the electrodes by connecting them via the beam-like insulators, for high mechanical strength followed by selective etching to the dummy insulating films and the insulator mounts between the lower electrodes, photoresist removal from the inner wall of each lower electrode, dielectric film and upper electrode formation on each lower electrode, and insulator filling in the inside and outside walls of capacitors. These successive processes protect the lower electrodes from falling down and hence achieve high yields.

What is claimed is:

1. A semiconductor memory comprising:
   at least one insulator mount formed over a semiconductor substrate;
   a plurality of cylinder-type stacked capacitors, a bottom of each capacitor being supported by the insulator mount, each capacitor having a lower electrode and an upper electrode facing each other via a dielectric film; and
   a plurality of beam-like insulators provided along an axis of each cylinder-type stacked capacitor and supporting a side portion of the lower electrode of each capacitor, the side portion being located between an upper edge of the lower electrode and the insulator mount, wherein the axis bisects the distance between the bottom and top of the electrodes and space resides between the insulator mount and the beams.

2. The semiconductor memory according to claim 1, wherein stacked capacitors aligned in a specific direction, among the stacked capacitors, are connected to each other via the plurality of beam-like insulators.

3. The semiconductor memory according to claim 1, wherein all of the slacked capacitors are connected to each other by the plurality of beam-like insulators.

4. The semiconductor memory according to claim 1, wherein the stacked capacitors are arranged into a matrix, and adjacent lower electrodes of the stacked capacitors are supported by being joined to each other via the plurality of beam-like insulators connected to the adjacent lower electrodes at portions on facing surfaces of the adjacent lower electrodes.

5. The semiconductor memory according to claim 1, wherein each of the plurality of beam-like insulators is made of silicon nitride, silicon oxide, tantalum oxide, oxide aluminum, BST, STO, BTO, PZT, or SBT.

6. A semiconductor memory comprising:

at least one transistor formed in a surface of a semiconductor substrate;

an insulating film formed over the transistor;

a plurality of cylinder-type stacked capacitors, each capacitor having a cylinder-type lower electrode electrically connected to a diffusion layer of the transistor through the insulating film, a dielectric film covering inside and outside surfaces of the lower electrode and an upper electrode formed on the dielectric film; and a plurality of beam-like insulators provided along an axis of each cylinder-type stacked capacitor and supporting a side portion of the lower electrode of each capacitor, the side portion being apart from a lower edge of the lower electrode, wherein the axis bisects the distance between the bottom and top of the electrodes and space resides between the insulator mount and the beams.

7. The semiconductor memory according to claim 6, wherein the cylinder-type lower electrode is electrically connected to the diffusion layer of the transistor via a conductive plug embedded in the insulating film.

8. The semiconductor memory according to claim 6, wherein stacked capacitors aligned in a specific direction, among the stacked capacitors, are connected to each other via the plurality of beam-like insulators.

9. The semiconductor memory according to claim 6, wherein all of the stacked capacitors are connected to each other by the plurality of beam-like insulators.

10. The semiconductor memory according to claim 6, wherein the stacked capacitors are arranged into a matrix, and adjacent lower electrodes of the stacked capacitors are supported by being joined to each other via the plurality of beam-like insulators connected to the adjacent lower electrodes at portions on facing surfaces of the adjacent lower electrodes.

11. The semiconductor memory according to claim 6, wherein each of the plurality of beam-like insulators is made of silicon nitride, silicon oxide, tantalum oxide, aluminum oxide, BST, STO, BTO, PZT, or SBT.

* * * * *

UNITED STATES PATENT AND TRADEMARK OFFICE
CERTIFICATE OF CORRECTION

PATENT NO.    : 6,822,280 B2
DATED         : November 23, 2004
INVENTOR(S)   : Ito et al.

It is certified that error appears in the above-identified patent and that said Letters Patent is hereby corrected as shown below:

Column 27,
Line 9, change "slacked" to -- stacked --.

Signed and Sealed this

Twenty-ninth Day of March, 2005

JON W. DUDAS
*Director of the United States Patent and Trademark Office*